(12) United States Patent
Kim et al.

(10) Patent No.: US 9,564,369 B1
(45) Date of Patent: Feb. 7, 2017

(54) METHODS OF MANUFACTURING SEMICONDUCTOR DEVICES INCLUDING DEVICE ISOLATION PROCESSES

(71) Applicant: Samsung Electronics Co., Ltd., Suwon-si, Gyeonggi-do (KR)

(72) Inventors: Ju-Youn Kim, Suwon-si (KR); Min-Choul Kim, Hwaseong-si (KR); Bo-Soon Kim, Hwaseong-si (KR); Min-Yeop Park, Seoul (KR); Sang-Min Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/189,664

(22) Filed: Jun. 22, 2016

(30) Foreign Application Priority Data

Oct. 21, 2015 (KR) .......................... 10-2015-0146525

(51) Int. Cl.
| | |
|---|---|
| *H01L 21/336* | (2006.01) |
| *H01L 21/8234* | (2006.01) |
| *H01L 29/66* | (2006.01) |
| *H01L 21/3213* | (2006.01) |
| *H01L 21/762* | (2006.01) |
| *H01L 21/3065* | (2006.01) |
| *H01L 21/311* | (2006.01) |

(52) U.S. Cl.
CPC ... *H01L 21/823431* (2013.01); *H01L 21/3065* (2013.01); *H01L 21/31111* (2013.01); *H01L 21/32134* (2013.01); *H01L 21/76224* (2013.01); *H01L 21/823437* (2013.01); *H01L 21/823481* (2013.01); *H01L 29/6656* (2013.01); *H01L 29/66545* (2013.01)

(58) Field of Classification Search
CPC .............. H01L 27/0886; H01L 21/845; H01L 21/823431; H01L 21/823814
See application file for complete search history.

(56) References Cited

U.S. PATENT DOCUMENTS

| | | |
|---|---|---|
| 8,519,465 B2 | 8/2013 | Kim et al. |
| 8,519,481 B2 | 8/2013 | Yuan et al. |
| 8,524,545 B2 | 9/2013 | Anderson et al. |
| 8,524,546 B2 | 9/2013 | Anderson et al. |
| 8,536,658 B2 | 9/2013 | Wu et al. |
| 8,541,267 B2 | 9/2013 | Sonsky et al. |

(Continued)

*Primary Examiner* — Elias M Ullah
(74) *Attorney, Agent, or Firm* — Myers Bigel, P.A.

(57) ABSTRACT

Methods are provided for manufacturing semiconductor devices include forming a first fin protruding on a substrate and extending in a first direction; forming first and second sacrificial gate insulating layers on the first fin, the first and second sacrificial gate insulating layers intersecting the first fin and being spaced apart from each other; forming first and second sacrificial gate electrodes respectively on the first and second sacrificial gate insulating layers; forming a first insulating layer on the first and second sacrificial gate electrodes; removing a portion of the first insulating layer to expose the second sacrificial gate electrode; removing the exposed second sacrificial gate electrode using a first etching process to expose the second sacrificial gate insulating layer; removing the exposed second sacrificial gate insulating layer using a second etching process different from the first etching process to form a first trench which exposes the first fin; forming a first recess in the exposed first fin using a third etching process different from the second etching process; and filling the first recess with a first device isolation layer.

20 Claims, 61 Drawing Sheets

(56) References Cited

U.S. PATENT DOCUMENTS

| | | |
|---|---|---|
| 8,541,270 B2 | 9/2013 | Yeh et al. |
| 8,552,477 B2 | 10/2013 | Zhu |
| 8,557,632 B1 | 10/2013 | Or-Bach et al. |
| 8,563,369 B2 | 10/2013 | Cohen et al. |
| 8,574,969 B2 | 11/2013 | Cohen et al. |
| 8,575,596 B2 | 11/2013 | Pillarisetty et al. |
| 8,581,317 B2 | 11/2013 | Tigelaar et al. |
| 8,592,918 B2 | 11/2013 | Yuan et al. |
| 8,598,641 B2 | 12/2013 | Chen et al. |
| 8,598,646 B2 | 12/2013 | Chen et al. |
| 8,603,893 B1 | 12/2013 | Wei et al. |
| 8,604,518 B2 | 12/2013 | Bhuwalka et al. |
| 8,609,480 B2 | 12/2013 | Xie |
| 8,609,495 B2 | 12/2013 | Gan et al. |
| 8,609,499 B2 | 12/2013 | Ho et al. |
| 8,610,241 B1 | 12/2013 | Hu et al. |
| 8,614,127 B1 | 12/2013 | Yang et al. |
| 8,614,485 B2 | 12/2013 | Beintner et al. |
| 8,617,961 B1 | 12/2013 | Haran et al. |
| 8,618,556 B2 | 12/2013 | Wu et al. |
| 8,618,616 B2 | 12/2013 | Pham |
| 8,624,320 B2 | 1/2014 | Schultz |
| 8,625,334 B2 | 1/2014 | Liaw |
| 8,629,038 B2 | 1/2014 | Liu |
| 8,629,420 B1 | 1/2014 | Shrivastava et al. |
| 8,633,516 B1 | 1/2014 | Wu et al. |
| 8,637,372 B2 | 1/2014 | Liu et al. |
| 8,642,416 B2 | 2/2014 | Or-Bach et al. |
| 8,643,108 B2 | 2/2014 | Rahim et al. |
| 8,648,400 B2 | 2/2014 | Xu |
| 8,653,630 B2 | 2/2014 | Liaw et al. |
| 8,659,097 B2 | 2/2014 | Mor et al. |
| 8,673,709 B2 | 3/2014 | Lee et al. |
| 8,673,723 B1 | 3/2014 | Na |
| 8,674,413 B1 | 3/2014 | Chi |
| 8,685,825 B2 | 4/2014 | Tang et al. |
| 8,686,492 B2 | 4/2014 | Chen et al. |
| 8,686,516 B2 | 4/2014 | Chen et al. |
| 8,691,640 B1 | 4/2014 | LiCausi et al. |
| 8,692,291 B2 | 4/2014 | Clark, Jr. et al. |
| 8,692,316 B2 | 4/2014 | Xie |
| 8,693,235 B2 | 4/2014 | Liaw |
| 8,697,515 B2 | 4/2014 | Yin et al. |
| 8,697,522 B2 | 4/2014 | Cheng et al. |
| 8,697,536 B1 | 4/2014 | Cheng et al. |
| 8,697,539 B2 | 4/2014 | Huang et al. |
| 8,703,553 B2 | 4/2014 | Cheng et al. |
| 8,703,556 B2 | 4/2014 | Kelly et al. |
| 8,722,431 B2 | 5/2014 | Pradhan et al. |
| 8,722,470 B2 | 5/2014 | Cohen et al. |
| 8,722,520 B2 | 5/2014 | van Dal |
| 8,723,225 B2 | 5/2014 | Hu et al. |
| 8,723,233 B2 | 5/2014 | Cohen et al. |
| 8,723,268 B2 | 5/2014 | Moroz et al. |
| 8,723,271 B2 | 5/2014 | Yuan et al. |
| 8,729,634 B2 | 5/2014 | Shen et al. |
| 8,735,252 B2 | 5/2014 | Yu et al. |
| 8,735,990 B2 | 5/2014 | Anderson et al. |
| 8,735,993 B2 | 5/2014 | Lo et al. |
| 8,742,491 B2 | 6/2014 | Lee |
| 8,742,509 B2 | 6/2014 | Lee et al. |
| 8,748,989 B2 | 6/2014 | Lin et al. |
| 8,748,993 B2 | 6/2014 | Lee et al. |
| 8,753,940 B1 | 6/2014 | Wei et al. |
| 8,759,173 B2 | 6/2014 | Yeh et al. |
| 8,759,184 B2 | 6/2014 | Ho et al. |
| 8,759,874 B1 | 6/2014 | Louber et al. |
| 8,759,943 B2 | 6/2014 | Tseng et al. |
| 8,759,944 B2 | 6/2014 | Wells et al. |
| 8,765,533 B2 | 7/2014 | Hsieh et al. |
| 8,765,546 B1 | 7/2014 | Hung et al. |
| 8,766,363 B2 | 7/2014 | Cheng et al. |
| 8,766,364 B2 | 7/2014 | Doornbos et al. |
| 8,772,117 B2 | 7/2014 | Chi et al. |
| 8,772,860 B2 | 7/2014 | Huang et al. |
| 8,779,495 B2 | 7/2014 | Happ et al. |
| 8,779,517 B2 | 7/2014 | Lin et al. |
| 8,785,275 B2 | 7/2014 | Chen et al. |
| 8,785,284 B1 | 7/2014 | Bergendahl et al. |
| 8,785,968 B2 | 7/2014 | Shrivastava et al. |
| 8,796,093 B1 | 8/2014 | Cheng et al. |
| 8,802,510 B2 | 8/2014 | Chang et al. |
| 8,802,531 B2 | 8/2014 | Bhuwalka et al. |
| 8,809,178 B2 | 8/2014 | Liu et al. |
| 8,809,872 B2 | 8/2014 | Cai et al. |
| 8,809,918 B2 | 8/2014 | Lu et al. |
| 8,809,990 B2 | 8/2014 | Maeda et al. |
| 8,815,684 B2 | 8/2014 | Cai et al. |
| 8,815,693 B2 | 8/2014 | Alptekin et al. |
| 8,815,712 B2 | 8/2014 | Wan et al. |
| 8,815,742 B2 | 8/2014 | Cai et al. |
| 8,822,290 B2 | 9/2014 | Lin et al. |
| 8,828,839 B2 | 9/2014 | Brunco et al. |
| 8,835,270 B2 | 9/2014 | Nandakumar |
| 8,841,701 B2 | 9/2014 | Lin et al. |
| 8,846,466 B2 | 9/2014 | Yuan et al. |
| 8,846,477 B2 | 9/2014 | Cai et al. |
| 8,846,490 B1 | 9/2014 | Shieh et al. |
| 8,847,293 B2 | 9/2014 | Lee et al. |
| 8,848,423 B2 | 9/2014 | Chung |
| 8,853,750 B2 | 10/2014 | Adam et al. |
| 8,859,372 B2 | 10/2014 | Liaw |
| 8,859,389 B2 | 10/2014 | Kawasaki et al. |
| 8,860,148 B2 | 10/2014 | Hu et al. |
| 8,865,560 B2 | 10/2014 | Mor et al. |
| 8,866,225 B2 | 10/2014 | Mayer et al. |
| 8,866,235 B2 | 10/2014 | Wu et al. |
| 8,871,584 B2 | 10/2014 | Tang et al. |
| 8,872,247 B2 | 10/2014 | Tomishima |
| 8,872,284 B2 | 10/2014 | Kelly et al. |
| 8,878,260 B2 | 11/2014 | Anderson et al. |
| 8,889,494 B2 | 11/2014 | Toh et al. |
| 8,889,497 B2 | 11/2014 | Chen et al. |
| 8,889,502 B2 | 11/2014 | Yeh et al. |
| 8,890,249 B2 | 11/2014 | Gauthier, Jr. et al. |
| 8,895,446 B2 | 11/2014 | Peng et al. |
| 8,896,055 B2 | 11/2014 | Yeh et al. |
| 8,901,492 B1 | 12/2014 | Cheng et al. |
| 8,901,615 B2 | 12/2014 | Moroz |
| 8,901,700 B2 | 12/2014 | Parekh et al. |
| 8,912,602 B2 | 12/2014 | Hsu et al. |
| 8,921,218 B2 | 12/2014 | Yang et al. |
| 8,927,373 B2 | 1/2015 | Rodder et al. |
| 8,927,377 B2 | 1/2015 | Xu et al. |
| 8,927,966 B2 | 1/2015 | Liu et al. |
| 8,928,086 B2 | 1/2015 | Utomo et al. |
| 8,928,093 B2 | 1/2015 | Lo et al. |
| 8,929,130 B1 | 1/2015 | Liaw |
| 8,932,918 B2 | 1/2015 | Cheng et al. |
| 8,932,936 B2 | 1/2015 | Liu et al. |
| 8,932,957 B2 | 1/2015 | Shieh et al. |
| 8,936,986 B2 | 1/2015 | Wei et al. |
| 8,937,353 B2 | 1/2015 | Chen et al. |
| 8,940,588 B2 | 1/2015 | Gauthier, Jr. et al. |
| 8,941,153 B2 | 1/2015 | Lee et al. |
| 8,941,156 B2 | 1/2015 | Bergendahl et al. |
| 8,941,179 B2 | 1/2015 | Bergendahl et al. |
| 8,941,189 B2 | 1/2015 | Chowdhury et al. |
| 8,946,027 B2 | 2/2015 | Anderson et al. |
| 8,946,028 B2 | 2/2015 | Chan et al. |
| 8,946,038 B2 | 2/2015 | Hu et al. |
| 8,946,792 B2 | 2/2015 | Cheng et al. |
| 8,952,547 B2 | 2/2015 | Liaw |
| 8,953,399 B2 | 2/2015 | Ferrant et al. |
| 8,956,942 B2 | 2/2015 | Loubet et al. |
| 8,962,421 B2 | 2/2015 | Srinivasan et al. |
| 8,963,259 B2 | 2/2015 | Jacob et al. |
| 8,969,932 B2 | 3/2015 | Wei et al. |
| 8,969,974 B2 | 3/2015 | Liaw |
| 8,969,999 B2 | 3/2015 | Liang et al. |
| 8,975,129 B1 | 3/2015 | Shieh et al. |
| 8,975,144 B2 | 3/2015 | Kwok et al. |

(56) References Cited

U.S. PATENT DOCUMENTS

| | | |
|---|---|---|
| 8,975,675 B2 | 3/2015 | Cheng et al. |
| 8,975,698 B2 | 3/2015 | Mor et al. |
| 8,975,712 B2 | 3/2015 | Rashed et al. |
| 8,981,444 B2 | 3/2015 | Torek et al. |
| 8,981,487 B2 | 3/2015 | Hung et al. |
| 8,987,100 B2 | 3/2015 | Oh et al. |
| 8,987,101 B2 | 3/2015 | Ding et al. |
| 8,987,791 B2 | 3/2015 | Huang et al. |
| 8,987,823 B2 | 3/2015 | Cheng et al. |
| 8,987,828 B2 | 3/2015 | Moroz et al. |
| 8,987,835 B2 | 3/2015 | Vellianitis et al. |
| 8,993,399 B2 | 3/2015 | Cheng et al. |
| 8,993,417 B2 | 3/2015 | Tsai et al. |
| 8,994,002 B2 | 3/2015 | Lee et al. |
| 8,994,112 B2 | 3/2015 | Doornbos et al. |
| 8,994,116 B2 | 3/2015 | Gan et al. |
| 9,000,522 B2 | 4/2015 | Cheng et al. |
| 9,000,537 B2 | 4/2015 | Cai et al. |
| 9,006,077 B2 | 4/2015 | Akarvardar et al. |
| 9,006,786 B2 | 4/2015 | Ching et al. |
| 9,006,842 B2 | 4/2015 | Colinge et al. |
| 9,012,287 B2 | 4/2015 | Liaw |
| 9,012,986 B2 | 4/2015 | Chi et al. |
| 9,024,387 B2 | 5/2015 | Erickson et al. |
| 9,029,226 B2 | 5/2015 | Tsai et al. |
| 9,029,930 B2 | 5/2015 | Kelly et al. |
| 9,029,958 B2 | 5/2015 | Ho et al. |
| 9,034,700 B1 | 5/2015 | Jeong et al. |
| 9,034,715 B2 | 5/2015 | Wang et al. |
| 9,034,716 B2 | 5/2015 | Sun et al. |
| 9,034,723 B1 | 5/2015 | Shieh et al. |
| 9,035,306 B2 | 5/2015 | Hoentschel et al. |
| 9,035,426 B2 | 5/2015 | Chang et al. |
| 9,041,062 B2 | 5/2015 | Cheng et al. |
| 9,041,115 B2 | 5/2015 | Liaw |
| 9,041,125 B2 | 5/2015 | Lin et al. |
| 9,048,121 B2 | 6/2015 | Kawa et al. |
| 9,048,259 B2 | 6/2015 | Hung et al. |
| 9,048,317 B2 | 6/2015 | Wann et al. |
| 9,053,965 B2 | 6/2015 | He et al. |
| 9,054,213 B2 | 6/2015 | Kelly et al. |
| 9,054,219 B1 | 6/2015 | Hoffmann et al. |
| 2014/0227857 A1 | 8/2014 | Youn et al. |
| 2014/0239393 A1 | 8/2014 | Kuo et al. |
| 2015/0021710 A1 | 1/2015 | Hsu et al. |

METHODS OF MANUFACTURING SEMICONDUCTOR DEVICES INCLUDING DEVICE ISOLATION PROCESSES

CROSS-REFERENCE TO RELATED APPLICATION

This application claims priority from Korean Patent Application No. 10-2015-0146525, filed on Oct. 21, 2015 in the Korean Intellectual Property Office, the disclosure of which is hereby incorporated herein by reference as if set forth in its entirety.

FIELD

The present inventive concept relates generally to semiconductor devices and, more particularly, to methods for manufacturing semiconductor devices.

BACKGROUND

Scaling techniques for increasing the integration density of a semiconductor device include a multi-gate transistor in which a fin- or nanowire-shaped multi-channel active pattern (or a silicon body) is formed on a substrate and a gate is formed on the surface of the multi-channel active pattern.

The multi-gate transistor uses a three-dimensional channel, thus it may be scaled relatively easily. Furthermore, the multi-gate transistor may have improved current control capability without increasing the length of the gate thereof. Furthermore, a short channel effect (SCE) in which electric potential in a channel region is influenced by a drain voltage can be effectively suppressed.

As semiconductor devices are made increasingly smaller, the importance of isolation between transistors is being emphasized. A need therefore exists for improved manufacturing methods for devices in which characteristics of isolation between a plurality of transistors formed on a fin.

SUMMARY

Some embodiments of the present inventive concept provide methods for manufacturing a semiconductor device including forming a first fin protruding on a substrate and extending in a first direction; forming first and second sacrificial gate insulating layers on the first fin, the first and second sacrificial gate insulating layers intersecting the first fin and being spaced apart from each other; forming first and second sacrificial gate electrodes on the first and second sacrificial gate insulating layers, respectively; forming a first insulating layer on the first and second sacrificial gate electrodes; removing a portion of the first insulating layer to expose the second sacrificial gate electrode; removing the exposed second sacrificial gate electrode using a first etching process to expose the second sacrificial gate insulating layer; removing the exposed second sacrificial gate insulating layer using a second etching process different from the first etching process to form a first trench which exposes the first fin; forming a first recess in the exposed first fin through a third etching process, different from the second etching process; and filling the first recess with a first device isolation layer.

In further embodiments of the inventive concept, the second etching process may be wet etching process and the third etching process may be a dry etching process.

In still further embodiments of the inventive concept, removing the second sacrificial gate electrode using a first etching process may include removing a part of the second sacrificial gate electrode to form a residual part on the second sacrificial gate insulating layer.

In some embodiments of the inventive concept, the method may further include performing a wet etching process for removing the residual part prior to removing the exposed second sacrificial gate insulating layer through the second etching process.

In further embodiments of the inventive concept, removing the exposed second sacrificial gate insulating layer using a second etching process may include removing the residual part through the second etching process.

In still further embodiments of the inventive concept, the method may further include forming first and second spacers on both sidewalls of each of the first and second sacrificial gate electrodes prior to forming a first insulating layer, wherein the second spacer defines the first trench.

In some embodiments of the inventive concept, removing the exposed second sacrificial gate insulating layer using a second etching process may include removing a part of the second spacer through the second etching process such that a thickness of the second spacer is thinner than a thickness of the first spacer at the same height on the substrate.

In further embodiments of the inventive concept, forming a first trench which exposes the first fin may include forming a concave surface in an upper surface of the first fin.

In still further embodiments of the inventive concept, the method may further include removing the first insulating layer to expose the first sacrificial gate electrode, and substituting the first sacrificial gate electrode and the first sacrificial gate insulating layer with a first gate structure.

In some embodiments of the inventive concept, the method may further include forming a dummy gate structure on the first device isolation layer such that the dummy gate structure fills the first trench.

Further embodiments of the present inventive concept provide methods for manufacturing a semiconductor device including forming first and second fins which are protruded respectively on first and second areas of a substrate and spaced apart from each other and extended in a first direction; forming first to third sacrificial gate insulating layers on the first fin, the first to third sacrificial gate insulating layers intersecting the first fin and being spaced apart from each other; forming fourth to sixth sacrificial gate insulating layers on the second fin, the fourth to sixth sacrificial gate insulating layers intersecting the second fin and being spaced apart from each other; forming first to third sacrificial gate electrodes respectively on the first to third sacrificial gate insulating layers; forming fourth to sixth sacrificial gate electrodes respectively on the fourth to sixth sacrificial gate insulating layers, forming a first insulating layer covering the first to third sacrificial gate electrodes; forming a second insulating layer covering the fourth to sixth sacrificial gate electrodes; removing a part of the first insulating layer so as to expose the second sacrificial gate electrode; removing a part of the second insulating layer so as to expose the fifth sacrificial gate electrode; removing the exposed second sacrificial gate electrode through a first etching process to expose the second sacrificial gate insulating layer; removing the exposed fifth sacrificial gate electrode through an etching process same as the first etching process so as to expose the fifth sacrificial gate insulating layer; removing the exposed second sacrificial gate insulating layer through a second etching process different from the first etching process so as to form a first trench which exposes the first fin; removing the exposed fifth sacrificial gate insulating layer through an etching process same as the second etching process so as to form a first trench which exposes the second fin; forming a first recess having a first recess depth and a first recess width in the exposed first fin through a third etching process different from the second etching process and forming a second recess having a second recess depth and a second recess width in the exposed second fin through an etching process same as the third etching process, wherein the first recess depth is different from the second recess depth.

In still further embodiments of the inventive concept, the second etching process may be a wet etching process and the third etching process may be a dry etching process.

In some embodiments of the inventive concept, the first recess width may accord a contact line at which the first recess contacts the first trench, and the second recess width may accord a contact line at which the second recess contacts the second trench, the first recess width and the second recess width being different from each other.

In further embodiments of the inventive concept, the second recess width may be narrower than the first recess width, and the second recess width may be narrower than the second trench width.

In still further embodiments of the inventive concept, the method further includes filling the first recess with a first device isolation layer and filling the second recess with a second device isolation layer.

Some embodiments of the present inventive concept provide methods for manufacturing semiconductor devices including forming a first, second and third fins protruding on a substrate and extending in a first direction; forming a sacrificial gate insulating layer on the first second and third fins; exposing the second sacrificial gate insulating layer using a first etching process; removing a portion of the exposed sacrificial gate insulating layer to expose the first, second and third fins using a second etching process, different from the first etching process; and etching the first, second and third fins and the remaining sacrificial gate insulating layer to define a trench therein using a third etching process, different from the first and second etching processes, wherein the first, second and third fins at the bottom surface of the first recess have substantially no fence.

In further embodiments, the first, second and third fins at the bottom surface of the first recess may have fences having a height difference of less than 10 nm.

In still further embodiments, the second etching process may be a wet etching process and the third etching process may be a dry etching process.

In some embodiments, at least one of the first, second and third fins may have a concave surface in an upper surface thereof.

In further embodiments, the method may further include forming a device isolation layer in the trench.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
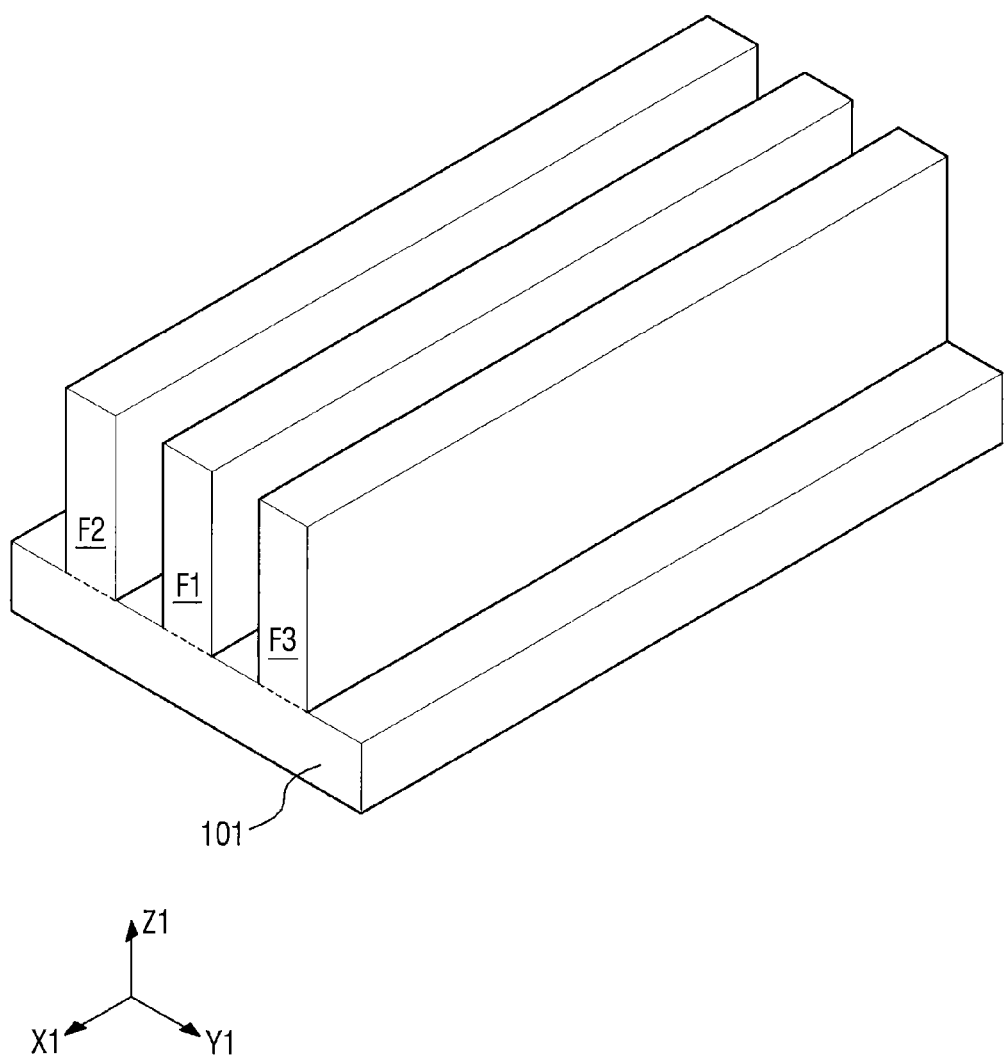
FIGS. 1 to 24 are perspective views and cross-sections illustrating a semiconductor device according to some embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the disclosure to those skilled in the art, and the present inventive concept will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Processing steps in the fabrication of semiconductor devices according to some embodiments of the present inventive concept will be discussed with respect to FIGS. 1 to 24.

Figure 3:
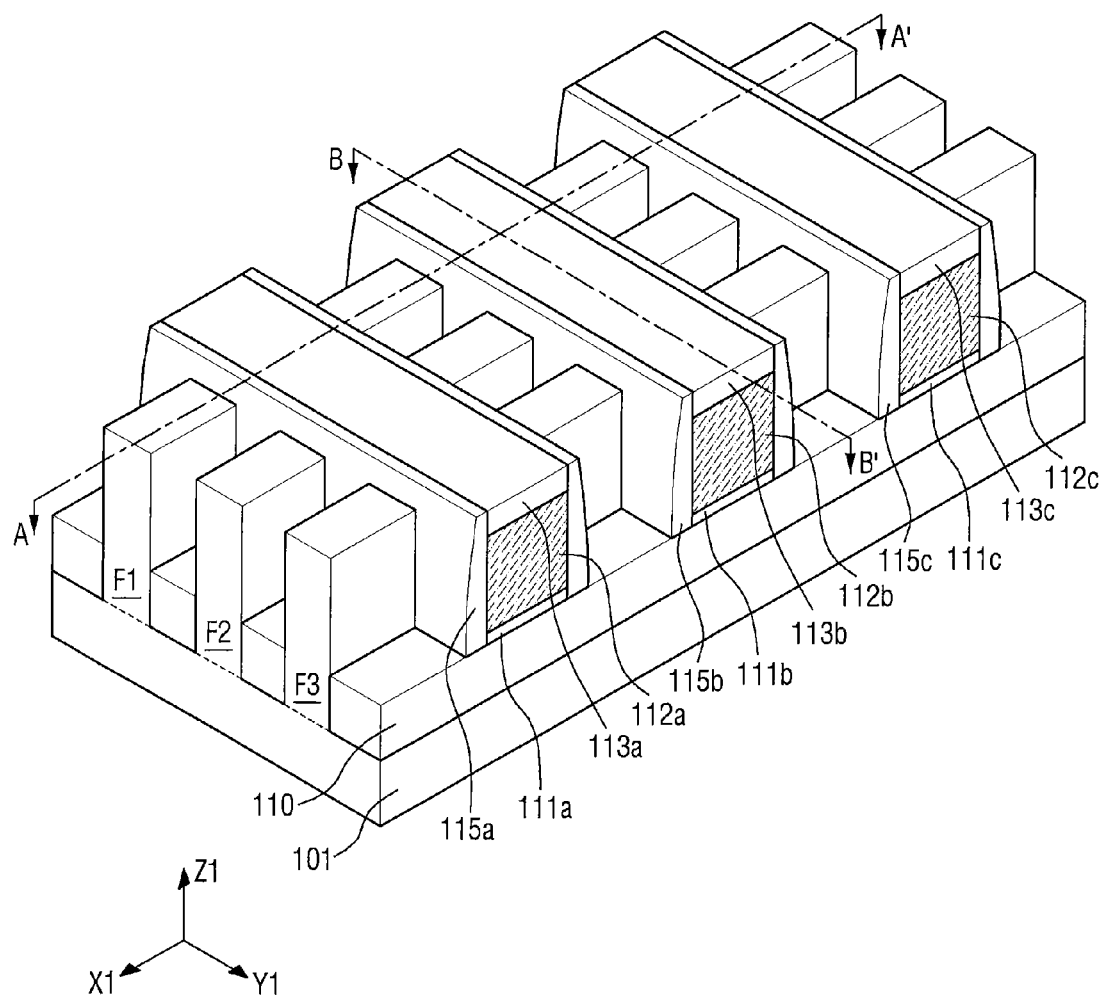
Figure 4A:
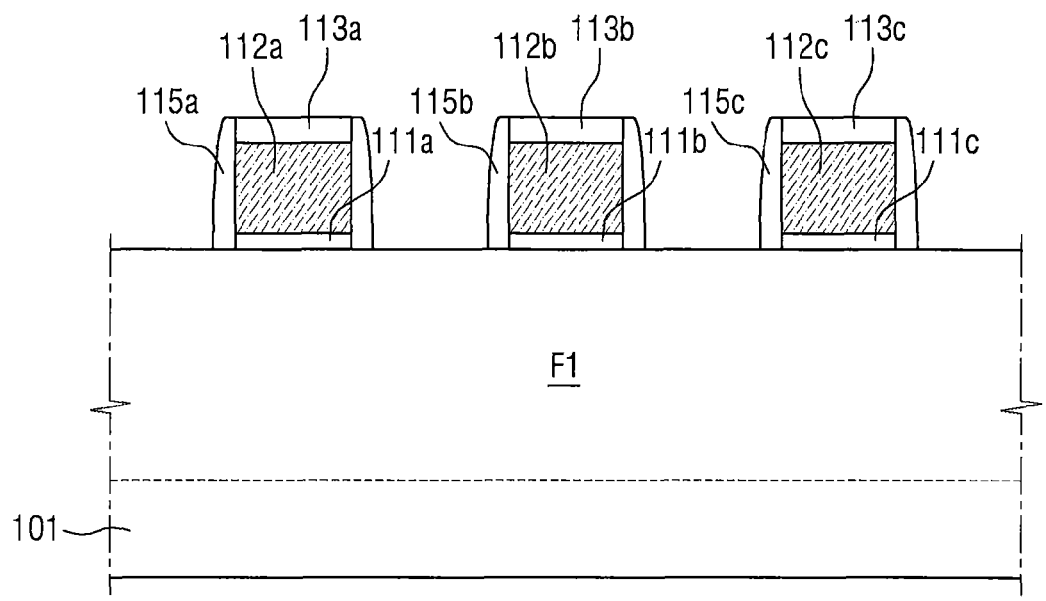
Figure 4B:
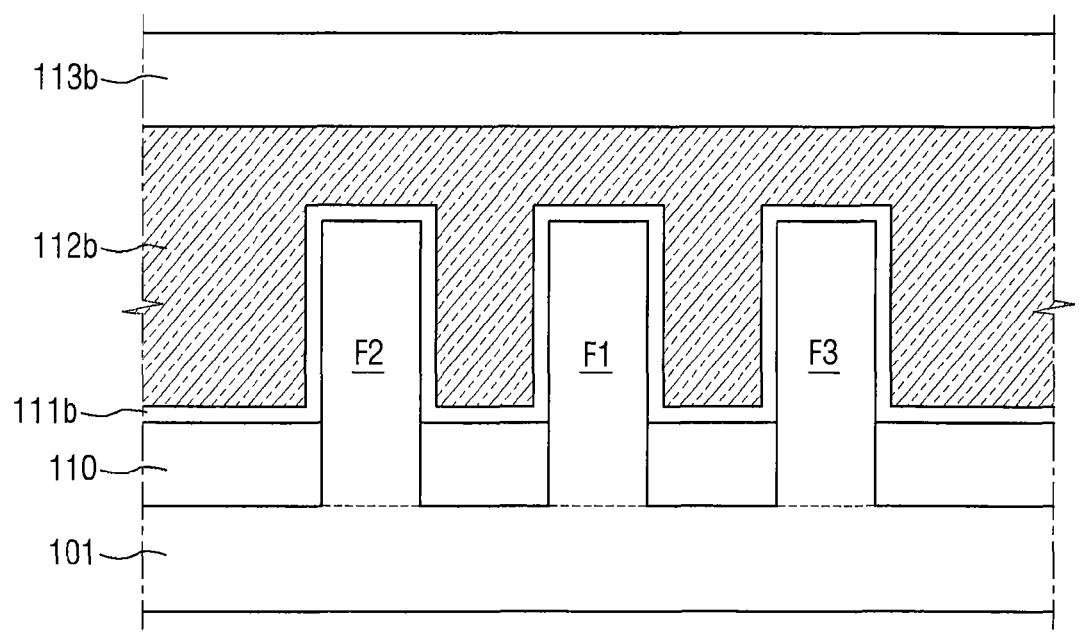
Figure 21:
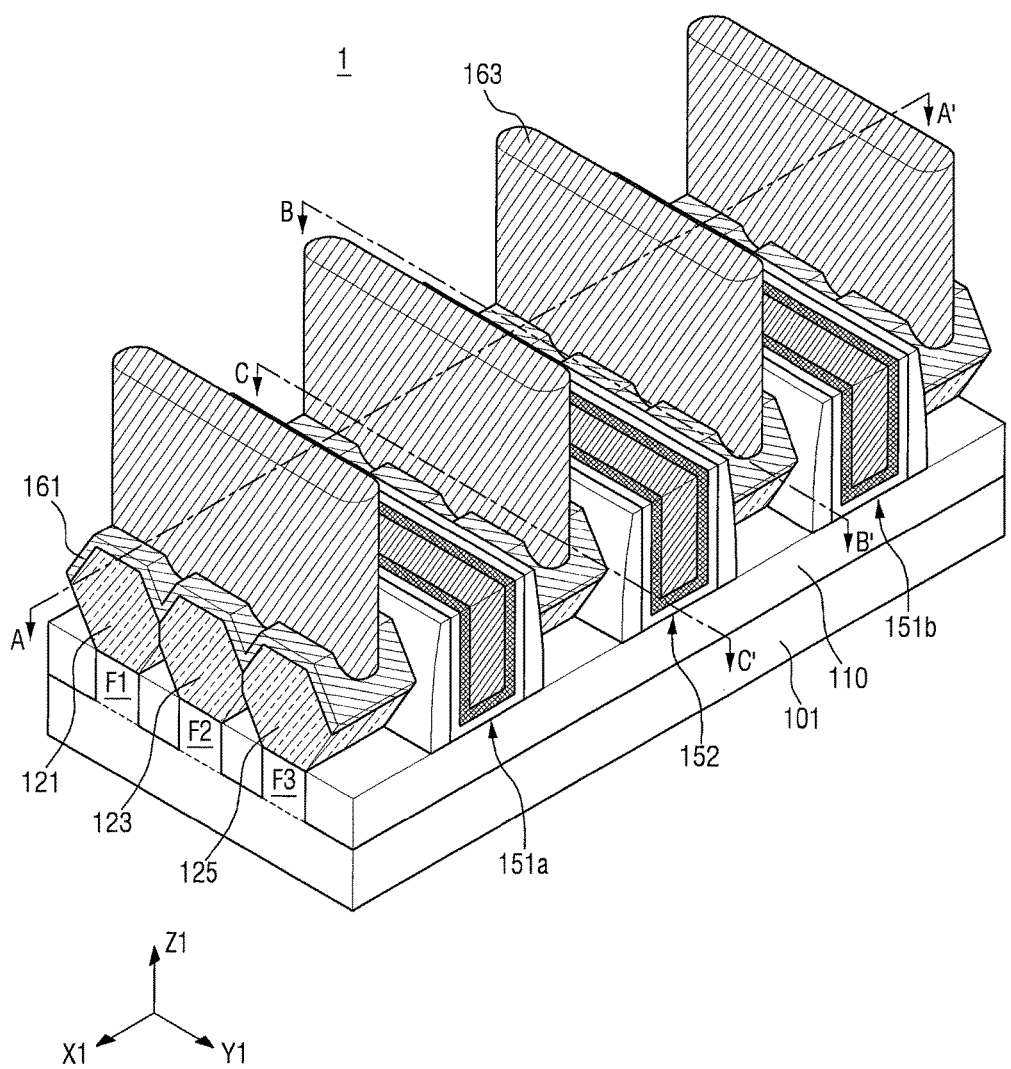
Figure 22:
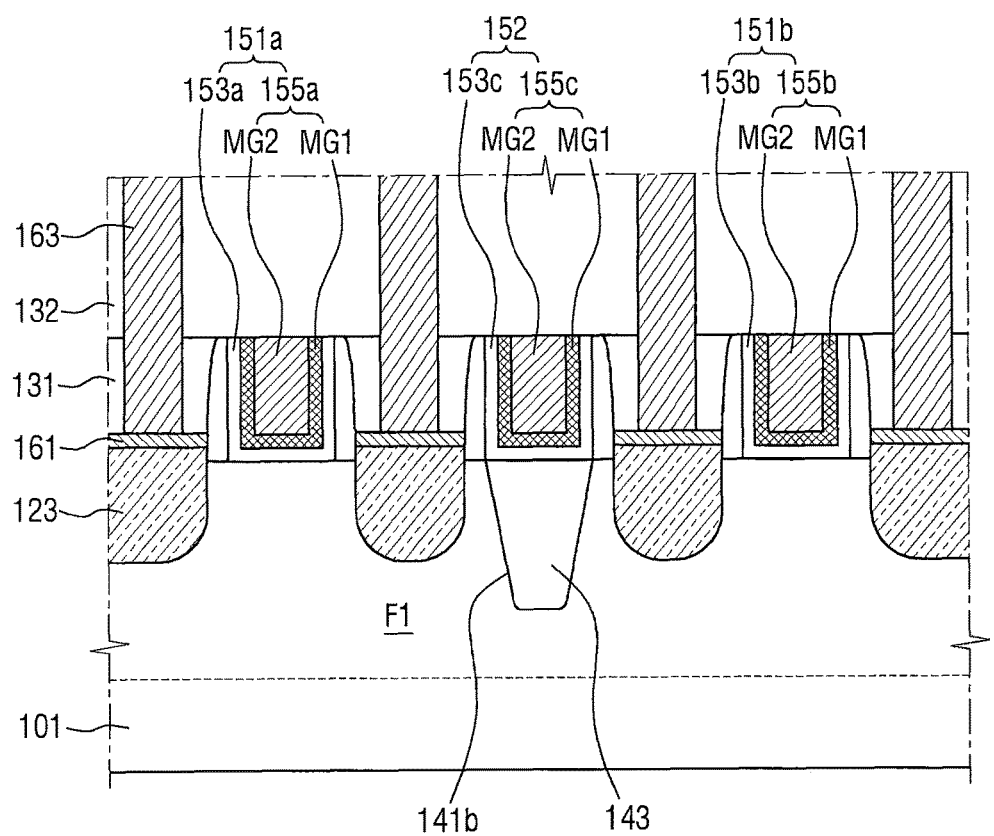
Figure 23:
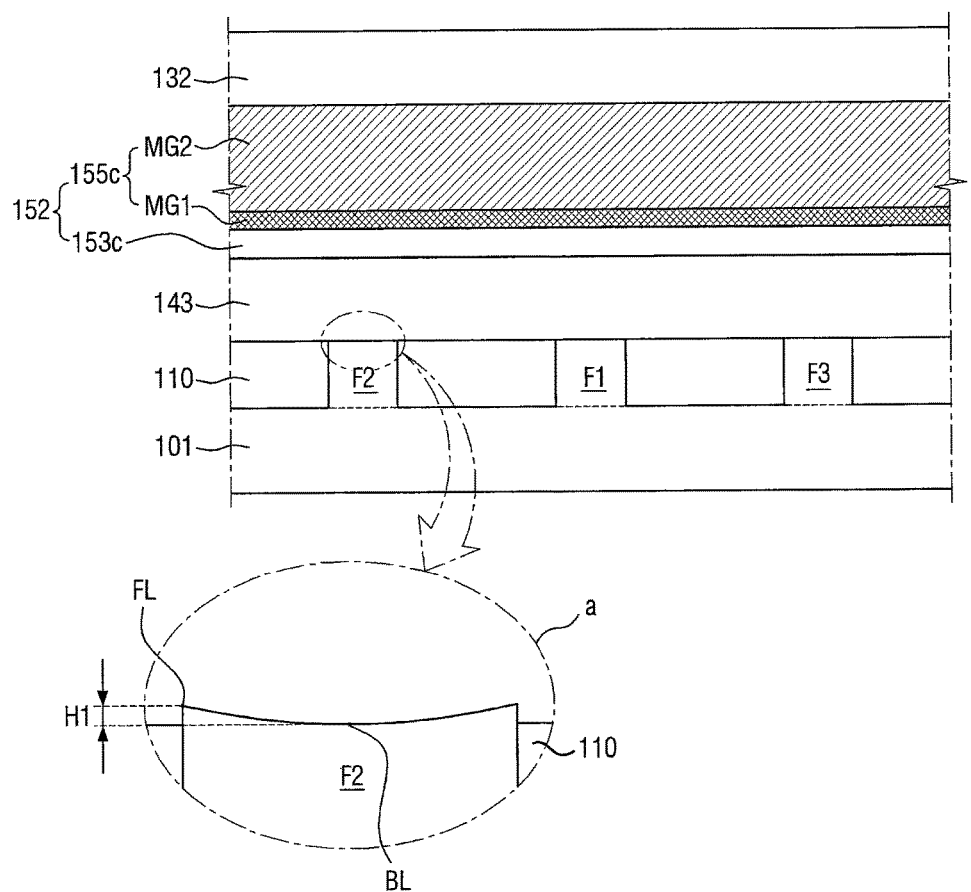
Figure 24:
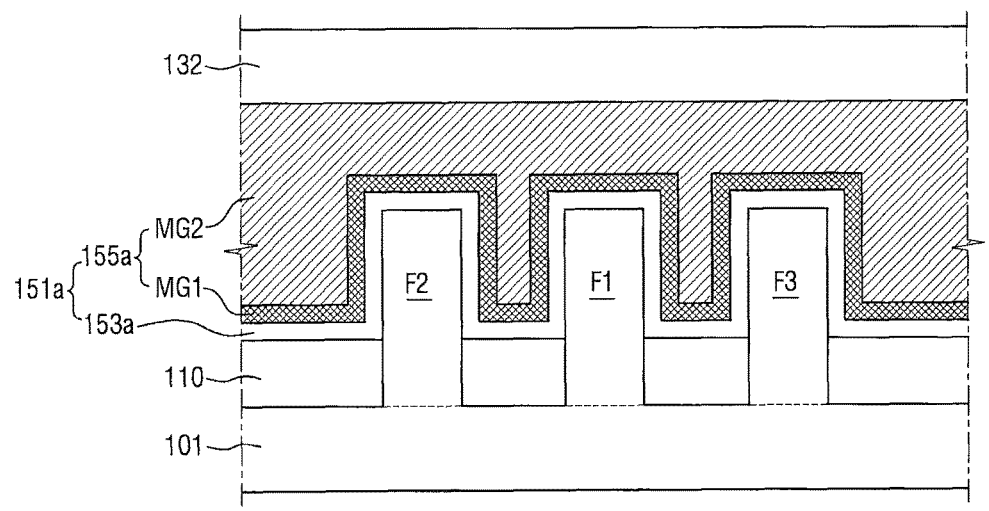

FIGS. 1 to 24 are perspective views and cross-sections illustrating semiconductor devices according to some embodiments of the present inventive concept. FIG. 4A is a cross-section taken along line A-A' of FIG. 3, and FIG. 4B is a cross-section taken along line B-B' of FIG. 3. FIG. 7 is a cross-section taken along line A-A' of FIG. 6. FIG. 9 is a cross-section taken along line A-A of FIG. 8. FIG. 22 is a cross-section taken along line A-A' of FIG. 21, FIG. 23 is a cross-section taken along line B-B' of FIG. 21, and FIG. 24 is a cross-section taken along line C-C' of FIG. 21.

Referring first to FIG. 1, first to third fins F1 to F3 may be formed on a substrate 101. The first to third fins F1 to F3 may be formed on the substrate 101 and protrude in a third direction Z1. The first to third fins F1 to F3 may extend long in a first direction X1 which is a lengthwise direction, and may have a longer side in the first direction X1 and a shorter side in a second direction Y1. However, it will be understood that embodiments of the present inventive concept are not limited to this configuration. For example, the longer side direction may be the second direction Y1 and the shorter side direction may be the first direction X1 without departing from the scope of the present inventive concept.

The first to third fins F1 to F3 may be spaced apart from each other in such a manner that the longer sides thereof are parallel to each other, but the present disclosure is not limited thereto. Thus, the first to third fins F1 to F3 may be disposed such that the shorter sides thereof are parallel to each other.

The substrate 101 may be made of one or more semiconductor materials selected from a group consisting of, for example, silicon (Si), Germanium (Ge), silicon germanium (SiGe), Gallium Phosphide (GaP), Gallium Arsenide (GaAs), Silicon Carbide (SiC), Silicon Germanium Carbide (SiGeC), Indium Arsenide (InAs) and Indium Phosphide (InP). Furthermore, in some embodiments, the substrate 101 may be a silicon on insulator (SOI) substrate.

The first to third fins F1 to F3 may be a part of the substrate 101, and may include an epitaxial layer grown from the substrate 101. For example, the first to third fins F1 to F3 may include Si or SiGe.

Figure 2:
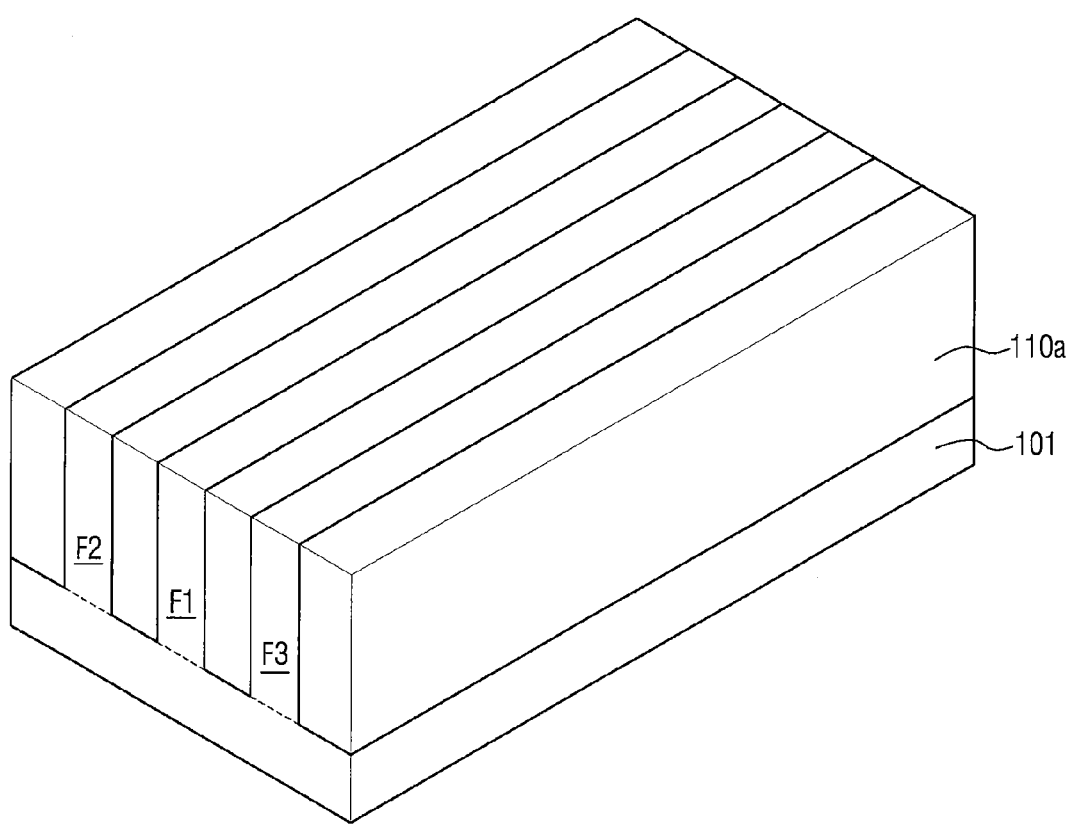

Referring to FIG. 2, an insulating layer 110a may be formed to cover the first to third fins F1 to F3. The insulating layer 110a may be made of a material including at least one of, for example, a silicon oxide layer, a silicon nitride layer and a silicon oxynitride layer.

Referring to FIG. 3 to FIG. 4B, an upper portion of the insulating layer 110a is recessed to form the field insulating layer 110 and expose upper portions of the first to third fins F1 to F3. The recess process may include a selective etching process.

The portions of the first to third fins F1 to F3 exposed upwardly from the field insulating layer 110 may be formed by an epitaxial process. For example, after formation of the insulating layer 110a, the portions of the first to third fins F1 to F3 may be formed, without a recess process, by an epitaxial process which uses, as a seed, upper surfaces of the first to third fins F1 to F3 exposed by the insulating layer 110a.

Furthermore, doping to adjust a threshold voltage may be performed on the exposed first to third fins F1 to F3. For example, impurities may be boron (B) when forming an n-channel metal oxide semiconductor (NMOS) transistor, and impurities may be phosphorus (P) or arsenic (As) when forming a p-channel metal oxide semiconductor (PMOS) transistor.

Subsequently, first to third sacrificial gate insulating layers 111a to 111c intersecting the first to third fins F1 to F3 may be formed on the first to third fins F1 to F3, and first to third sacrificial gate electrodes 112a to 112c may be formed respectively on the first to third sacrificial gate insulating layers 111a to 111c. The first to third sacrificial gate electrodes 112a to 112c may be spaced apart from each other.

Although the first to third sacrificial gate electrodes 112a to 112c are depicted as intersecting the first to third fins F1 to F3 orthogonally, that is in the first direction X1 in FIG. 3, embodiments of the present inventive concept are not limited to this configuration. For example, the first to third sacrificial gate electrodes 112a to 112c may intersect the first to third fins F1 to F3 forming an acute angle and/or an obtuse angle with the first direction X1 without departing from the scope of the present inventive concept.

The first to third sacrificial gate insulating layers 111a to 111c and the first to third sacrificial gate electrodes 112a to 112c may be formed on upper surfaces and sidewalls of the first to third fins F1 to F3.

The first to third sacrificial gate insulating layers 111a to 111c may be formed conformally along the upper surfaces and sidewalls of the first to third fins F1 to F3. Furthermore, the first to third sacrificial gate insulating layers 111a to 111c may be disposed on the field insulating layer 110.

The first to third sacrificial gate insulating layers 111a to 111c may be, for example, a silicon oxide layer. The first to third sacrificial gate electrodes 112a to 112c may be, for example, polysilicon. However, it will be understood that embodiments of the present inventive concept are not limited to this configuration.

First to third hard mask layers 113a to 113c may be formed respectively on the first to third sacrificial gate electrodes 112a to 112c. The first to third hard mask layers 113a to 113 c may be made of a material including at least one of a silicon oxide layer, a silicon nitride layer and a silicon oxynitride layer.

Subsequently, first to third spacers 115a to 115c may be formed on both sidewalls of each of the first to third sacrificial gate electrodes 112a to 112c. The first to third spacers 115a to 115c may respectively expose upper surfaces of the first to third hard mask layers 113a to 113c. The first to third spacers 115a to 115c may be a silicon nitride layer or a silicon oxynitride layer, and may be formed by stacking a plurality of layers differently from the single layer shown in the drawings.

Figure 5:
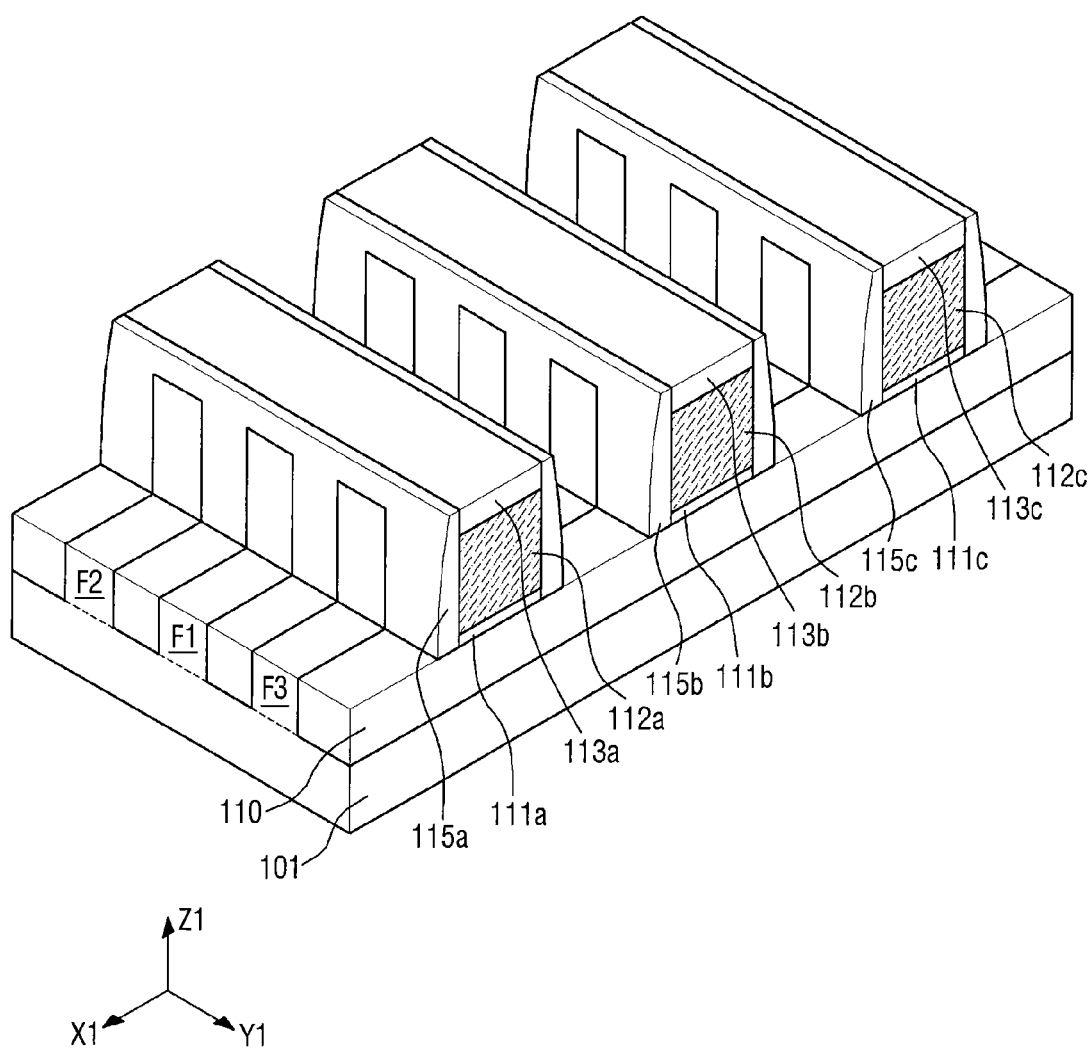

Referring to FIG. 5, the first to third fins F1 to F3 may be etched. The parts of the first to third fins F1 to F3 excluding the parts thereof covered by the first to third sacrificial gate insulating layers 111a, 111b and 111c may be etched.

Thus, the first to third fins F1 to F3 exposed among the first to third sacrificial gate insulating layers 111a, 111b and 111c may be etched. The first to third fins F1 to F3 may be etched using, as an etching mask, the first to third spacers 115a to 115c and the first to third hard mask layers 113a to 113c.

Figure 6:
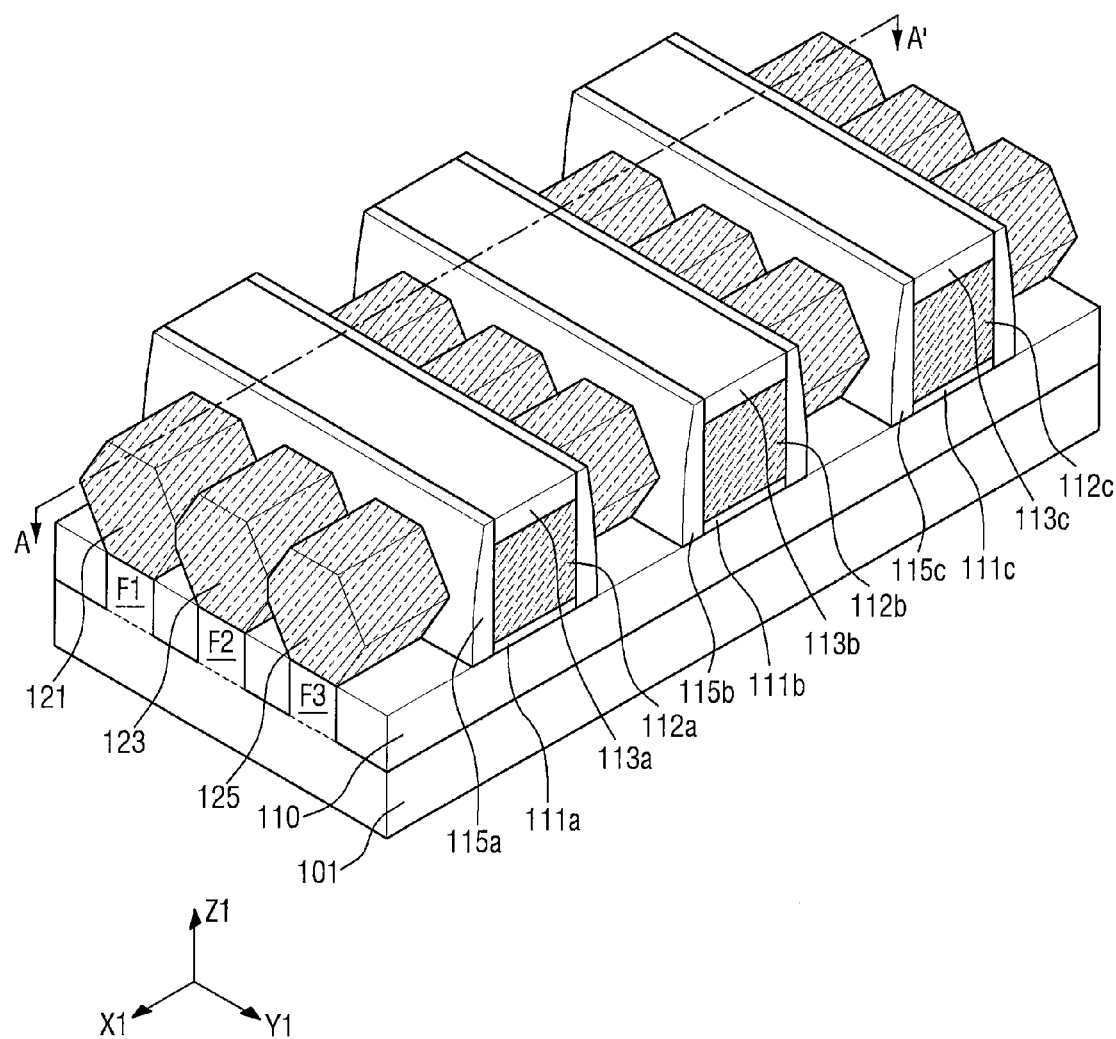
Figure 7:
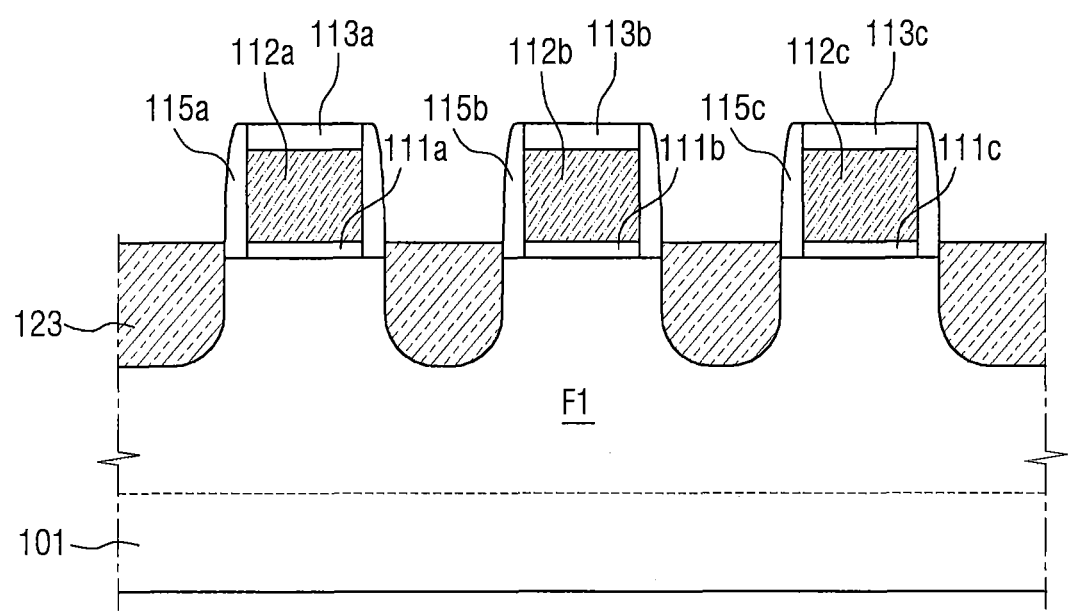

Referring to FIGS. 6 and 7, first to third source/drain regions 121, 123 and 125 may be formed in the etched parts of the first to third fins F1 to F3. The first source/drain region 123 may be formed in the first fin F1, the second source/drain region 121 may be formed in the second fin F2, and the third source/drain region 125 may be formed in the third fin F3. The first to third source/drain regions 121, 123 and 125 may be elevated source/drain regions. Thus, upper surfaces of the first to third source/drain regions 121, 123 and 125 may be higher than the upper surfaces of the first to third fins F1 to F3.

When the semiconductor device manufactured according to some embodiments is a PMOS transistor, the first to third source/drain regions 121, 123 and 125 may include a compressive stress material. For example, the compressive stress material may have a lattice constant larger than that of Si, and may be SiGe. The stress compressive material may apply compressive stress to the first to third fins F1 to F3 beneath first and second gate structures 151a and 151b, In other words, a channel region, so as to improve carrier mobility in the channel region.

When the semiconductor device manufactured according to some embodiments is an NMOS transistor, the first to third source/drain regions 121, 123 and 125 may include a tensile stress material. The first to third source/drain regions 121, 123 and 125 may include a material same as that of the substrate 101 or a tensile stress material. For example, if the substrate 101 includes Si, the first to third source/drain regions 121, 123 and 125 may include Si or a material having a lattice constant smaller than that of Si (for example, SiC and SiP).

The first to third source/drain regions 121, 123 and 125 may be formed using an epitaxial growth process.

Although the first to third source/drain regions 121, 123 and 125 are depicted as contacting each other in FIG. 6, it will be understood that embodiments of the present inventive concept are not limited to this configuration. For example, the first to third source/drain regions 121, 123 and 125 may be spaced apart from each other without departing from the inventive concept.

Figure 8:
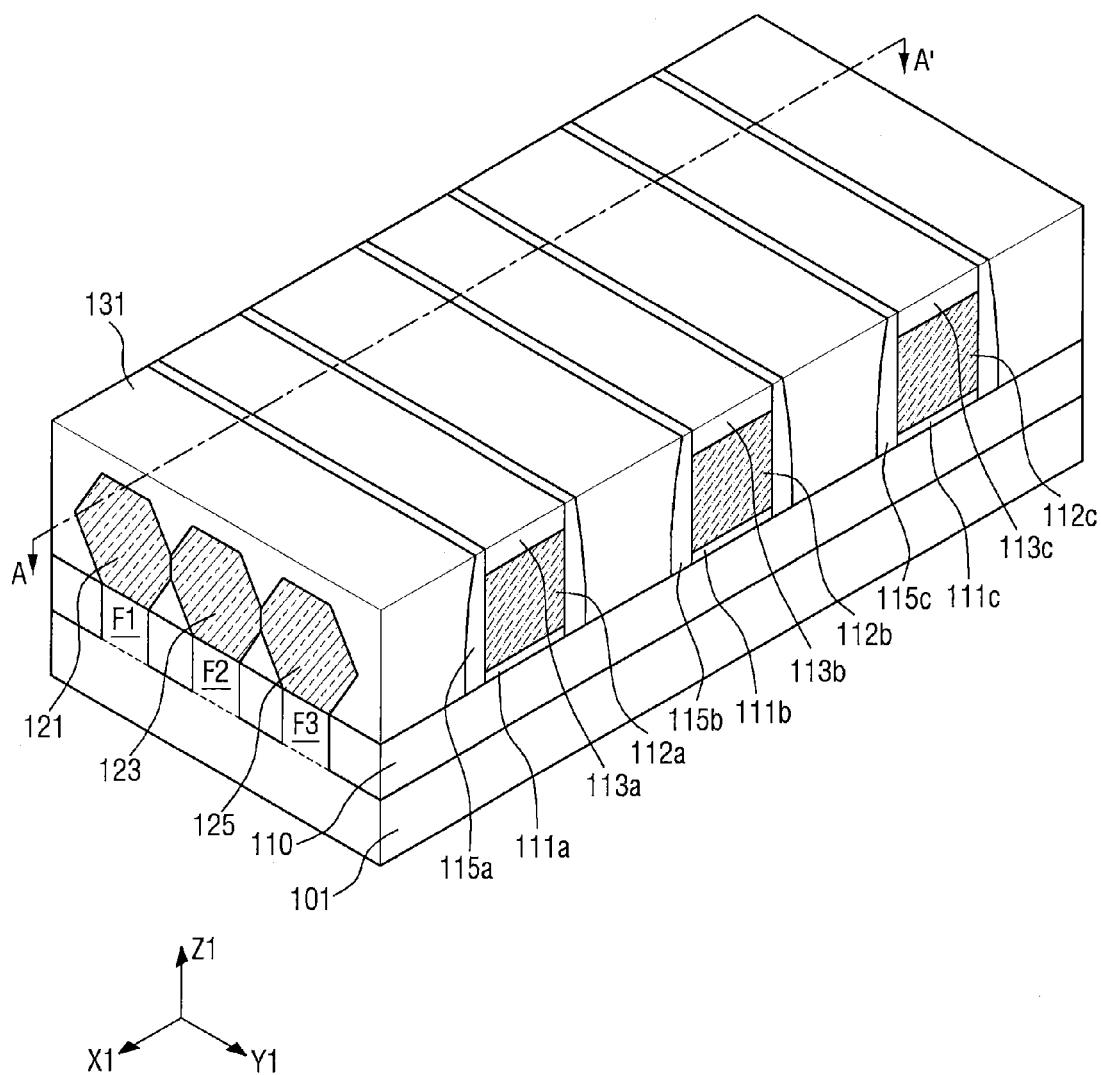
Figure 9:
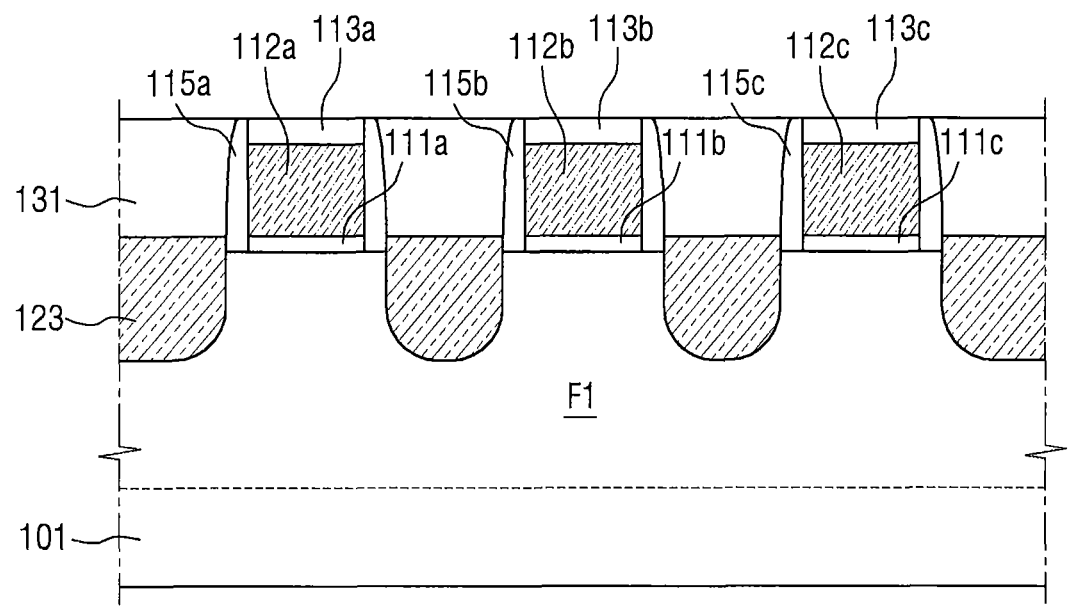

Referring to FIGS. 8 and 9, a first interlayer insulating layer 131 may be formed to cover the first to third source/drain regions 121, 123 and 125. The first interlayer insulating layer 131 may cover sidewalls of the first to third source/drain regions 121, 123 and 125, and expose the upper surfaces of the first to third hard mask layers 113a, 113b and 113c. The first interlayer insulating layer 131 may include, for example, an oxide layer.

Figure 10:
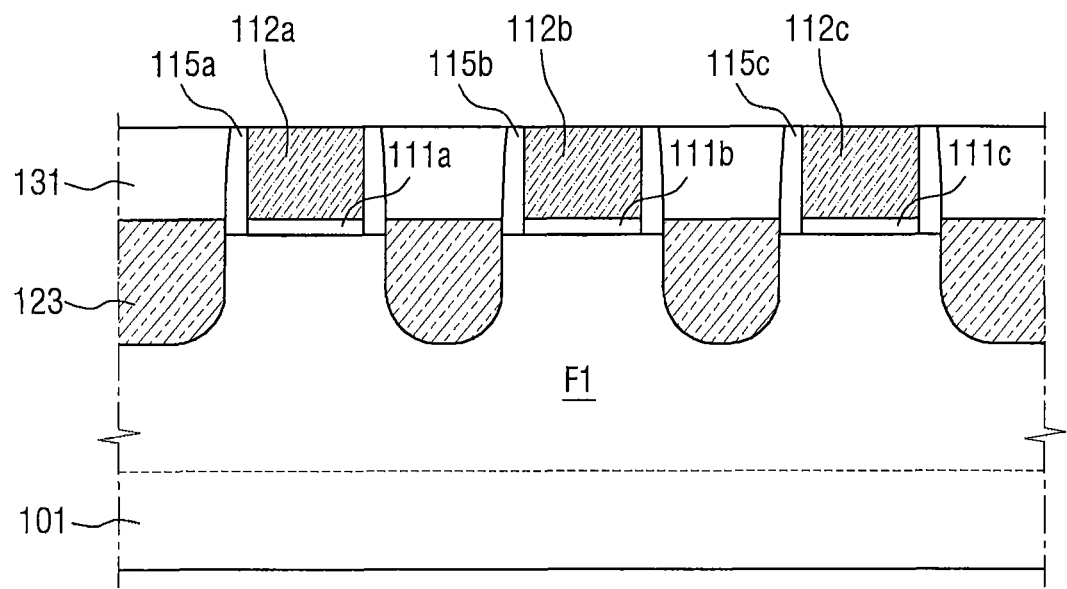

Referring to FIG. 10, the first to third hard mask layers 113a, 113b and 113c are removed to expose upper surfaces of the first to third sacrificial gate electrodes 112a to 112c.

A planarizing process, for example, a chemical-mechanical planarization (CMP) process, may be performed to remove the first to third hard mask layers 113a, 113b and 113c, and the first interlayer insulating layer 131 may be partially etched during the planarizing process.

After the planarizing process, a cleaning process may be performed to remove residues and the like generated during the planarizing process. The first interlayer insulating layer 131 may be coplanar with the upper surfaces of the first to third sacrificial gate electrodes 112a to 112. However, it will be understood that embodiments of the present inventive concept are not limited to this configuration. For example, the first interlayer insulating layer 131 may be partially removed during the planarizing process, and thus an upper surface of the first interlayer insulating layer 131 may become lowered than the upper surface of the first to third sacrificial gate electrodes 112a to 112c without departing from the scope of the present inventive concept.

Figure 11:
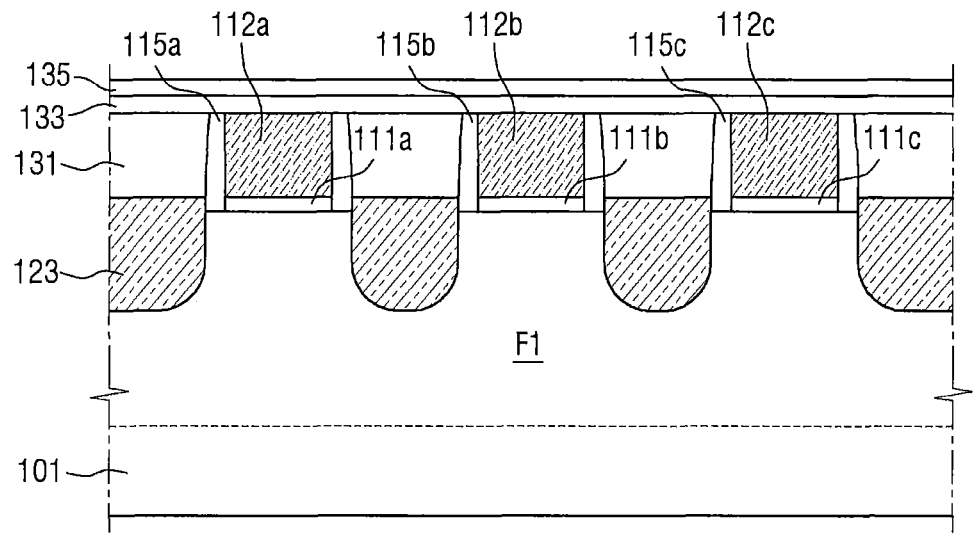

Referring to FIG. 11, a passivation layer 133 and a first insulating layer 135 may be formed to cover the upper surfaces of the first interlayer insulating layer 131 and the first to third sacrificial gate electrodes 112a to 112c. The passivation layer 133 may reduce the likelihood, or possibly prevent, the first interlayer insulating layer 131 from being etched in a subsequent process. The passivation layer 133 may include, for example, a nitride layer, an oxynitride layer and the like.

The first insulating layer 135 may be formed to compensate for the stepped portion caused when forming the passivation layer 133. When the first interlayer insulating layer 131 is partially removed during the planarizing process, a height difference may be caused between the upper surface of the first interlayer insulating layer 131 and the upper surfaces of the first to third sacrificial gate electrodes 112a to 112c, and thus the passivation layer 133 may not be formed flat and a concave portion may be formed in the first interlayer insulating layer 131. The first insulating layer 135 may fill the concave portion of the passivation layer 133, making an upper surface of the first insulating layer 135 planarized. The first insulating layer 135 may include a material the same or similar to that of the first interlayer insulating layer 131.

Figure 12:
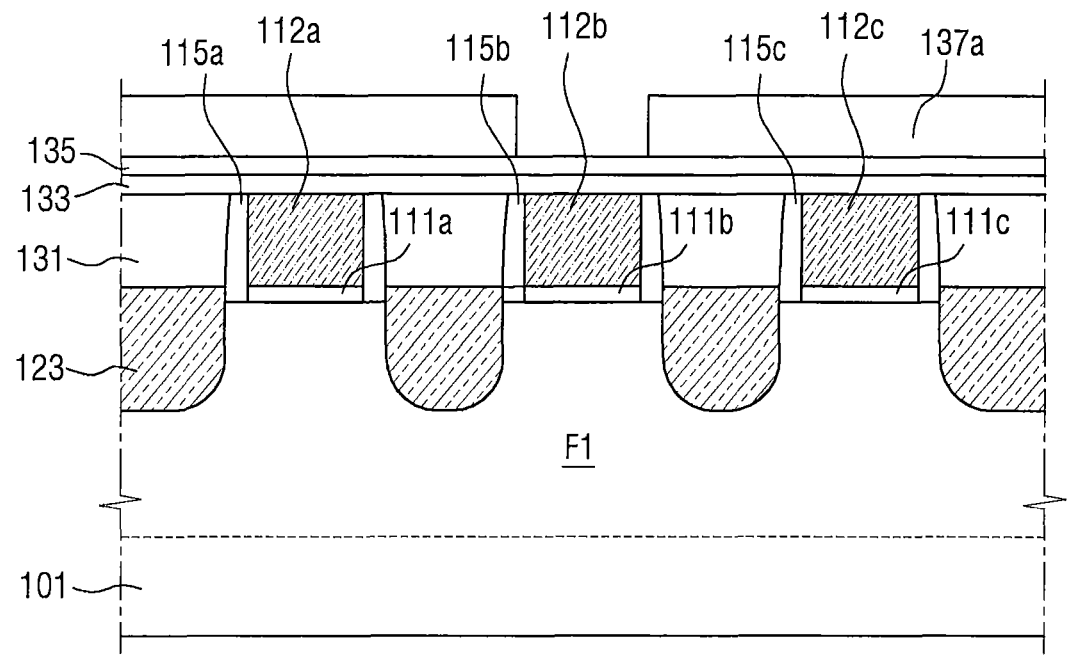

Referring to FIG. 12, an etching mask pattern 137a may be formed on the passivation layer 133. The etching mask pattern 137a may expose an upper surface of the second sacrificial gate electrode 112b, and covering the other parts.

Figure 13:
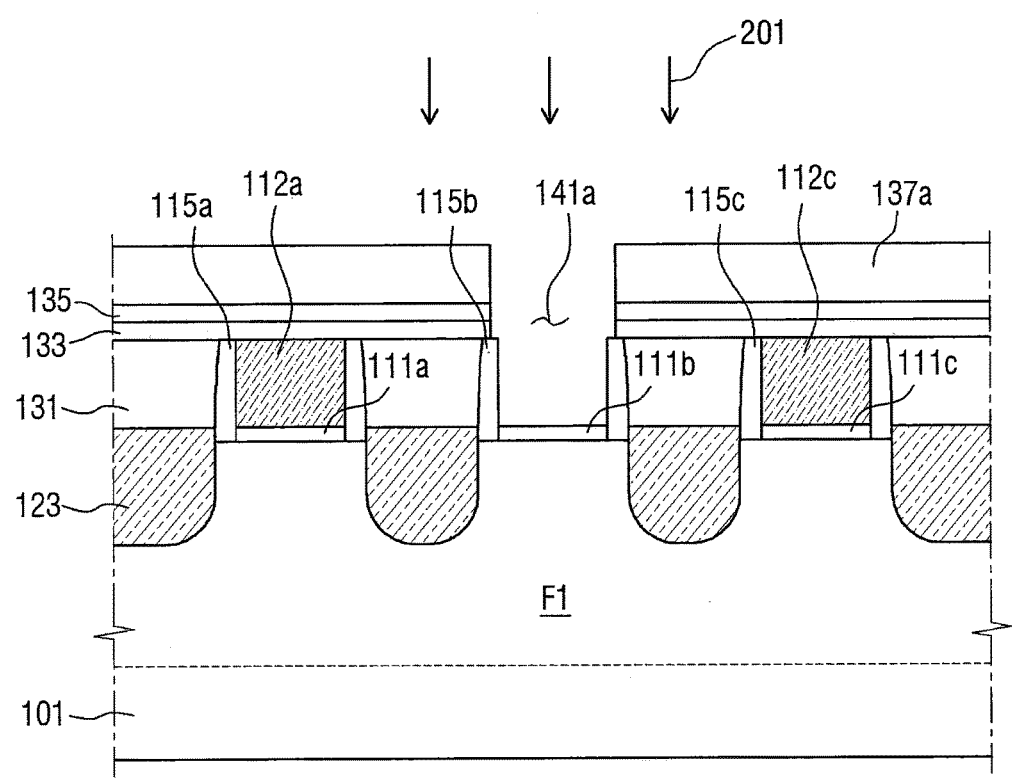

Referring to FIG. 13, the second sacrificial gate electrode 112b may be removed so as to form a first trench 141a. The second sacrificial gate insulating layer 111b may be exposed through a bottom surface of the first trench 141a. The second sacrificial gate electrode 112b may be removed by a first etching process 201.

In particular, the passivation layer 133 on the second sacrificial gate electrode 112b may be removed by using the etching mask pattern 137a, and subsequently the second sacrificial gate electrode 112b may be removed by the first etching process 201 so as to form the first trench 141a. The second sacrificial gate insulating layer 111b may be exposed by the first trench 141a.

The first etching process 201 may be an anisotropic etching process or an isotropic etching process. The first etching process 201 may be a wet etching process or a dry etching process. If the first etching process 201 is a dry etching process, a plasma etching process, a reactive ion etching (RIE) or a reactive ion beam etching process may be performed.

The first etching process 201 may be a reactive ion etching process using halogen halide gas, for example, hydrogen bromide (HBr) gas. However, it will be understood that embodiments of the present inventive concept are not limited to this configuration. For example, if the first etching process 201 is the above-mentioned reactive ion etching process, fluorocarbon($CF_4$) gas may be added during the etching process. By adding the fluorocarbon($CF_4$) gas, anisotropy may increase in the reactive ion etching process.

Figure 14:
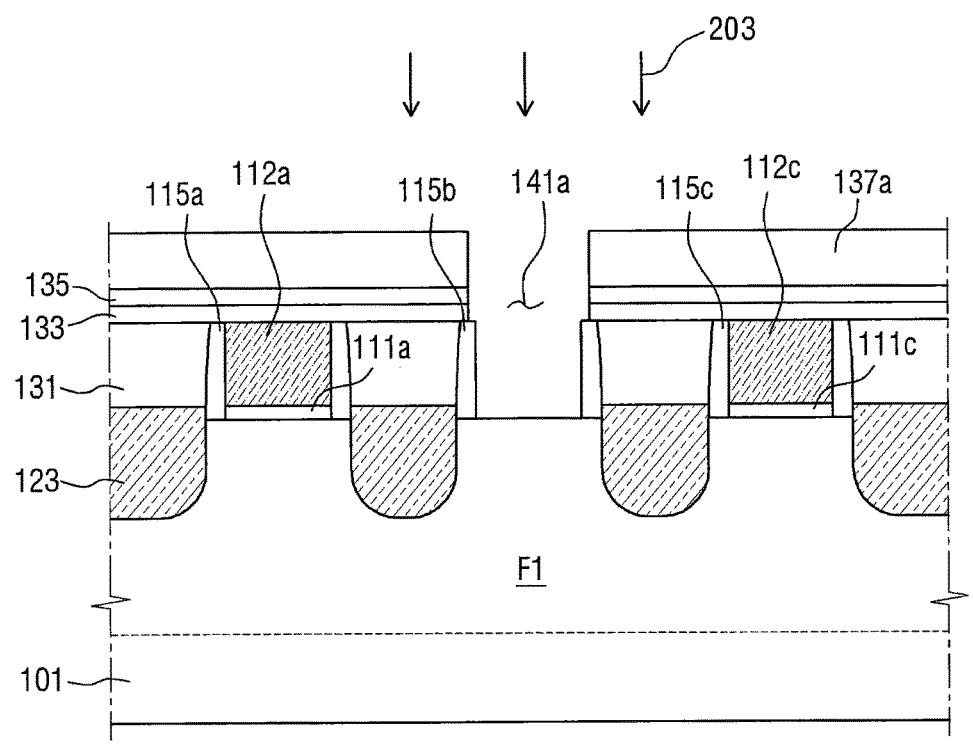

Referring to FIG. 14, the second sacrificial gate insulating layer 111b may be removed to expose the first to third fins F1 to F3. The second sacrificial gate insulating layer 111b exposed through the first etching process 201 may be removed through a second etching process 203. The second etching process 203 may be different from the first etching process 201. In some embodiments, the second etching process 203 may be a wet etching process. The second etching process 203 may be an isotropic etching process. However, it will be understood that embodiments of the present inventive concept are not limited to this configuration. For example, if the second etching process 203 is a wet etching process, hydrogen fluoride (HF) or buffered hydrogen fluoride (BHF) may be used as an etchant.

The second sacrificial gate insulating layer 111b may be completely removed and the second spacer 115b and the first to third fins F1 to F3 may be partially removed through the second etching process 203. However, it will be understood that embodiments of the present inventive concept are not limited to this configuration.

In some embodiments of the present inventive concept, since the second sacrificial gate insulating layer 111b may be completely removed through the second etching process 203, the second sacrificial gate insulating layer 111b may not remain on the sidewall of the second spacer 115b. Thus, subsequent processes with improved reliability can be performed.

Figure 15:
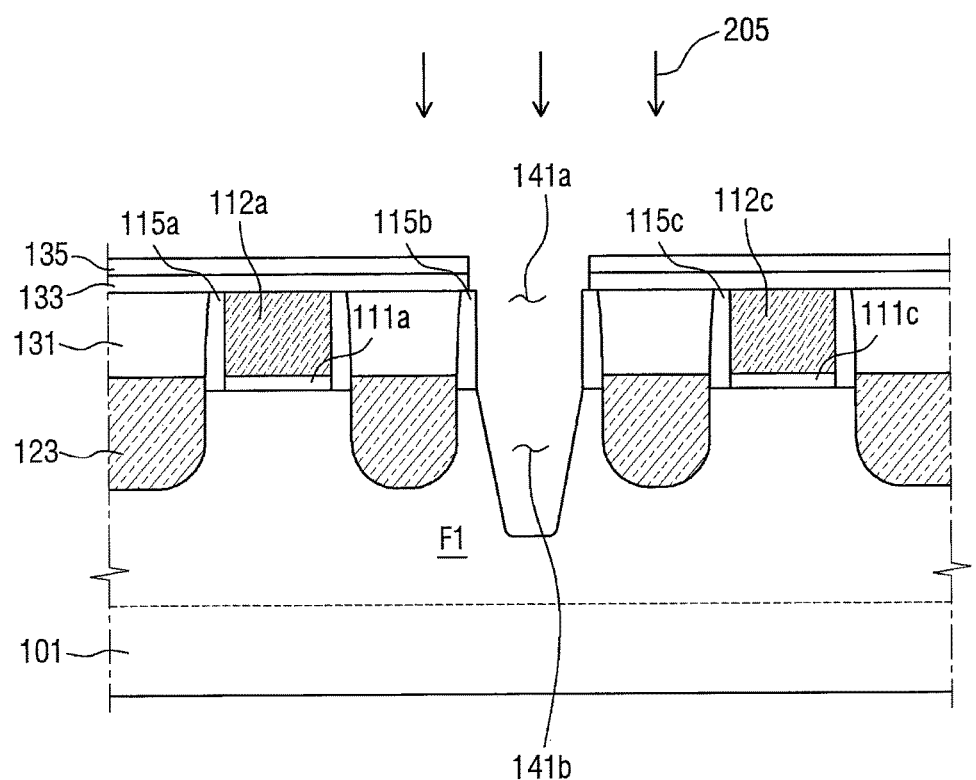

Both the first and second etching processes 201 and 203 discussed respectively with reference to FIGS. 13 and 15 may be wet etching processes. However, it will be understood that embodiments of the present inventive concept are not limited to this configuration.

Referring to FIG. 15, the exposed portions of the first to third fins F1 to F3 may be removed so as to form a first recess 141b. The first recess 141b may be spaced apart from the first to third source/drain regions 121, 123 and 125. The first recess 141b may have a bottom surface lower than or equal to bottom surfaces of the first to third source/drain regions 121, 123 and 125.

The exposed portions of the first to third fins F1 to F3 may be removed through a third etching process 205. The third etching process 205 may be an anisotropic etching process or an isotropic etching process. The third etching process 205 may be a wet etching process or a dry etching process. The third etching process 205 may be different from the second etching process 203 discussed with reference to FIG. 14. If the third etching process 205 is a dry etching process, a plasma etching process, a reactive ion etching (RIE) or a reactive ion beam etching process may be performed.

The third etching process 205 may be a reactive ion etching process using halogen halide gas, for example, hydrogen bromide (HBr) gas, but the present disclosure is not limited thereto. If the third etching process 205 is the above-mentioned reactive ion etching process, fluorocarbon ($CF_4$) gas may be added during the etching process. By adding the fluorocarbon($CF_4$) gas, anisotropy may increase in the reactive ion etching process.

In some embodiments of the present inventive concept, since the upper surfaces of the first to third fins F1 to F3 may be exposed through the second etching process 203, and the first recess 141b may be formed through the third etching process 205, the first to third fins F1 to F3 at the bottom surface of the first recess 141b may not have a fence or may have respective fences having a height difference of 10 nm or less. Detail will be discussed further below with respect to FIG. 23.

Figure 16A:
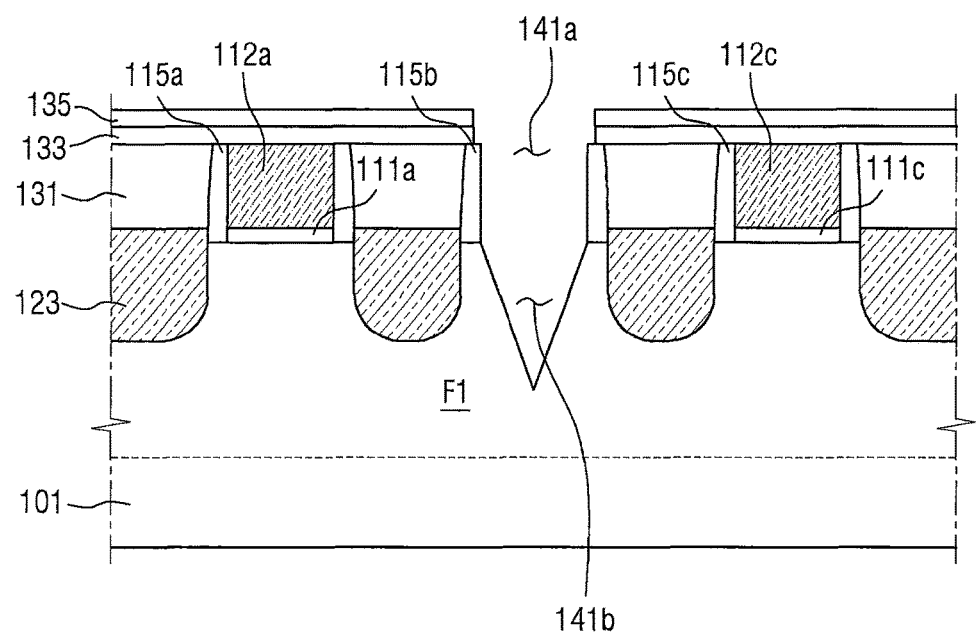
Figure 16B:
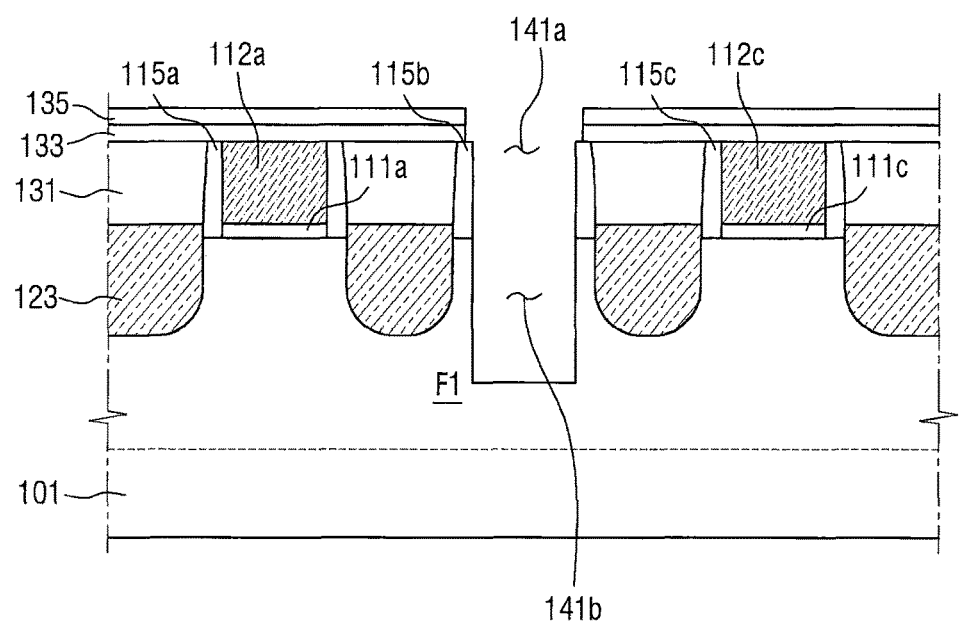
Figure 16C:
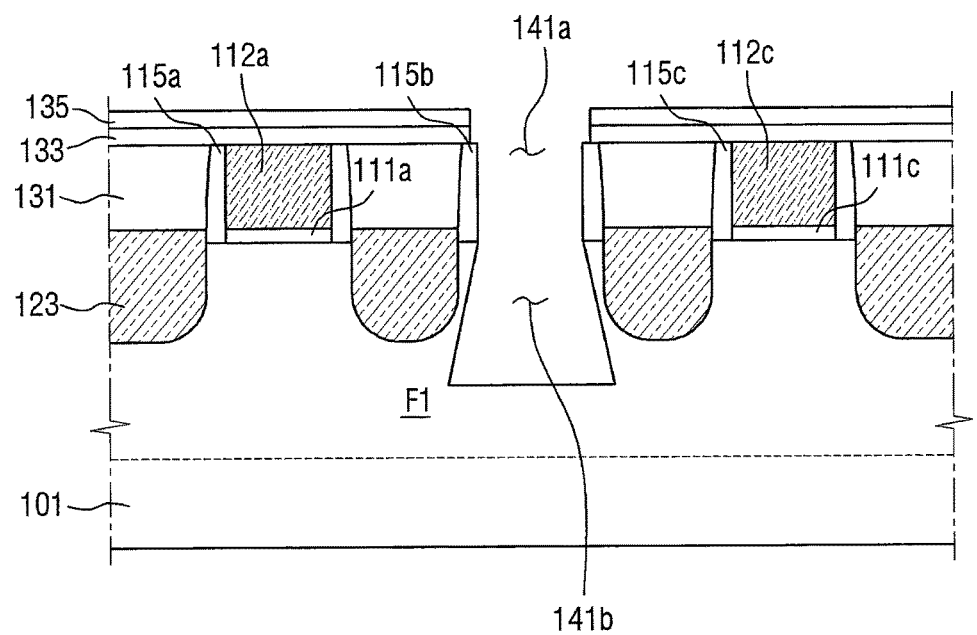
Figure 16D:
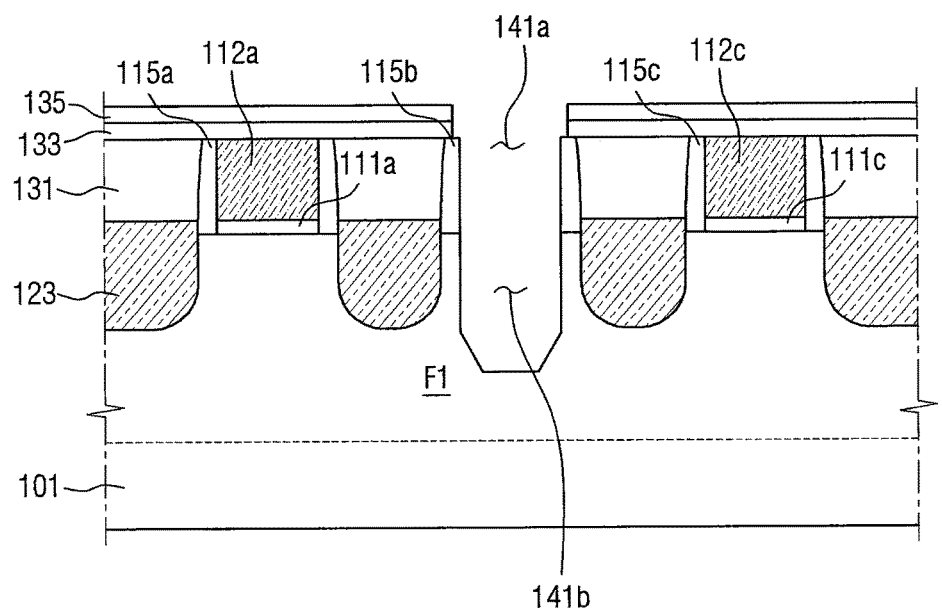
Figure 16E:
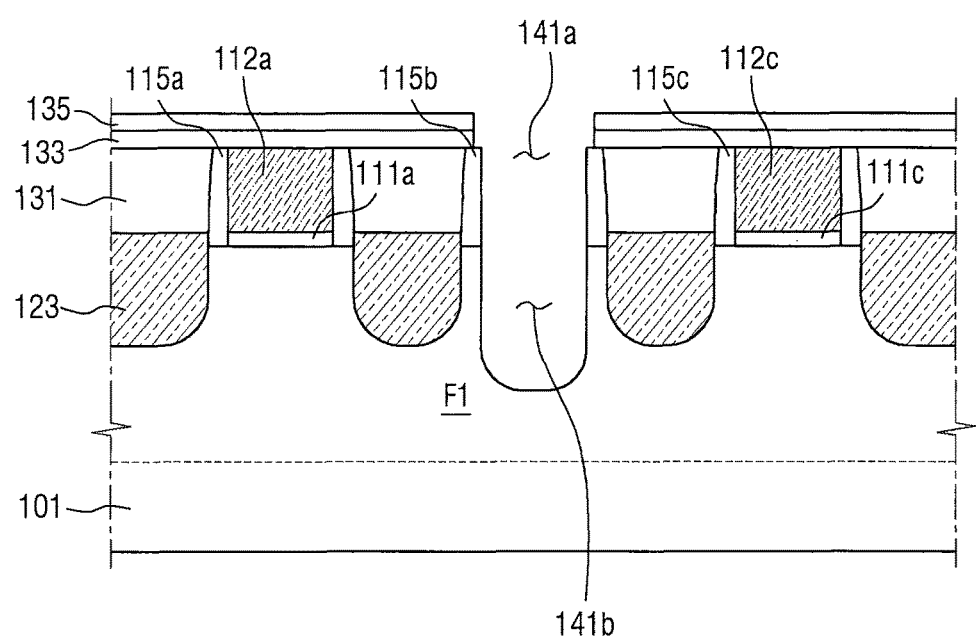

Although FIG. 15 depicts the first recess 141b as having a trench shape in which the width thereof decreases from the top to the bottom, the first recess 141b may have various shapes as illustrated in FIGS. 16A to 16E. For example, the first recess 141b may have a V-shape as illustrated in FIG. 16A, a rectangular shape as illustrated in FIG. 16B, a trapezoidal shape as illustrated in FIG. 16C, an angulated U-shape as illustrated in FIG. 16D and a U-shape as illustrated in FIG. 16E. However, it will be understood that embodiments of the present inventive concept are not limited to this configuration. For example, the first recess 141b may have other shapes than those shown in FIGS. 15 and 16A, to 16E without departing from the scope of the present inventive concept.

Figure 17:
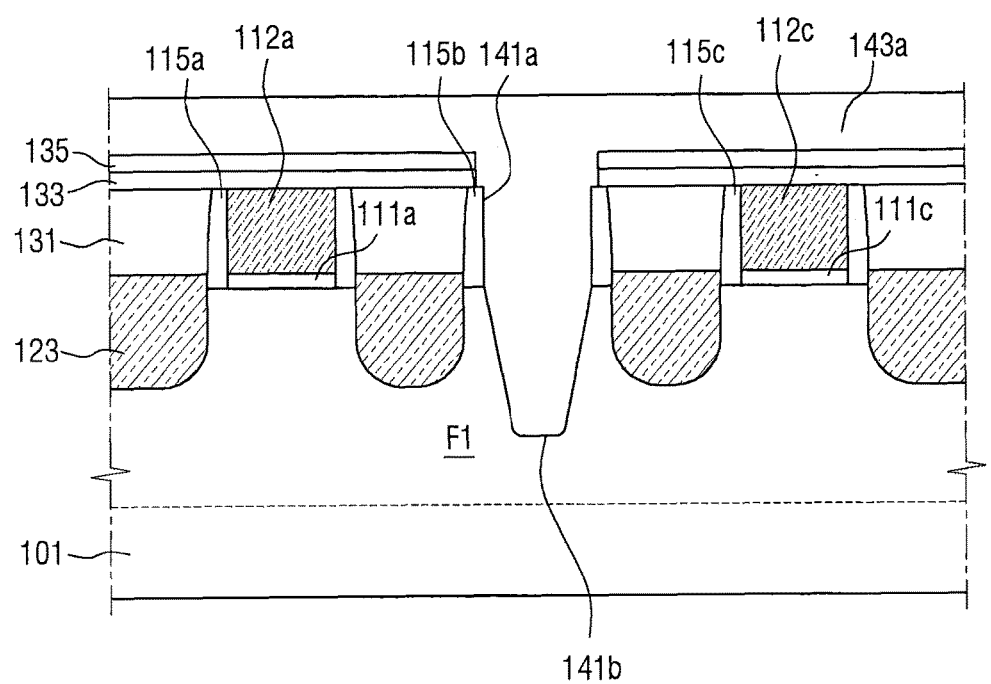

Referring to FIG. 17, the etching mask pattern 137a may be removed, and a first device isolation layer 143a may be formed to fill the first trench 141a and first recess 141b. The first device isolation layer 143a may be, for example, an oxide layer, a nitride layer, an oxynitride layer and the like.

Figure 18:
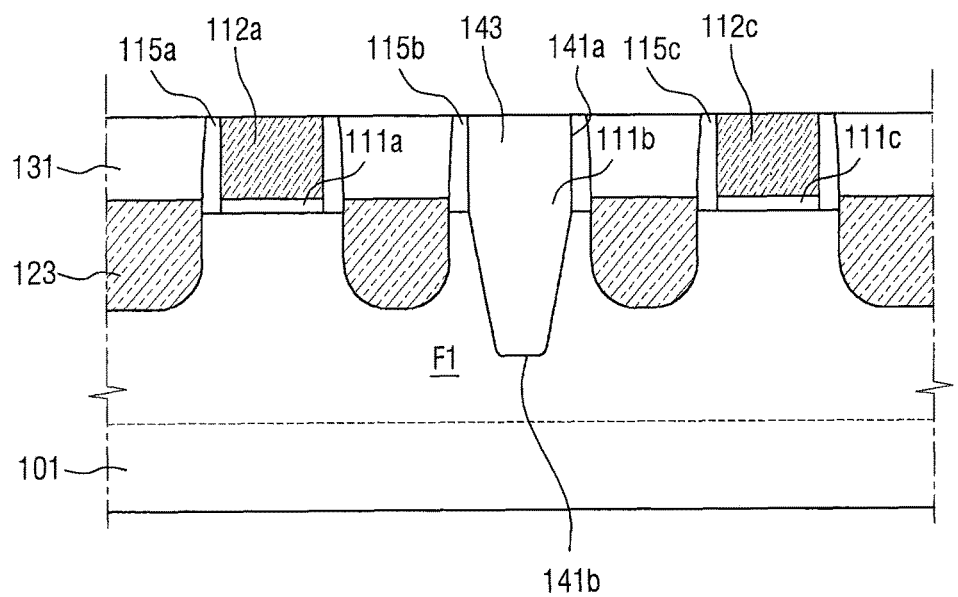

Referring to FIG. 18, the first device isolation layer 143a may be removed to expose the upper surfaces of the first and third sacrificial gate electrodes 112a and 112c. In these embodiments, the passivation layer 133 covering the first and third sacrificial gate electrodes 112a and 112c, and the first insulating layer 135 may be removed together through a planarizing process or the like. Although the passivation layer 133 is illustrated as being completely removed in some embodiments, the passivation layer 133 may partially remain on the first interlayer insulating layer 131. The device isolation layer 143 may remain only in the first trench 141a and the first recess 141b.

Figure 19:
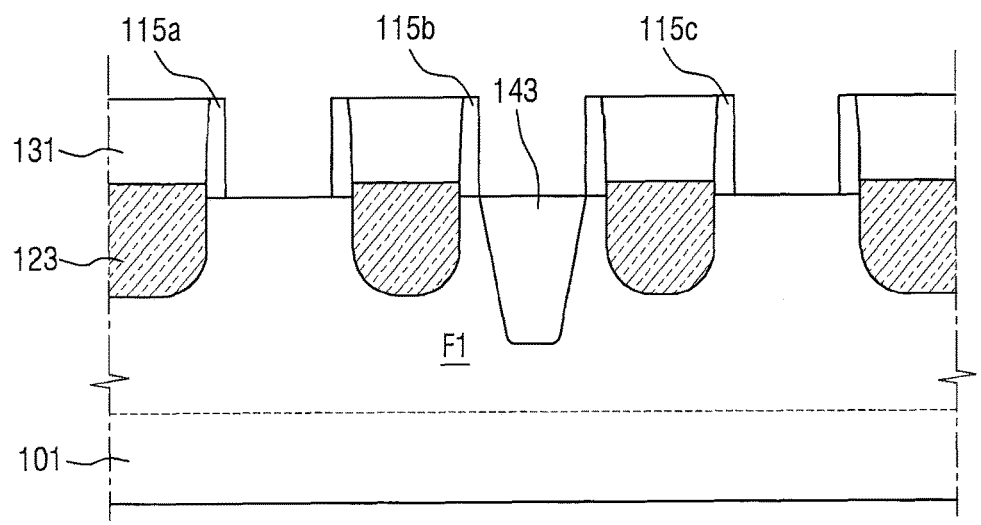

Referring to FIG. 19, the first and third sacrificial gate electrodes 112a and 112c and the first and third sacrificial gate insulating layers 111a and 111 c may be removed. In these embodiments, the first device isolation layer 143 may be partially etched.

Although the first device isolation layer 143 is depicted as being coplanar with the upper surfaces of the first to third fins F1 to F3 in FIG. 19, embodiments of the present inventive concept are not limited to this configuration. For example, an upper surface of the first device isolation layer 143 may be higher or lower than the upper surfaces of the first to third fins F1 to F3 without departing from the scope of the present inventive concept.

Figure 20:
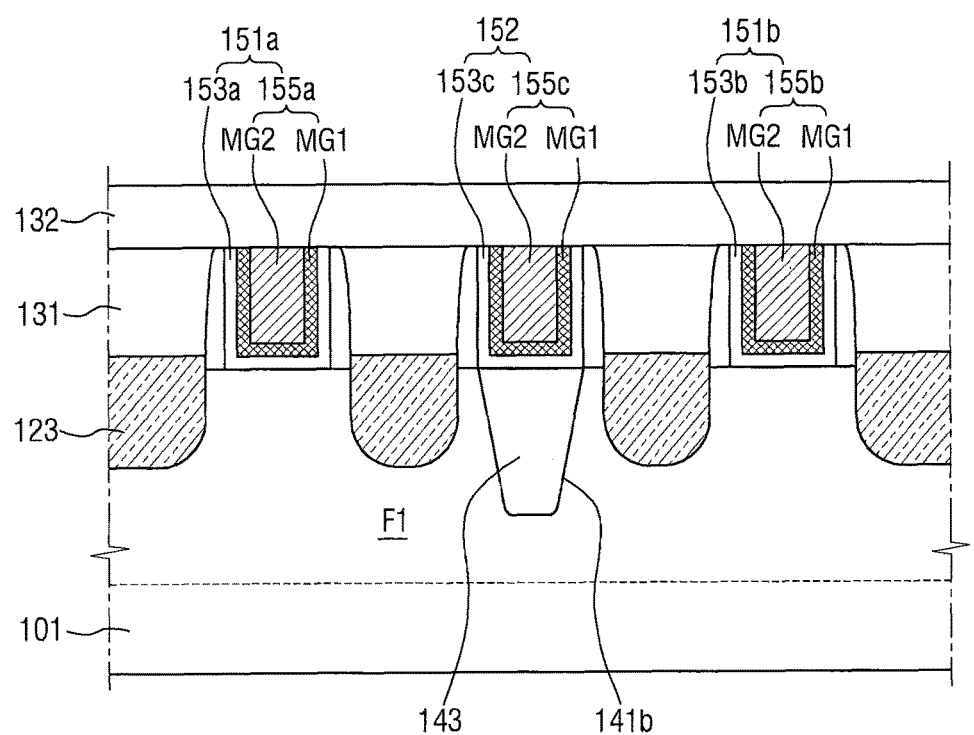

Referring to FIG. 20, the first and second gate structures 151a and 151b may be formed in the region where the first and third sacrificial gate electrodes 112a and 112c are removed, and a dummy gate structure 152 may be formed on the first device isolation layer 143. The first and second gate structures 151a and 151b and the dummy gate structure 152 may be simultaneously formed.

Each of the first and second gate structures 151a and 151b may include first and second gate insulating layers 153a and 153b and first and second gate electrodes 155a and 155b.

Each of the first and second gate insulating layers 153a and 153b may be formed between the first to third fins F1 to F3 and the first and second gate electrodes 155a and 155b. Each of the first and second gate insulating layers 153a and 153b may be formed along the upper surfaces of the first to third fins F1 to F3 and a sidewall of a first spacer 115. The first and second gate insulating layers 153a and 153b may include a high dielectric constant material having a dielectric constant higher than that of a silicon oxide layer. For example, the first and second gate insulating layers 153a and 153b may include, for example, $HfO_2$, $ZrO_2$, $LaO$, $Al_2O_3$ or $Ta_2O_5$.

Each of the first and second gate electrodes 155a and 155b may include first and second metal layers MG1 and MG2. As illustrated, each of the first and second gate electrodes 155a and 155b may be formed by stacking two or more layers of first and second metal layers MG1 and MG2. The first metal layer MG1 may serve to adjust a work function and the second metal layer MG2 may serve to fill the space formed by the first metal layer MG1. The first metal layer MG1 may be formed along the upper surfaces of the first to third fins F1 to F3 and the sidewall of the first spacer 115. For example, the first metal layer MG1 may include at least one among TiN, TaN, TiC, TiAlC and TaC. Furthermore, the second metal layer MG2 may include W or Al. Alternatively, the first and second gate electrodes 155a and 155b may be made of Si, SiGe and the like rather than metal.

The dummy gate structure 152 may include a dummy gate insulating layer 153c and a dummy gate electrode 155c. Unlike the first and second gate structures 151a and 151b, the dummy gate structure 152 does not operate as a gate of a transistor.

The dummy gate insulating layer 153c may be formed between the first to third fins F1 to F3 and the dummy gate electrode 155c. The dummy gate insulating layer 153c may be formed along the upper surface of the first device isolation layer 143 and the sidewall of the first spacer 115. The dummy gate insulating layer 153c may include a high dielectric constant material having a dielectric constant higher than that of a silicon oxide layer. For example, the dummy gate insulating layer 153c may include, for example, $HfO_2$, $ZrO_2$, LaO, $Al_2O_3$ or $Ta_2O_5$.

The dummy gate electrode 155c may include first and second metal layers MG1 and MG2. As illustrated, the dummy gate electrode 155c may be formed by sequentially stacking two or more layers of first and second metal layers MG1 and MG2. For example, the first metal layer MG1 may include at least one among TiN, TaN, TiC, TiAlC and TaC. Furthermore, the second metal layer MG2 may include W or Al. Alternatively, the dummy gate electrode 155c may be made of Si, SiGe and the like rather than metal.

Subsequently, a second interlayer insulating layer 132 may be formed. The second interlayer insulating layer 132 may cover the first interlayer insulating layer 131, the first and second gate structures 151a and 151b and the dummy gate structure 152.

Referring to FIGS. 21 to 24, a silicide layer 161 may be formed on the first to third source/drain regions 121, 123 and 125, and a contact 163 may be formed on the silicide layer 161, thereby manufacturing a semiconductor device 1.

In particular, the silicide layer 161 may be formed along the upper surfaces of the first to third source/drain regions 121, 123 and 125. The silicide layer 161 may serve to reduce sheet resistance, contact resistance and the like when the first to third source/drain regions 121, 123 and 125 contact the contact 163, and may include a conductive material, for example, Pt, Ni, Co and the like.

The contact 163 may be made of a conductive material, and may include, for example, W, Al Cu and the like. However, it will be understood that embodiments of the present inventive concept are not limited to this configuration.

The fin of the semiconductor device manufactured by the method for manufacturing a semiconductor device according to some embodiments may include a fence having a low height. As illustrated in FIG. 23, referring to a circle marked by a dotted line, the second fin F2 may include a concave portion. In particular, the upper surface of the second fin F2 and the upper surface of the field insulating layer 110 may not be coplanar with each other due to a protruded fence FL of the second fin F2. However, in some embodiments, since the first to third fins F1 to F3 may be recessed through the first and second etching processes, a height difference H1 between the fence FL and a bottom surface BL may be formed into 10 nm or less. Furthermore, the height difference H1 may substantially be removed. Thus, device isolation characteristics may be improved by the device isolation layer 143.

When the height difference H1 between the fence FL and the bottom surface BL of the second fin F2 is 10 nm or more, In other words, when a part of the second fin F2 penetrates into the first device isolation layer 143, device isolation characteristics using the first device isolation layer 143 may be degraded since the electrical conductivity of the second fin F2 is higher than that of the first device isolation layer 143. Therefore, reducing, or possibly minimizing, the height of the fence of the fin may be one method for improving device isolation characteristics of a semiconductor device.

In some embodiments, since forming the trench and recess may be performed through the three-stage etching process (first to third etching processes), the height of the fence of the fin may be reduced, or possibly minimized, or the fence may substantially be removed.

In some embodiments, substantially removing the fence of the fin may allow the height of the fence of the fin to be controlled to the level with which the fence of the fin may not substantially affect the device isolation characteristics using a device isolation layer.

Furthermore, in some embodiments, the recesses may be discretely formed through the aforementioned third etching process, and thus the recesses may have various widths and depths. Detail related thereto will be discussed further herein.

Processing steps in the fabrication of semiconductor devices according to some embodiments of the present inventive concept will be discussed with reference to FIGS. 25 to 31. FIGS. 25 to 31 are cross-sections and perspective views illustrating processing steps in the fabrication of semiconductor devices according to some embodiments of the present inventive concept.

The method for manufacturing a semiconductor device according to some embodiments is substantially similar to the method for manufacturing a semiconductor device discussed above with respect to FIGS. 1 to 24 except that the former further includes forming an inner spacer and a capping layer. Therefore, reference numerals are used to designate identical elements, and duplicated descriptions thereof will be omitted in the interest of brevity.

The process step of the method for manufacturing a semiconductor device discussed with reference to FIG. 25 may be performed after the process step of the method for manufacturing a semiconductor device discussed with reference to FIG. 13.

Figure 25:
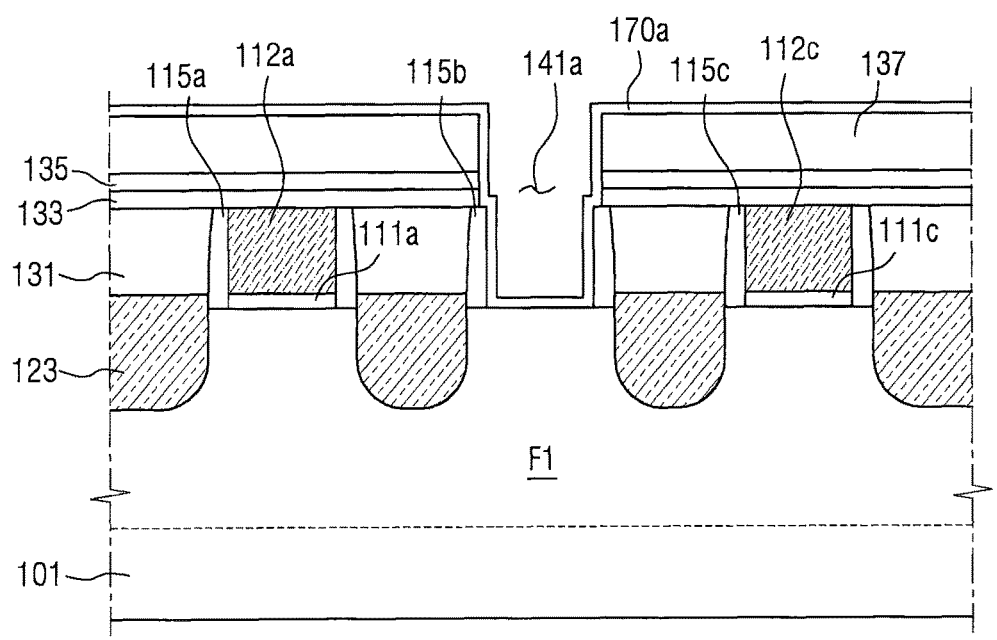
FIGS. 25 to 31 are cross-sections and perspective views illustrating processing steps in the fabrication of semiconductor devices according to some embodiments of the present inventive concept.

Referring to FIG. 25, an inner spacer 170a may be formed. The inner spacer 170a may be formed conformally along an upper surface and a sidewall of the etching mask pattern 137, the sidewall of the first spacer 115 and the upper surfaces of the first to third fins F1 to F3. The inner spacer 170a may include at least one of an oxide layer, a nitride layer and an oxynitride layer.

Figure 26:
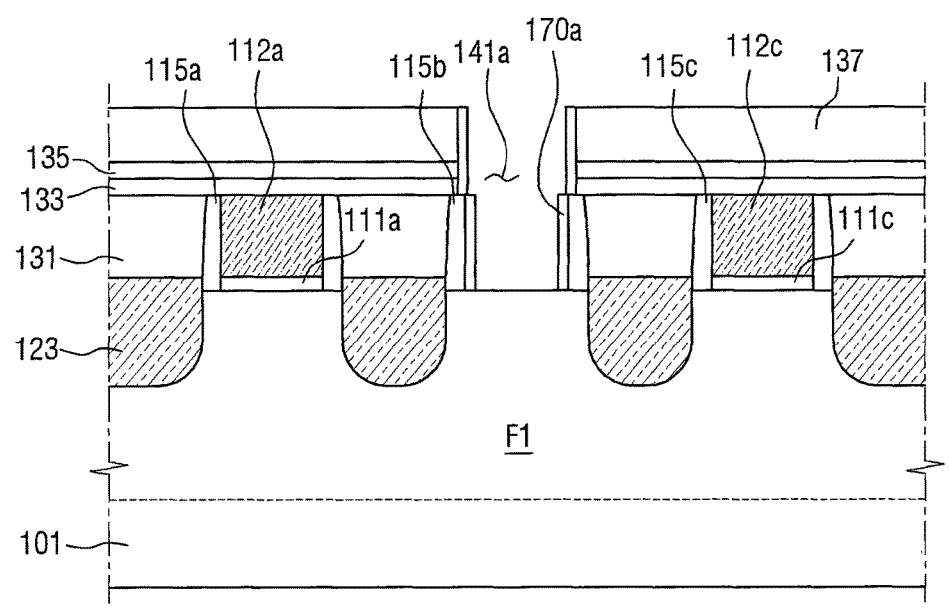

Referring to FIG. 26, the inner spacer 170a may be etched to expose the first to third fins F1 to F3 again. The inner spacer 170a may remain on the sidewall of the etching mask pattern 137 and the sidewall of the first spacer 115 through, for example, an etchback process and the like. The inner spacer 170a may be disposed on a sidewall of the first trench 141a.

Figure 27:
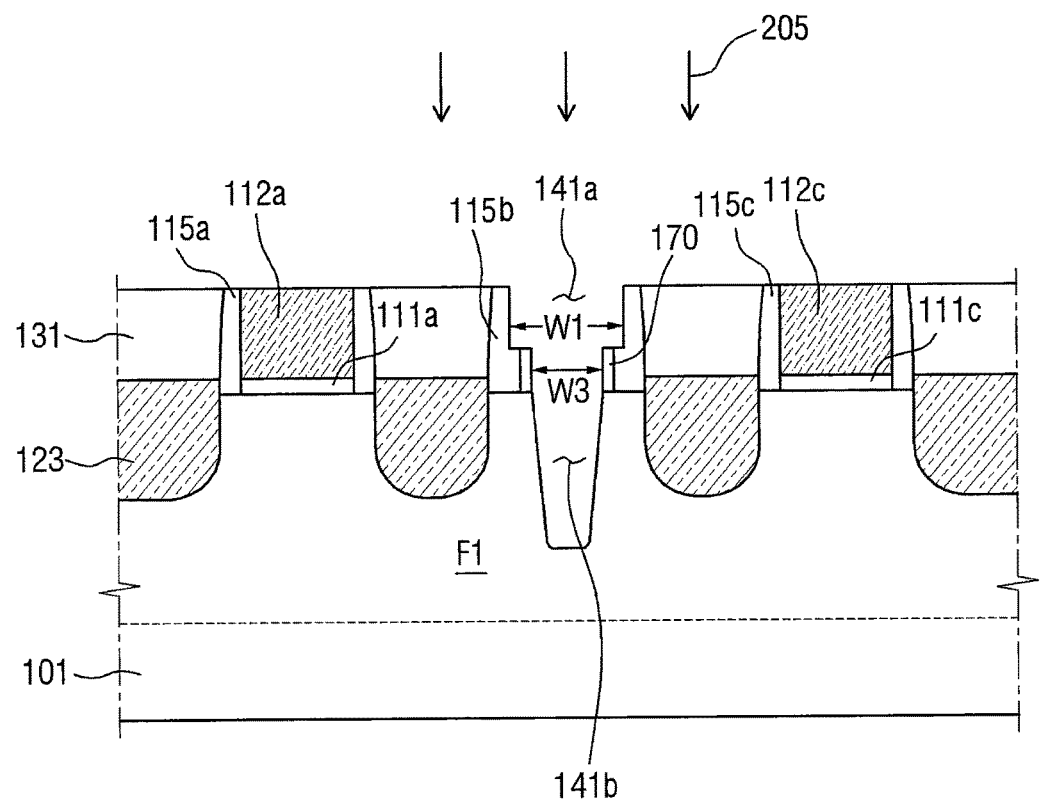

Referring to FIG. 27, the first to third fins F1 to F3 may be etched through the third etching process 205 so as to form a first recess 141b beneath the first trench 141a. The first recess 141b may be formed by using, as an etching mask, the etching mask pattern 137a, the first spacer 115 and the inner spacer 170. The profile of the inner spacer 170 and the profile of the first recess 141b may be interconnected.

The second spacer 115b and the inner spacer 170 may be partially etched during the formation of the first recess 141b. Thus, the height of the inner spacer 170 may be higher than the height of the first spacer 115, and a width W3 between the inner spacers 170 may be narrower than a width W1 of the etched part of the second spacer 115b.

The bottom surface of the first recess 141b may be lower than the bottom surfaces of the first to third source/drain regions 121, 123 and 125. Furthermore, the etching mask pattern 137, the first insulating layer 135 and the passivation layer 133 may be removed during the formation of the first trench 141a and the first recess 141b.

Figure 28:
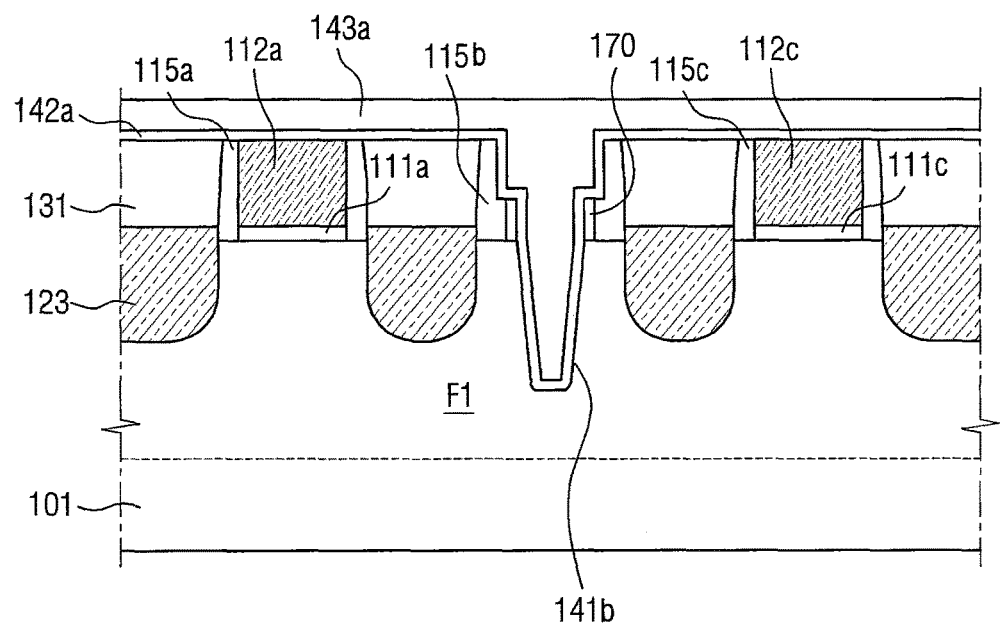

Referring to FIG. 28, a capping layer 142a and the first device isolation layer 143a may be sequentially formed. The capping layer 142a may be formed along inner surfaces of the first trench 141a and the first recess 141b. In particular, the capping layer 142a may be formed conformally along the upper surface and sidewall of the second spacer 115b, an upper surface and sidewall of the inner spacer 170 and an inner surface of the first recess 141b. The first device isolation layer 143 may be formed on the capping layer 142a, and may fill the rest of the first trench 141a and the first recess 141b.

For example, the capping layer 142a may include at least one of an oxide layer, a nitride layer and an oxynitride layer, and the first device isolation layer 143 may also include at least one of an oxide layer, a nitride layer and an oxynitride layer.

Figure 29:
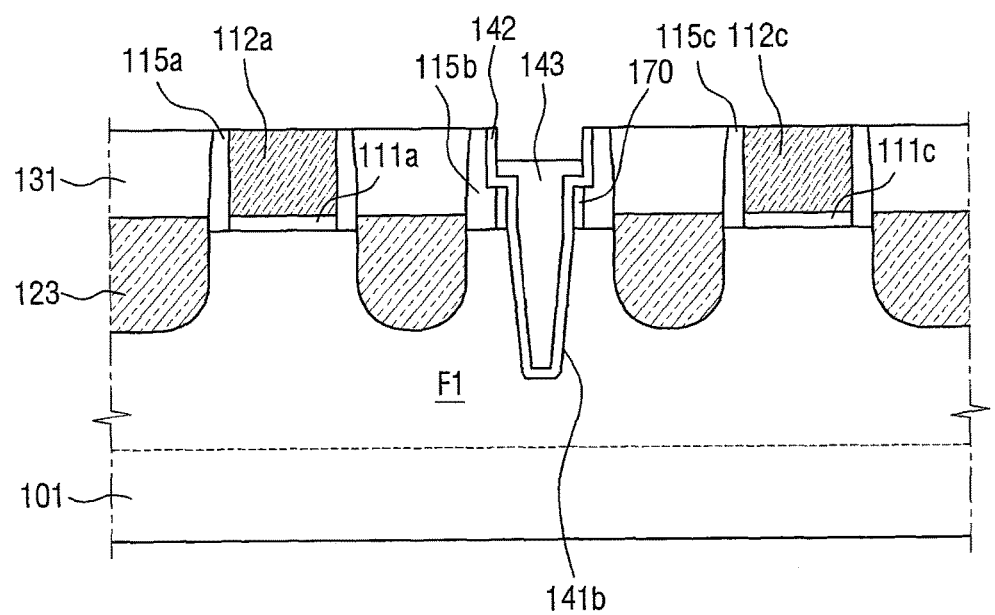

Referring to FIG. 29, the capping layer 142 and the first device isolation layer 143 may be removed such that the capping layer 142 and the first device isolation layer 143 may remain only in first trench 141a and the first recess 141b.

Subsequently, the first device isolation layer 143 may be partially removed. Thus, the first device isolation layer 143 may fill only a part of the first trench 141a. In some embodiments, the upper surface of the first device isolation layer 143 is illustrated as being higher than the upper surface of the inner spacer 170. However, it will be understood that embodiments of the present inventive concept are not limited to this configuration. For example, the upper surface of the first device isolation layer 143 may be lower than the upper surface of the inner spacer 170 without departing from the scope of the present inventive concept.

When the capping layer 142 includes a material different from a material of the first device isolation layer 143, the capping layer 142 may be rarely removed during partial removal of the first device isolation layer 143.

Figure 30:
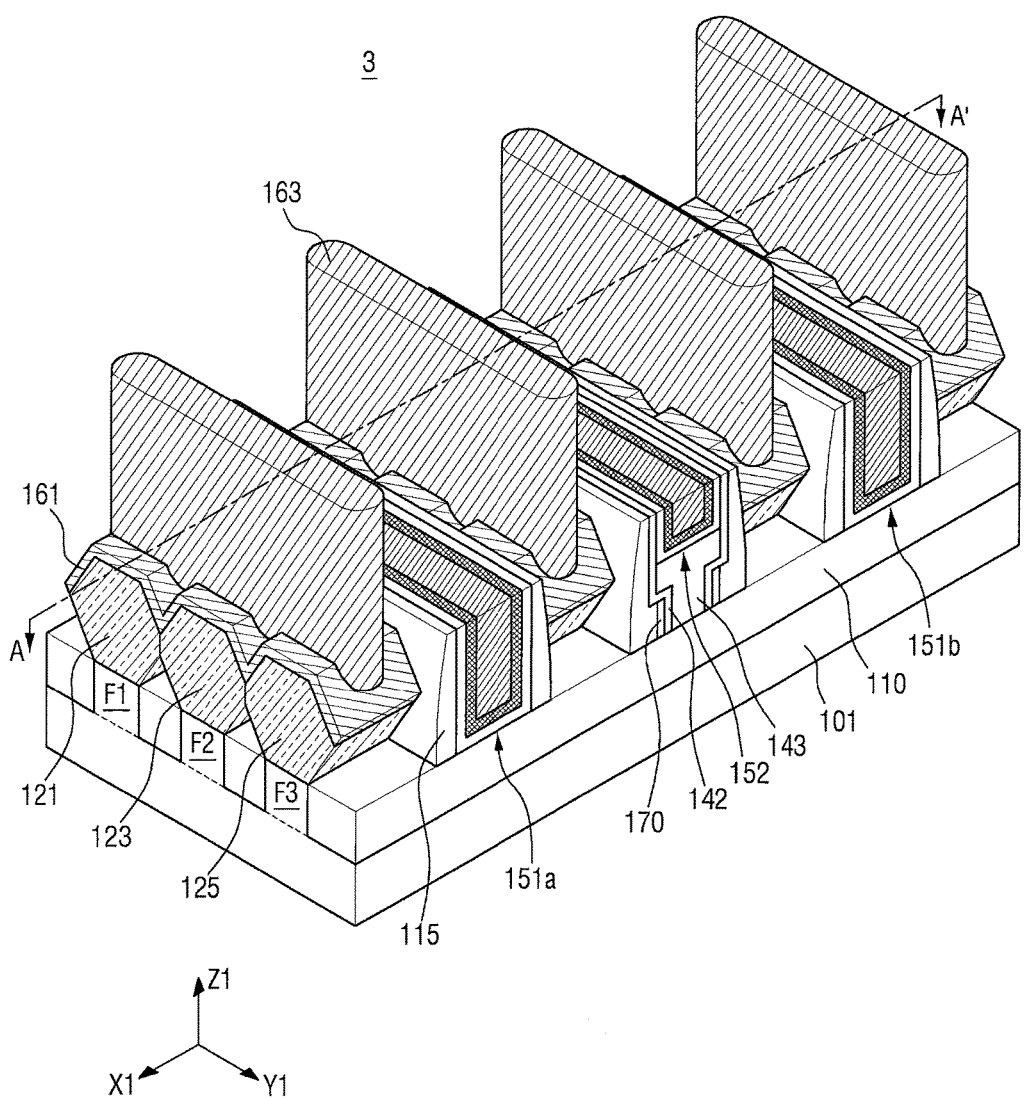
Figure 31:
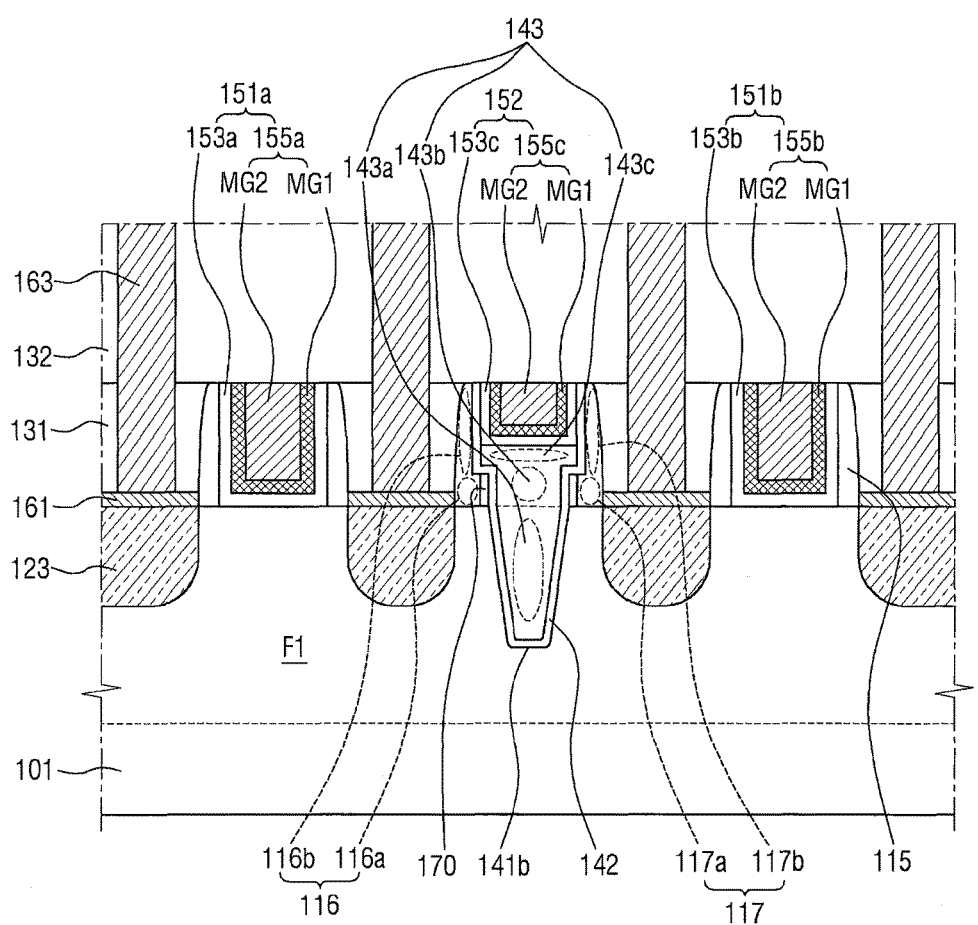

Referring to FIGS. 30 to 31, the first and third sacrificial gate electrodes 112a and 112c and the first and third sacrificial gate insulating layers 111a and 111c may be substituted with the first and second gate structures 151a and 151b according to the process steps of the method for manufacturing a semiconductor device discussed above with reference to FIGS. 19 and 20, and the dummy gate structure 152 may be formed on the first device isolation layer 143. Subsequently, the second interlayer insulating layer 132 may be formed and the silicide layer 161 and the contact 163 may be formed, thereby manufacturing a semiconductor device 2 according to the method of some embodiments.

Method for manufacturing a semiconductor device according to some embodiments of the present inventive concept will now be discussed with reference to FIGS. 32 to 44.

FIGS. 32 to 44 are cross-sections and perspective views illustrating processing steps in the fabrication of semiconductor devices according to some embodiments of the present inventive concept.

The method for manufacturing a semiconductor device according to some embodiments is substantially similar to the method for manufacturing a semiconductor device discussed above with reference to FIGS. 1 to 24 except that the former further includes forming a capping layer. Therefore, like reference numerals are used to designate identical elements, and duplicated descriptions thereof will be omitted in the interest of brevity.

The process step of the method for manufacturing a semiconductor device discussed with reference to FIG. 32 may be performed after the process step of the method for manufacturing a semiconductor device discussed above with reference to FIG. 9.

Figure 32:
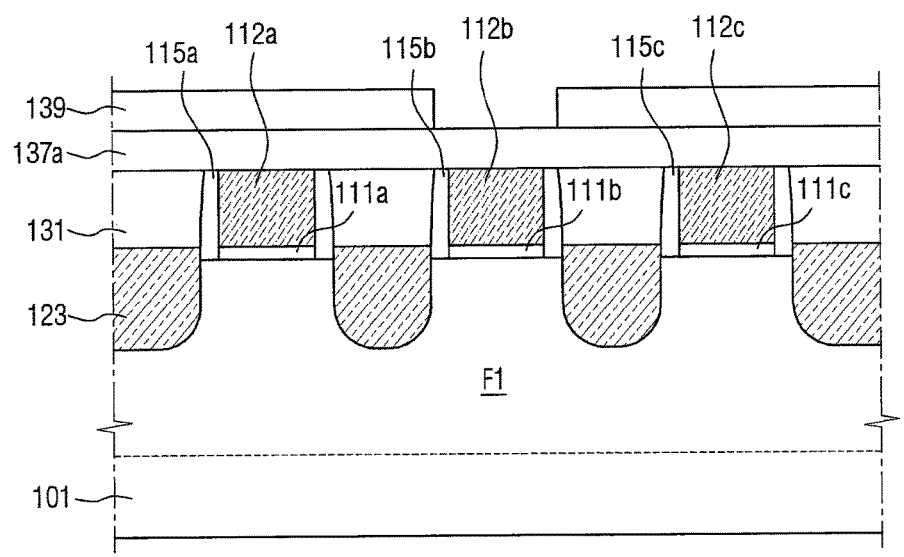
FIGS. 32 to 44 are cross-sections and perspective views illustrating processing steps in the fabrication of semiconductor devices according to some embodiments of the present inventive concept.

Referring to FIG. 32, the first etching mask layer 137a may be formed on the resultant structure shown in FIG. 9, and a second etching mask pattern 139 may be formed on the first etching mask layer 137a. A plurality of etching mask layers may be formed so as to perform an etching process in a more precise and accurate manner.

To form the second etching mask pattern 139, the second etching mask layer may be formed, a photoresist pattern may be formed on the second etching mask layer, and the second etching mask layer may be patterned by using the photoresist pattern. The second etching mask layer may be patterned to form the second etching mask pattern 139.

Figure 33:
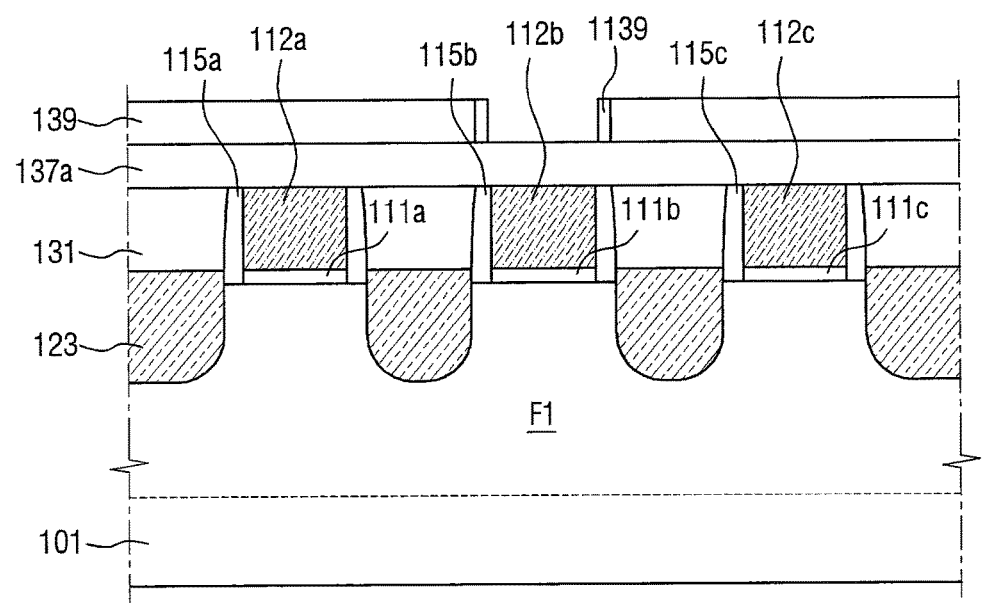

As illustrated in FIG. 33, after the formation of the second etching mask pattern 139, a first mask spacer 1139 may be formed on a sidewall of the second etching mask pattern 139. The first mask spacer 1139 may serve to reduce the likelihood, or possibly prevent, the second etching mask pattern 139 from being collapsed during patterning of the first etching mask layer 137a.

Figure 34:
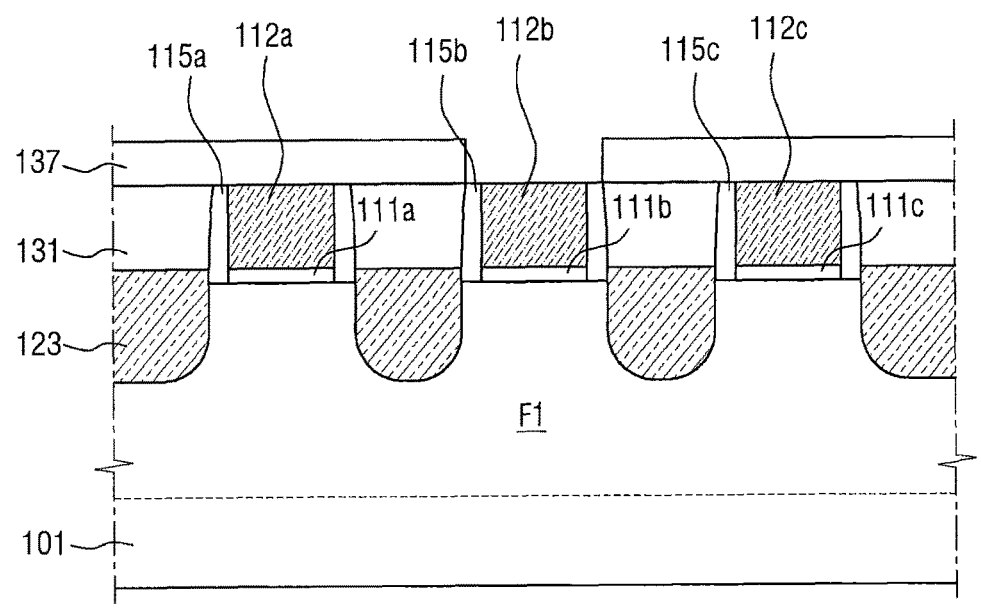

Subsequently, as illustrated in FIG. 34, the first etching mask layer 137a may be patterned using the second etching mask pattern 139. When the first etching mask pattern 137 is formed, the second hard mask layer 113b may be exposed. Subsequently, the second etching mask pattern 139 on the first etching mask pattern 137 may be removed.

Figure 35:
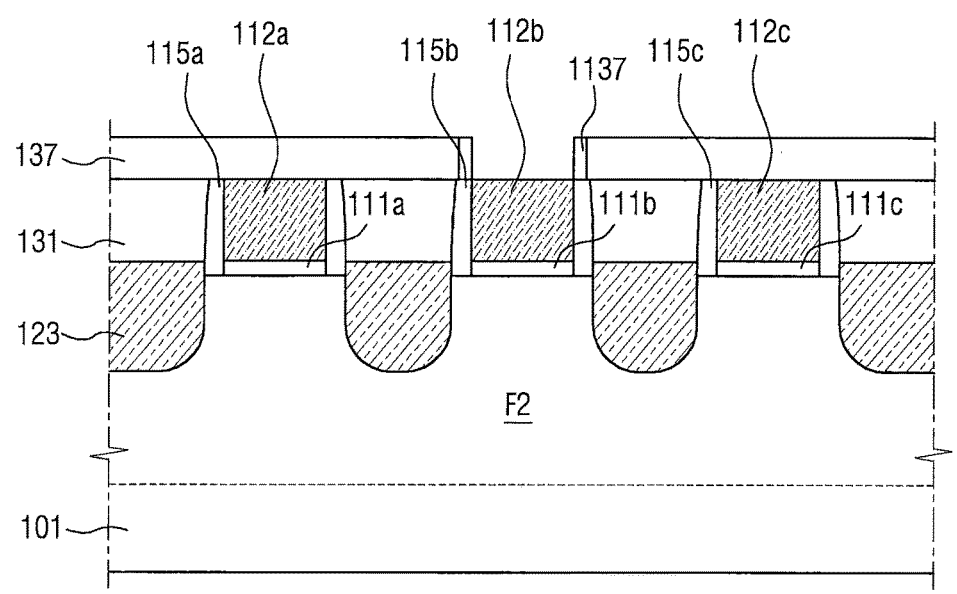

As illustrated in FIG. 35, after the formation of the first etching mask pattern 137, a second mask spacer 1137 may be formed on a sidewall of the first etching mask pattern 137. The second mask spacer 1137 may serve to reduce the likelihood, or possibly prevent, the first etching mask pattern 137 from being collapsed during a subsequent process.

Figure 36:
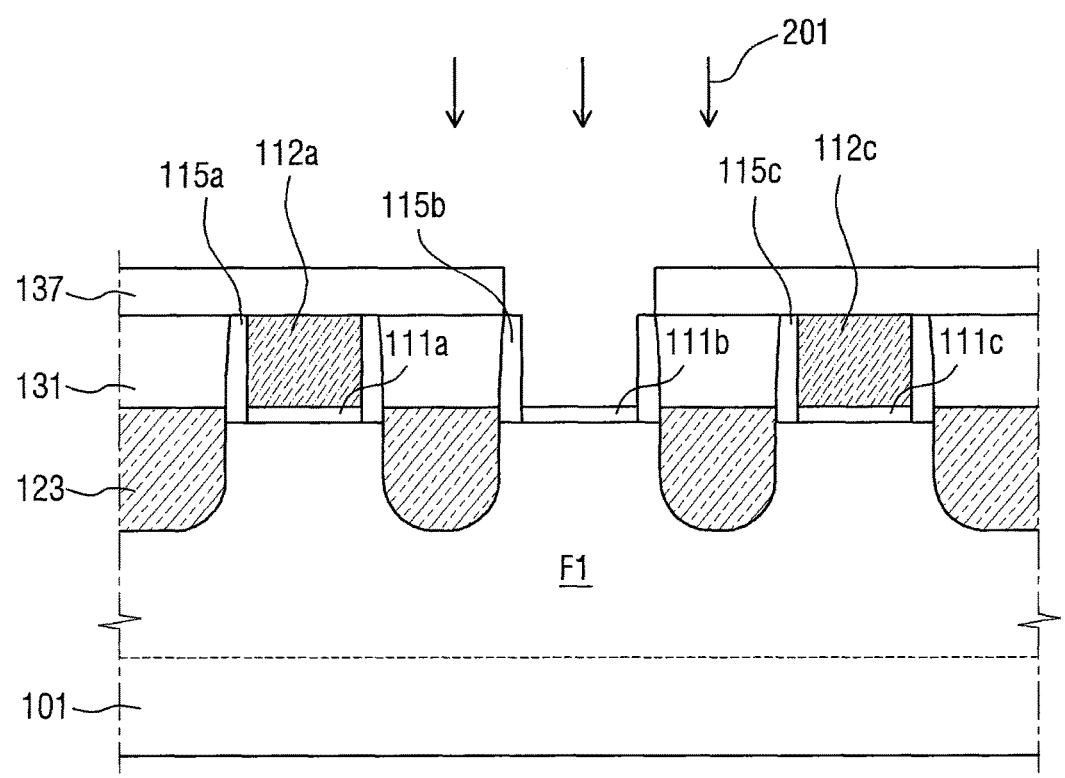

Referring to FIG. 36, the second hard mask layer 113b and the second sacrificial gate structure 111b may be sequentially removed by using the first etching mask pattern 137.

The exposed second hard mask layer 113b may be removed first so as to expose an upper surface of the second sacrificial gate electrode structure 112b, and the second sacrificial gate electrode 112b may be removed through the first etching process 201. Thus, the second sacrificial gate insulating layer 111b may be exposed.

Figure 37:
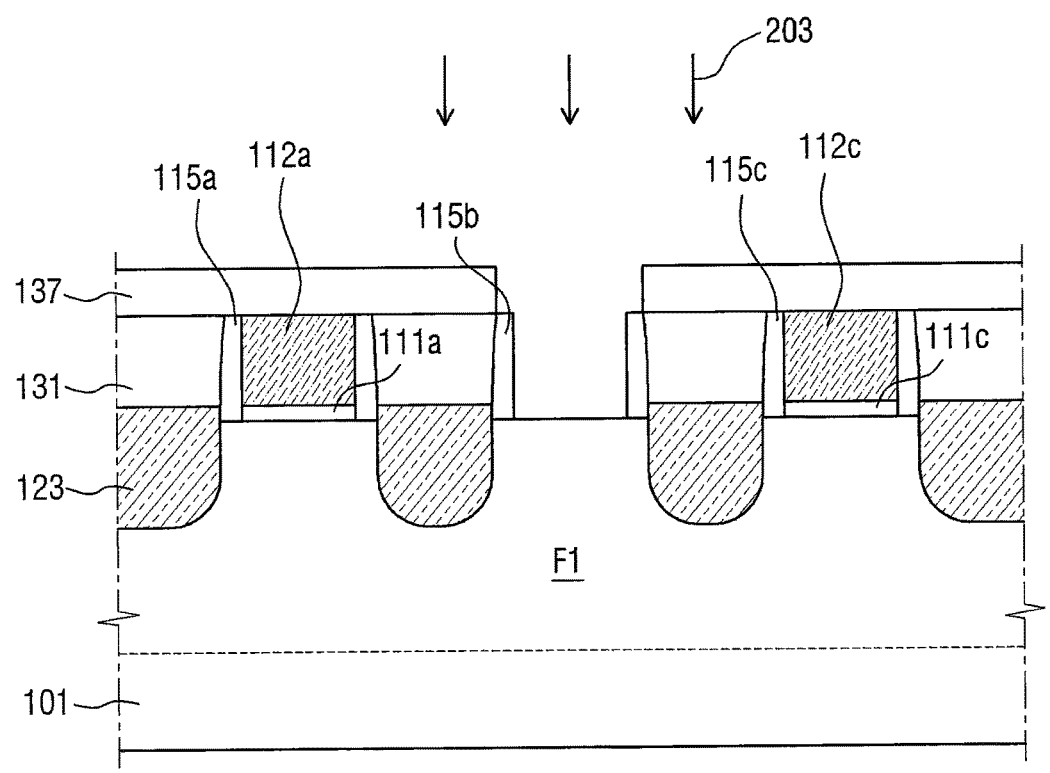

Referring to FIG. 37, the second sacrificial gate insulating layer 111b may be removed through the second etching process 203. Thus, the first to third fins F1 to F3 may be exposed.

Figure 38:
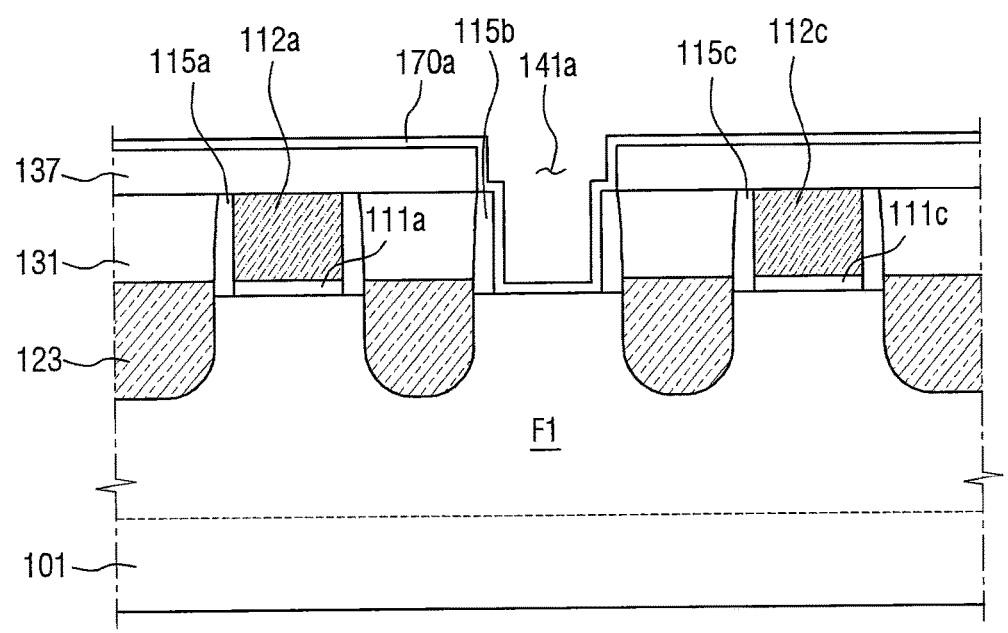
Figure 39:
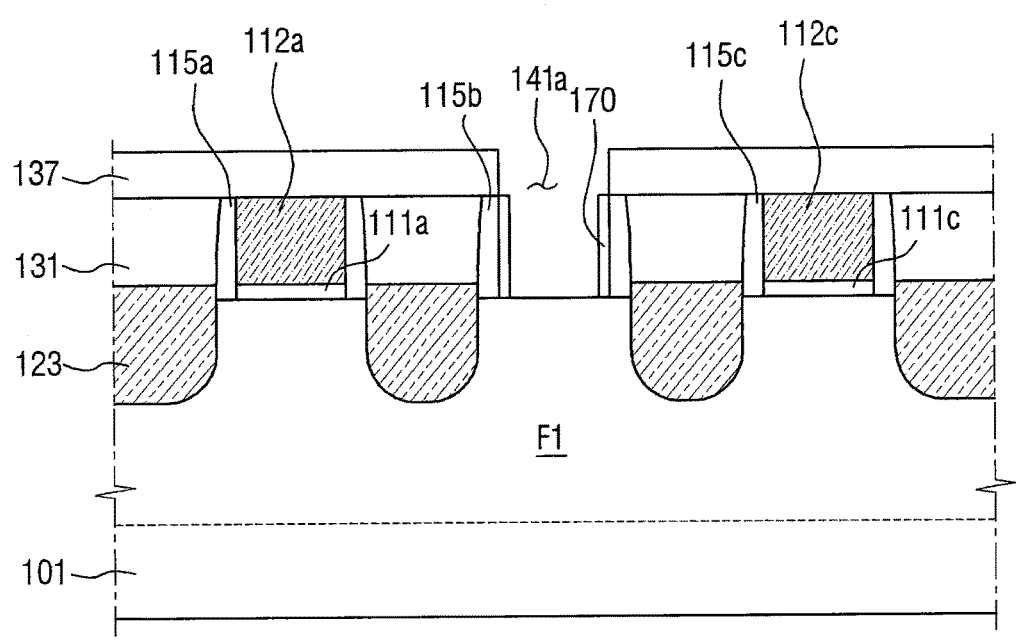

Referring to FIGS. 38 and 39, the inner spacer 170a may be formed in the first trench 141a. First, as illustrated in FIG. 38, the inner spacer 170a may be formed along the upper surface and sidewall of the first etching mask pattern 137, the upper surface and sidewall of the second spacer 115b and the upper surfaces of the first to third fins F1 to F3. Subsequently, as illustrated in FIG. 39, the inner spacer 170a may be removed except for those on the sidewall of the first etching mask pattern 137 and on the sidewall of the second spacer 115b through an etchback process or the like. Thus, the first to third fins F1 to F3 may also be exposed.

Figure 40:
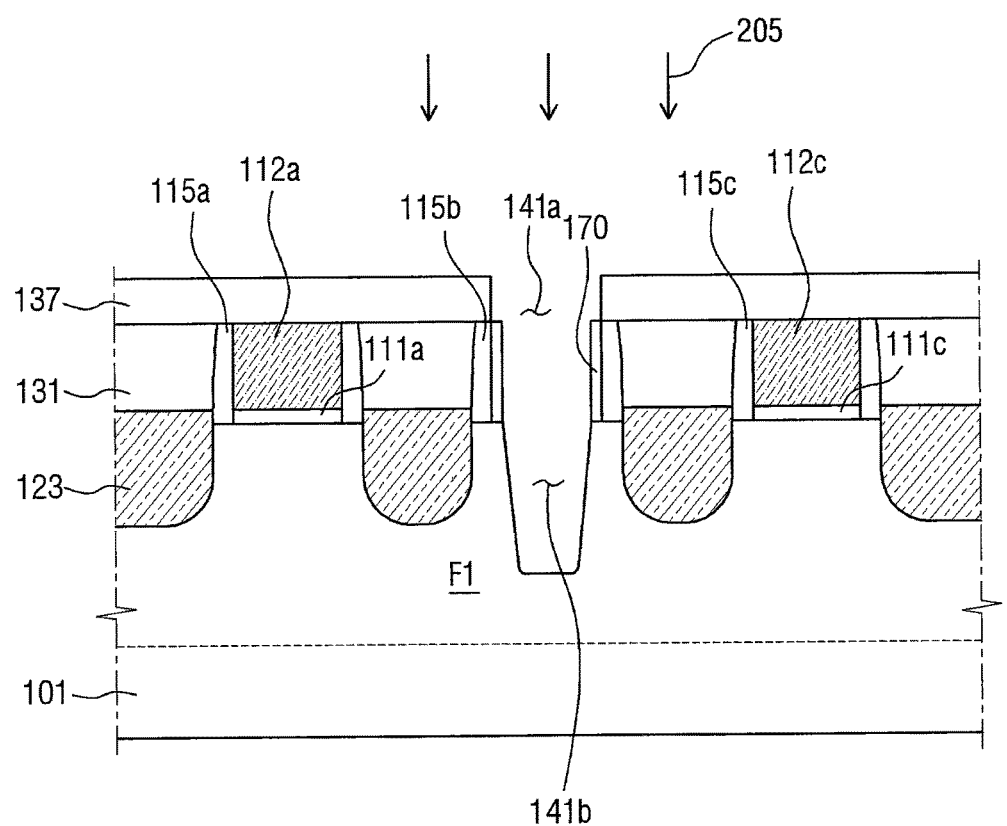

Referring to FIG. 40, the exposed first to third fins F1 to F3 may be etched through the third etching process 205 so as to form the first recess 141b. The first recess 141b may be formed by using, as an etching mask, the first etching mask pattern 137 and the inner spacer 170. The width of the inner spacer 170 may be adjusted so as to adjust the width of the first recess 141b. The first recess 141b may have a bottom surface lower than the lower surfaces of the first to third source/drain regions 121, 123 and 125.

Figure 41:
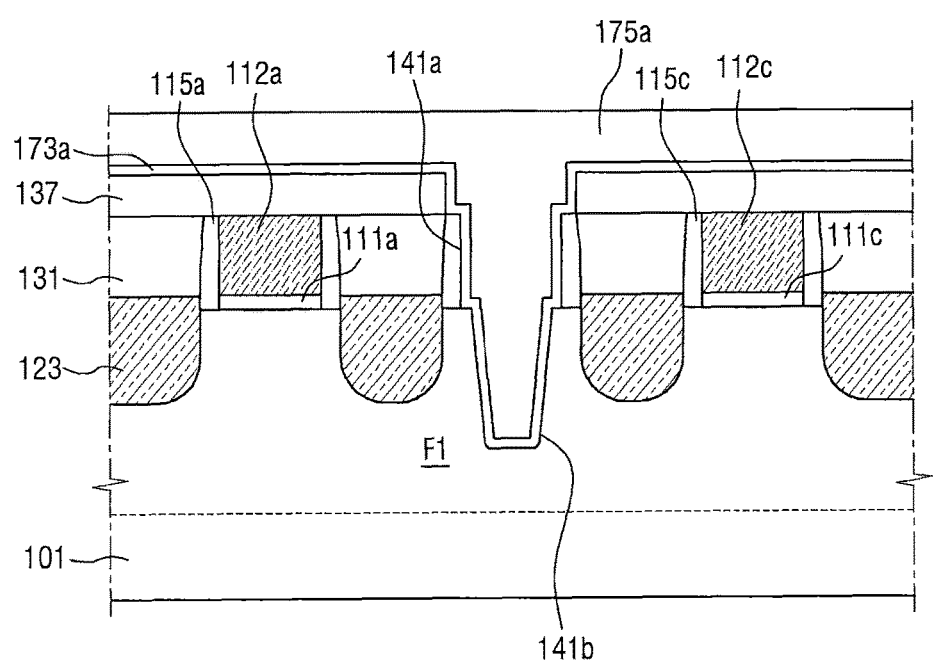

Referring to FIG. 41, the inner spacer 170 may be removed, and subsequently, a capping layer 173a and a first device isolation layer 175a may be formed. The capping layer 173a may be formed along the upper surface and sidewall of the first etching mask pattern 137, the upper surface and sidewall of the first spacer 115 and the inner surface of the first recess 141b. The first device isolation layer 175a may fill the rest of the first trench 141a and the first recess 141b.

The capping layer 173a may include, for example, at least one of an oxide layer, a nitride layer and an oxynitride layer, and the first device isolation layer 175a may also include at least one of an oxide layer, a nitride layer and an oxynitride layer.

Figure 42:
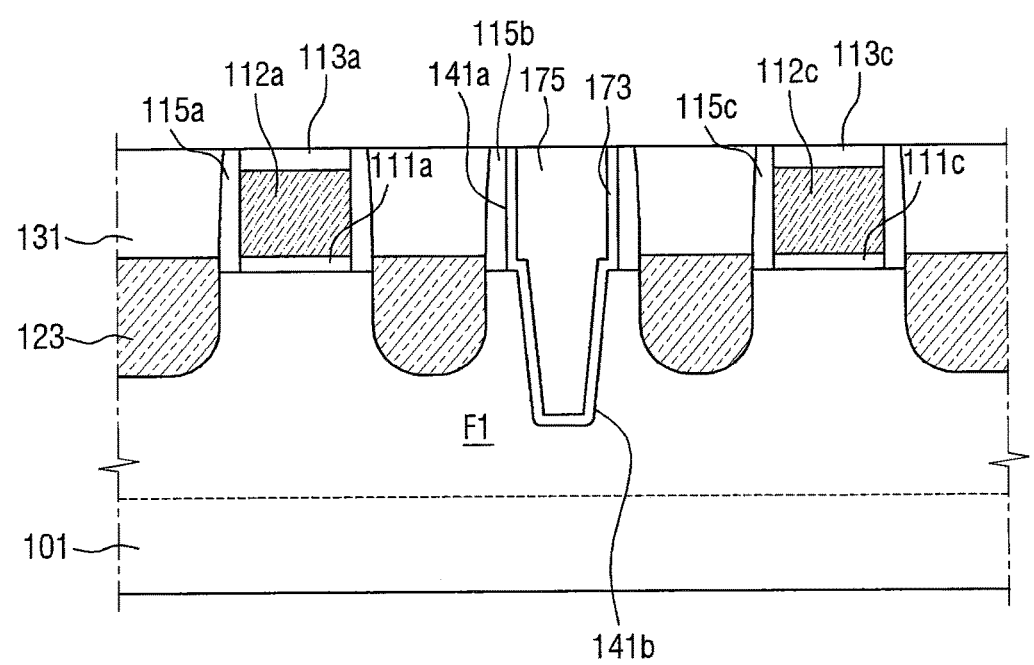

Referring to FIG. 42, the first device isolation layer 175a and the capping layer 173a may be partially removed such that the first device isolation layer 175 and the capping layer 173 may remain only in the first trench 141a and the first recess 141b. The first and third hard mask layers 113a and 113c may be exposed.

Figure 43:
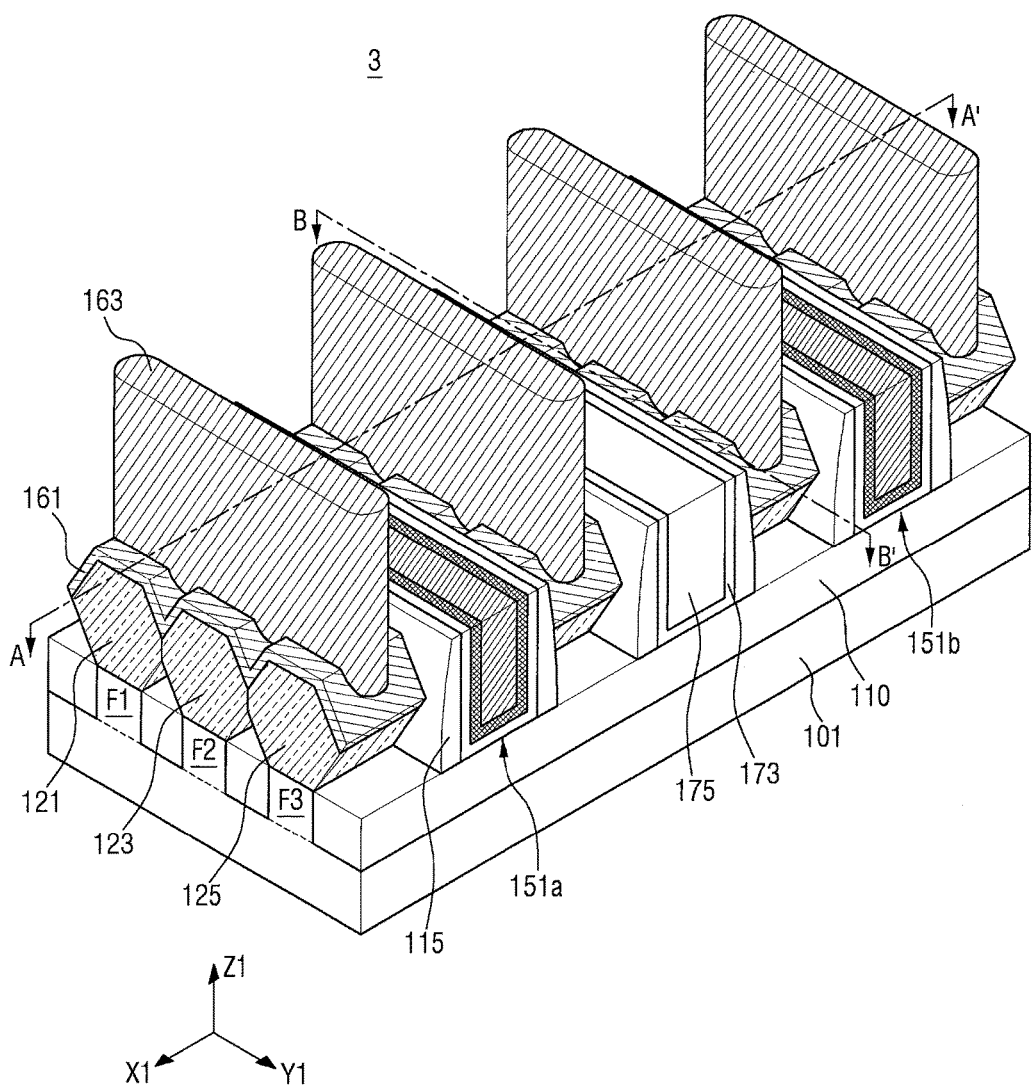
Figure 44:
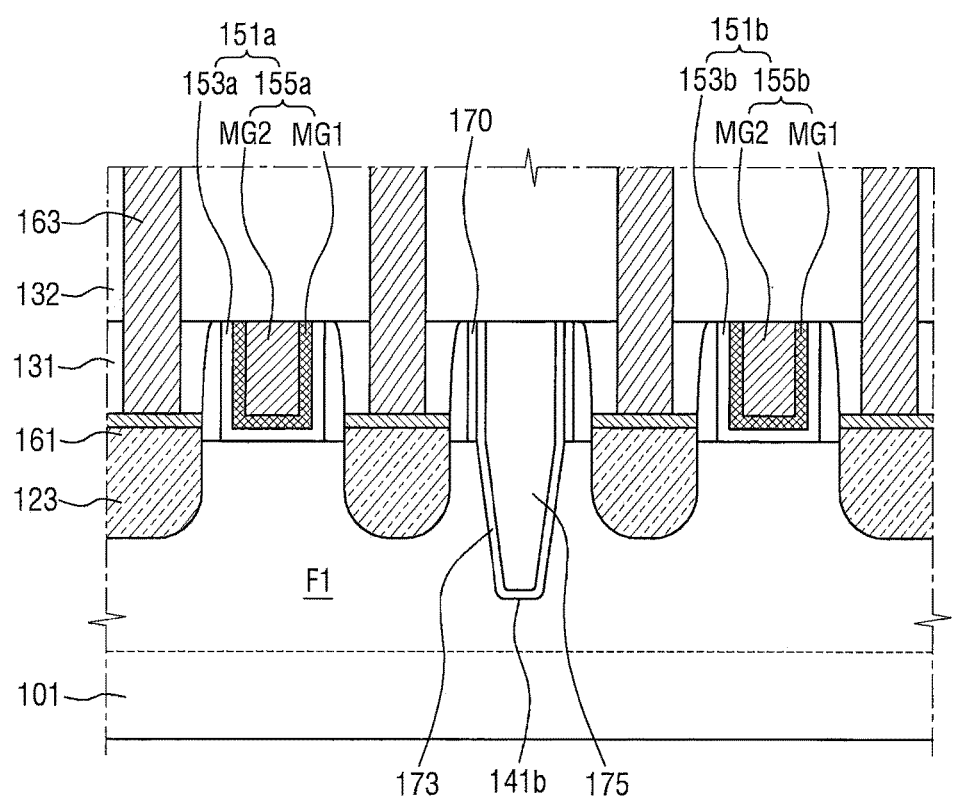

Referring to FIGS. 43 and 44, the first and third hard mask layers 113a and 113c may be removed through a planarizing process or the like. Furthermore, the first and third sacrificial gate electrodes 112a and 112c and the first and third sacrificial gate insulating layers 111a and 111 c may be substituted with the first and second gate structures 151a and 151b. The dummy gate structure may not be formed on the device isolation layer 175. Through the processes discussed above, a semiconductor device 3 according to the method of some embodiments may be manufactured.

Methods for manufacturing a semiconductor device according to some embodiments of the present inventive concept will be discussed with reference to FIGS. 45 to 49.

FIGS. 45 to 49 are cross-sections and perspective views illustrating processing steps in the fabrication of semiconductor device according to some embodiments of the present inventive concept.

The method for manufacturing a semiconductor device according to some embodiments is substantially the same as the method for manufacturing a semiconductor device discussed with reference to FIGS. 32 to 42 except that the former further includes removing a part of an inner spacer and retaining the rest of the inner spacer. Therefore, like reference numerals are used to designate identical elements, and duplicated descriptions thereof will be omitted in the interest of brevity.

The process step of the method for manufacturing a semiconductor device discussed with reference to FIG. 45 may be performed after the process step of the method for manufacturing a semiconductor device discussed with reference to FIG. 39.

Figure 45:
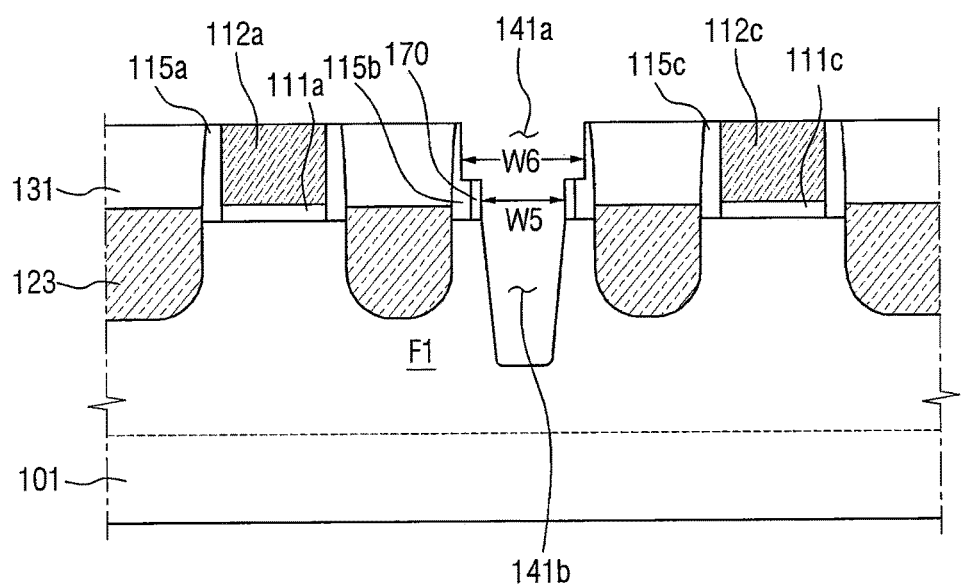
FIGS. 45 to 49 are cross-sections and perspective views illustrating processing steps in the fabrication of semiconductor devices according to some embodiments of the present inventive concept.

Referring to FIG. 45, the exposed first to third fins F1 to F3 are etched to form the first recess 141b. In this case, the second spacer 115b and the inner spacer 170 at both sides of the first trench 141a may be partially etched. Thus, the second spacer 115b may have a shape in which two Ls face each other, and the width of an upper portion of the second spacer 115b may be narrower than the width of a lower portion thereof. The inner spacer 170 may not cover the first recess 141b and may be disposed on the sidewall of the second spacer 115b. The height of the inner spacer 170 may be lower than the height of the second spacer 115b.

As the second spacer 115b and the inner spacer 170 are partially etched, the shape of the first trench 141a may change. A width W5 of the first trench 141a between parts of the inner spacer 170 may be narrower than a width W6 of the first trench 141a between parts of the second spacer 115b in which the inner spacer 170 is not disposed. The etching mask pattern 137 may be removed.

Figure 46:
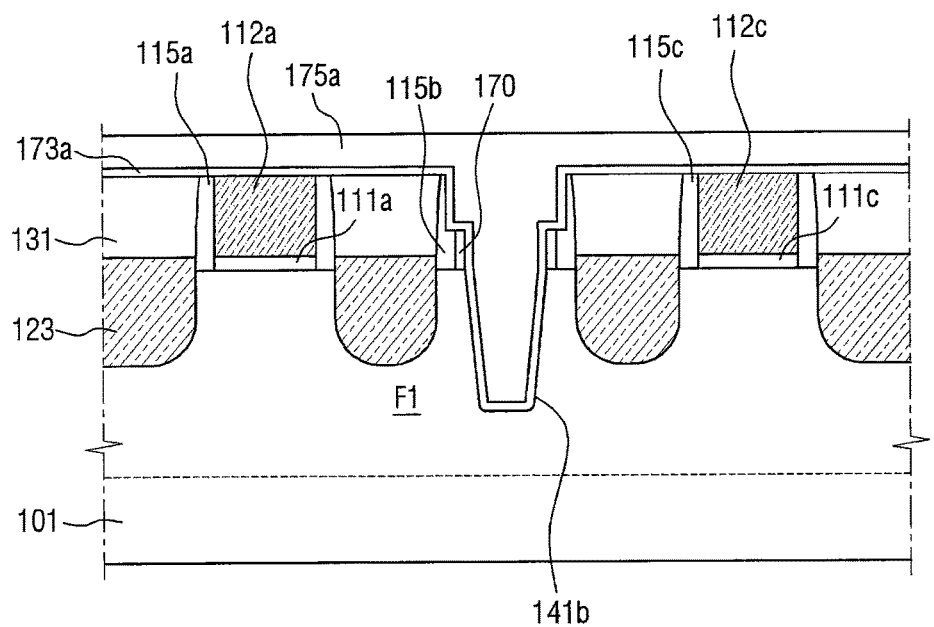

Referring to FIG. 46, the capping layer 173a and the first device isolation layer 175a may be sequentially formed in the first trench 141a and the first recess 141b.

Figure 47:
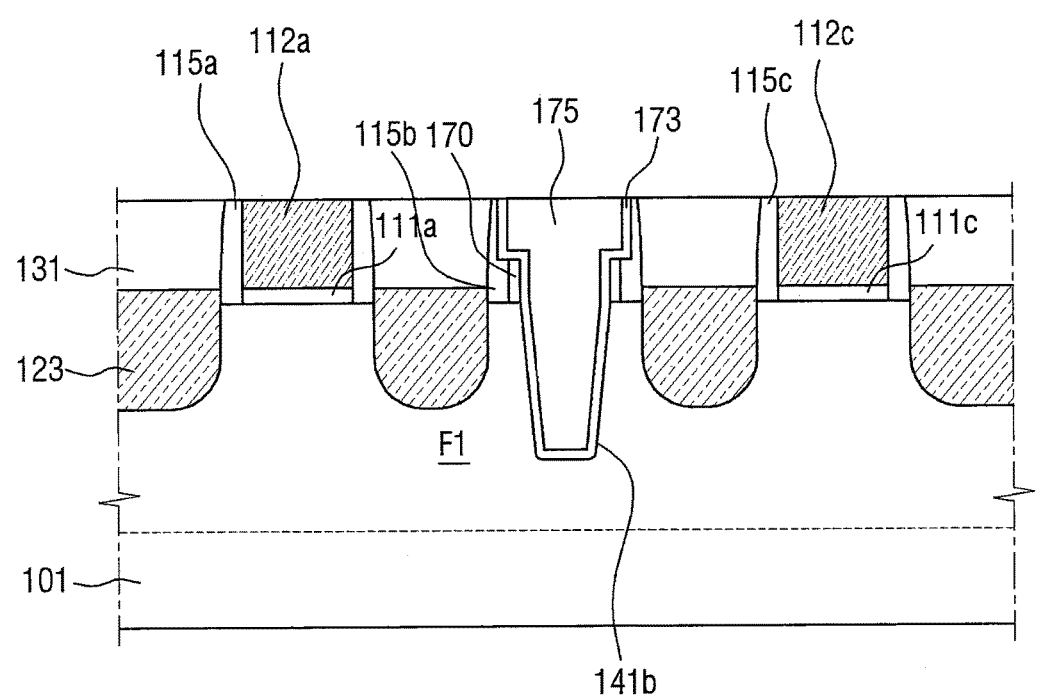

Referring to FIG. 47, the capping layer 173a and the first device isolation layer 175a may be removed to expose the first interlayer insulating layer 131 and the first and third hard mask layers 113a and 113c. The capping layer 173 and the first device isolation layer 175 may remain only in the first trench 141a and the first recess 141b.

Subsequently, the first and third hard mask layers 113a and 113c may be removed to expose the upper surface of each of the first and third sacrificial gate electrodes 112a and 112c.

Figure 48:
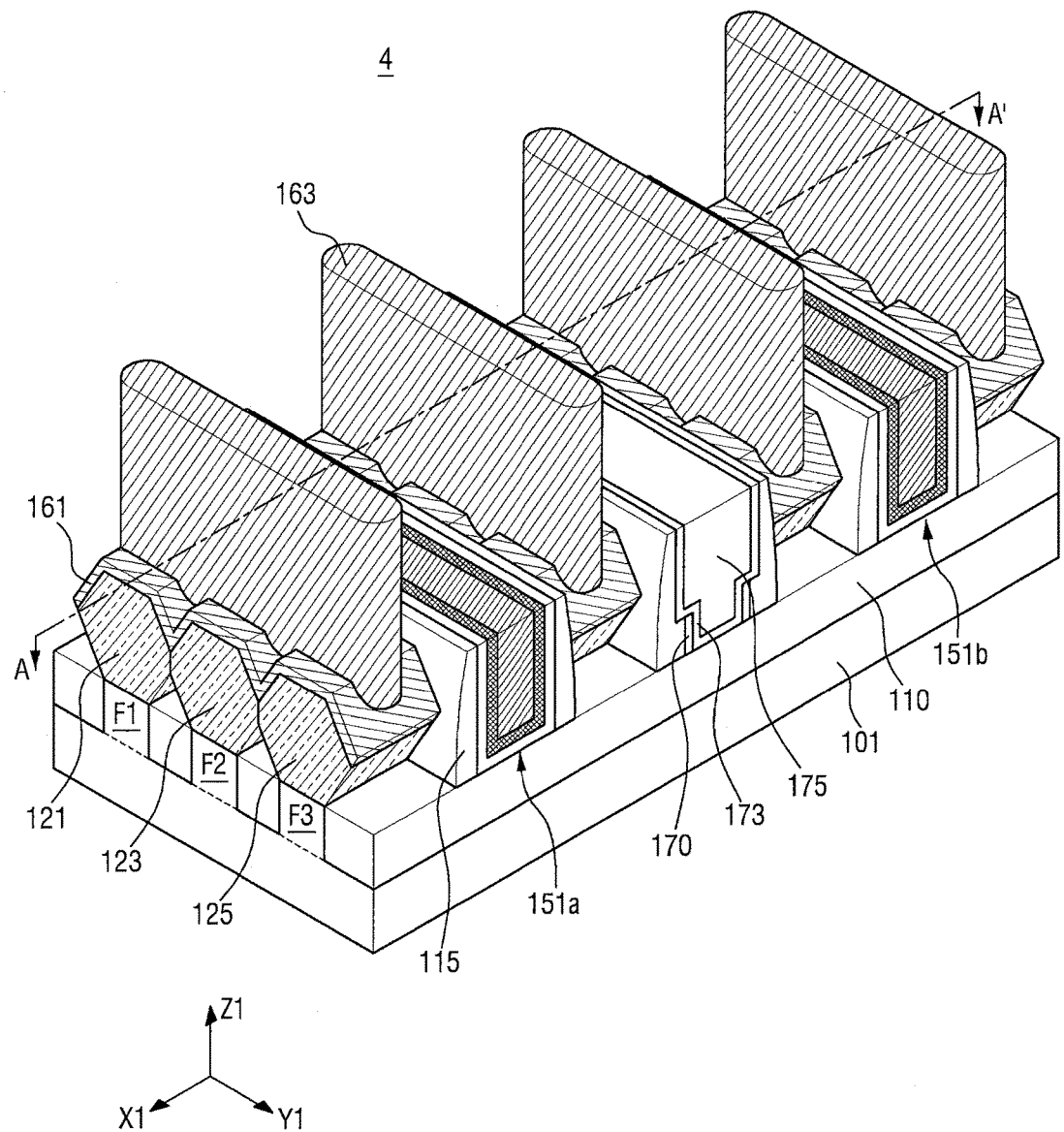
Figure 49:
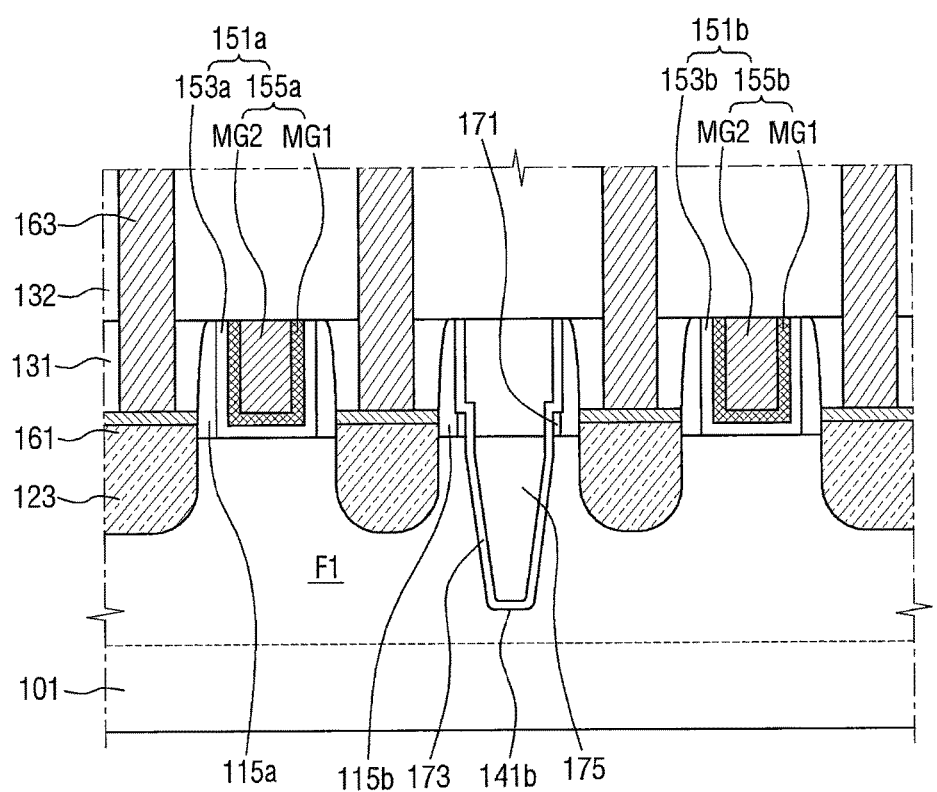

Referring to FIGS. 48 and 49, each of the first and third sacrificial gate electrodes 112a and 112c and the first and third sacrificial gate insulating layers 111a and 111 c is substituted with first and second gate structures 151a and 151b, and the second interlayer insulating layer 132, the silicide layer 161 and the contact 163 may be formed.

Through the processes discussed above, a semiconductor device 4 according to the method of some embodiments may be manufactured.

Methods for manufacturing a semiconductor device according to some embodiments of the present inventive concept will be discussed with reference to FIG. 50.

Figure 50:
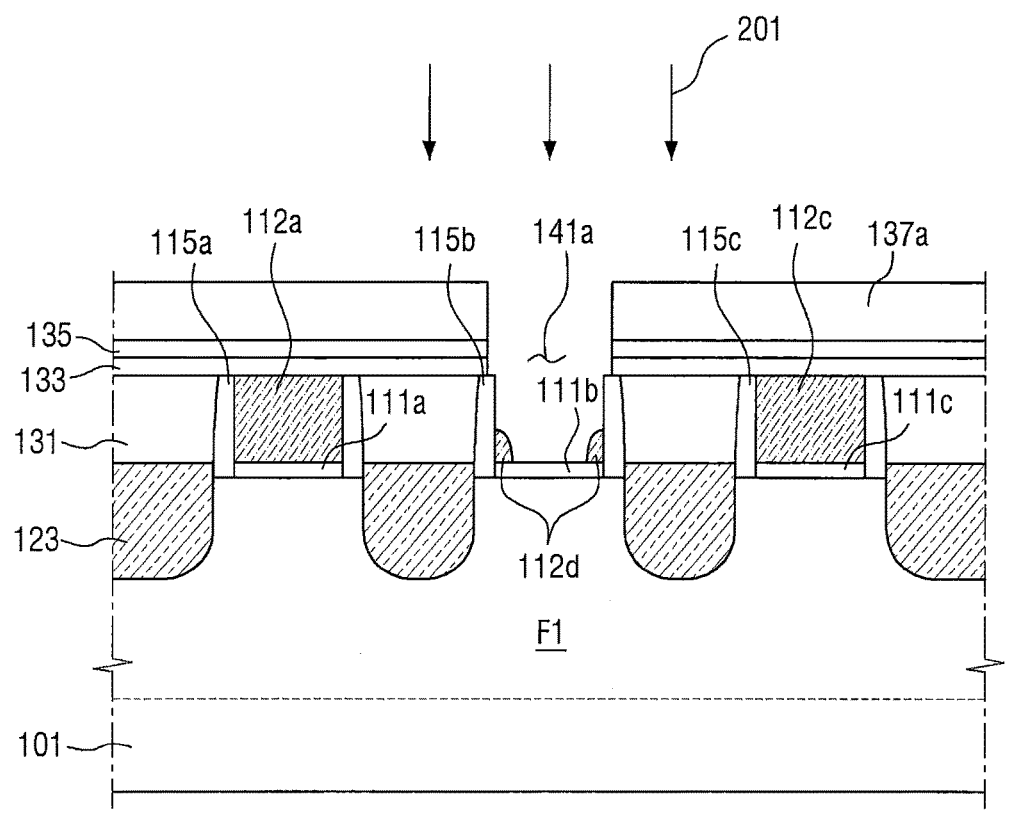
FIG. 50 is a cross-section illustrating processing steps in the fabrication of semiconductor devices according to some embodiments of the present inventive concept.

FIG. 50 is a cross-section illustrating processing steps in the fabrication of semiconductor devices according to some embodiments of the present inventive concept.

The method for manufacturing a semiconductor device according to some embodiments is substantially the same as the method for manufacturing a semiconductor device discussed with reference to FIGS. 1 to 24 except that, in the former, a residual part of the second sacrificial gate electrode may remain on the second sacrificial gate insulating layer through the first etching process. Therefore, like reference numerals are used to designate identical elements, and duplicated descriptions thereof will be omitted in the interest of brevity.

The process step of the method for manufacturing a semiconductor device discussed with reference to FIG. 50 may be performed after the process step of the method for manufacturing a semiconductor device discussed with reference to FIG. 12. The process step of the method for manufacturing a semiconductor device discussed with reference to FIG. 50 may correspond to the process step of the method for manufacturing a semiconductor device discussed with reference to FIG. 13.

Referring to FIG. 50, the second sacrificial gate electrode 112b may be partially removed through the first etching process 201 to form a residual part 112d. The second sacrificial gate electrode 112b may be partially removed to form the first trench 141a.

The residual part 112d may be disposed on the sidewall of the second spacer 115b. The residual part 112d may be disposed on the second sacrificial gate insulating layer 111b. Thus, a part of the upper surface of the second sacrificial gate insulating layer 111b may be exposed to the bottom surface of the first trench 141a. The residual part 112d is a part of the second sacrificial gate electrode 112b, and thus the residual part 112d may be made of a material same as that of the second sacrificial gate electrode 112b.

In some embodiments, the first etching process 201 may be, for example, an anisotropic etching process using reactive ion etching. However, it will be understood that embodiments of the present inventive concept are not limited to this configuration.

Referring again to FIG. 50, the residual part 112d may be removed together with the second sacrificial gate insulating layer 111b through the second etching process 203. In some embodiments, the second etching process 203 may be a wet etching process.

In some embodiments, when the residual part 112d remains on the second sacrificial gate insulating layer 111b after the first etching process 201, the second sacrificial gate insulating layer 111b and the residual part 112d may be removed together through the second etching process 203 which is a wet etching process, thereby improving process reliability.

Meanwhile, the residual part 112d may be removed through a separate wet etching process different from the second etching process 203. In other words, the residual part 112d may be removed through a wet etching process different from the first and second etching processes 201 and 203, and the second sacrificial gate insulating layer 111b may be removed through the second etching process 203.

Methods for manufacturing a semiconductor device according to some embodiments of the present inventive concept will be discussed with reference to FIGS. 51 and 52.

Figure 51:
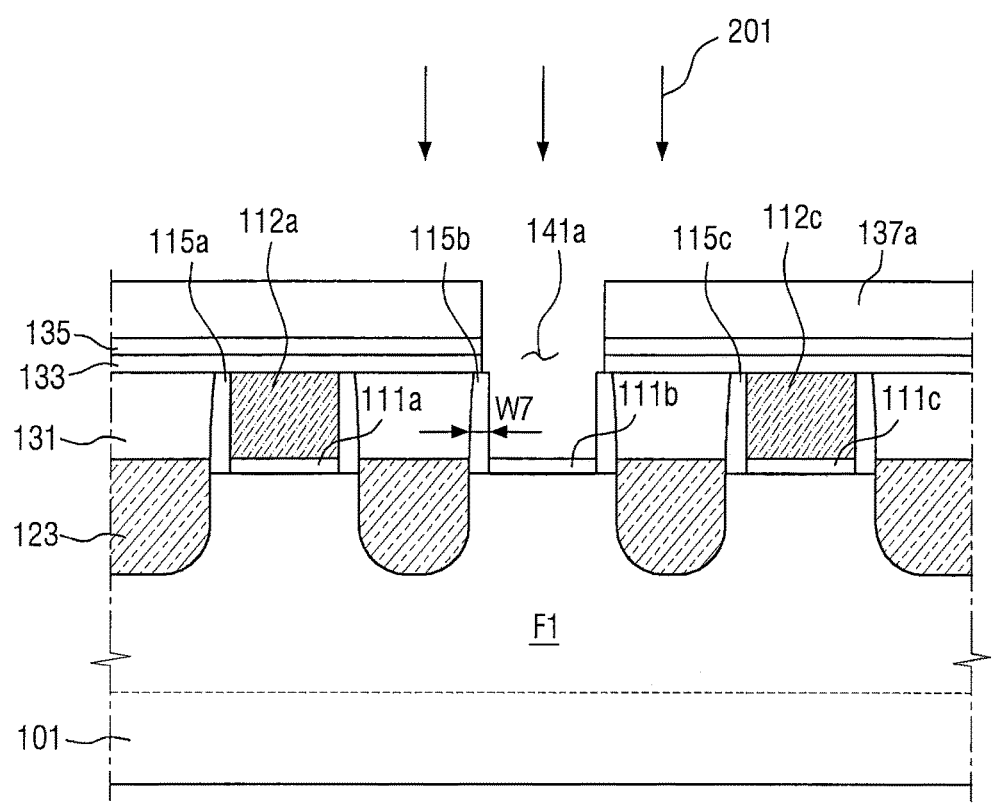
FIGS. 51 and 52 are cross-sections illustrating processing steps in the fabrication of semiconductor devices according to some embodiments of the present inventive concept.
Figure 52:
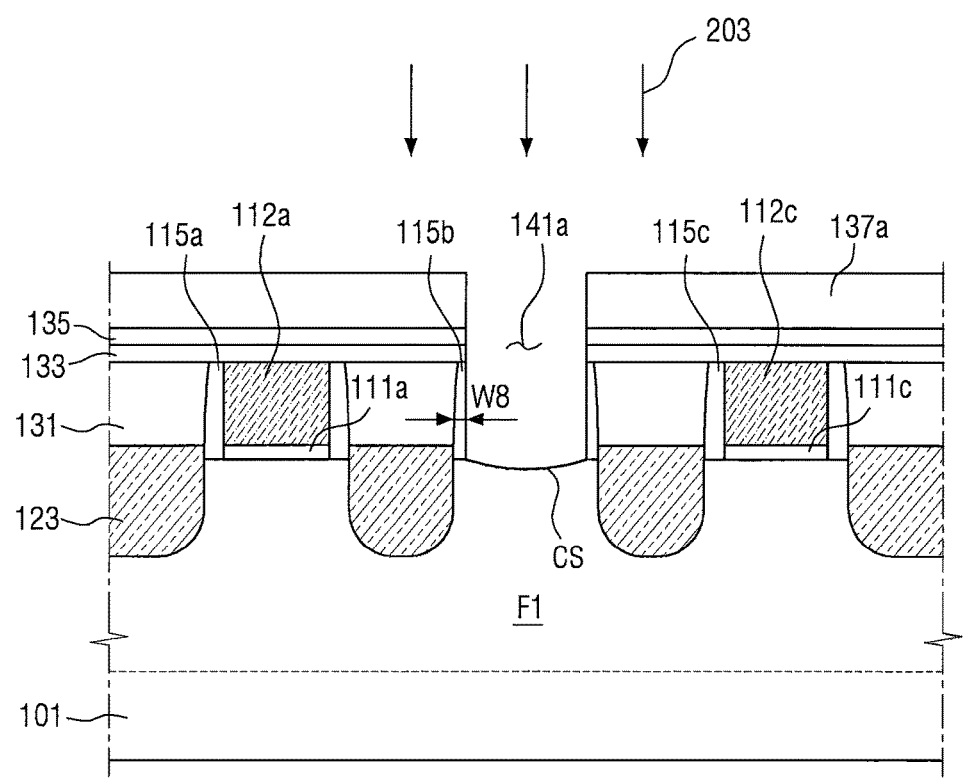

FIGS. 51 and 52 are cross-sections illustrating processing steps in the fabrication of semiconductor devices according to some embodiments of the present inventive concept.

The method for manufacturing a semiconductor device according to some embodiments is substantially the same as the method for manufacturing a semiconductor device discussed with reference to FIGS. 1 to 24 except that, in the former, the second spacer and the fins may be partially removed through the second etching process. Therefore, like reference numerals are used to designate identical elements, and duplicated descriptions thereof will be omitted in the interest of brevity.

The process step of the method for manufacturing a semiconductor device discussed with reference to FIG. 51 may correspond to the process step of the method for manufacturing a semiconductor device discussed with reference to FIG. 13.

Referring to FIG. 51, the second sacrificial gate electrode 112b may be removed to form the first trench 141a. The second sacrificial gate insulating layer 111b may be exposed to the bottom surface of the first trench 141a. The second sacrificial gate electrode 112b may be removed through the first etching process 201.

The second spacer 115b may be exposed through the first trench 141a, and the second spacer 115b may have a seventh width W7.

Referring to FIG. 52, the second sacrificial gate insulating layer 111b may be removed to expose the first to third fins F1 to F3. The second sacrificial gate insulating layer 111b exposed through the first etching process 201 may be removed through the second etching process 203. The second etching process 203 may be different from the first etching process 201.

In some embodiments, the second etching process 203 may be a wet etching process. The second etching process 203 may be an isotropic etching process. However, it will be understood that embodiments of the present inventive concept are not limited to this configuration.

The second spacer 115b may have an eighth thickness W8 through the second etching process 203. The eighth thickness W8 may be thinner than the seventh width W7 of FIG. 51. In other words, the thickness of the second spacer 115b may become thinner after the second etching process 203.

As illustrated, the thickness of the second spacer 115b may be thinner than those of the first and third spacers 115a and 115c at the same height on the substrate 101.

Furthermore, the first to third fins F1 to F3 may be partially removed simultaneously with or separately from the change in the thickness of the second spacer 115b. In other words, the first to third fins F1 to F3 may be partially removed simultaneously with the removal of the second sacrificial gate insulating layer 111b through the second etching process 203, thereby forming concave surfaces CSs in the upper surfaces of the first to third fins F1 to F3. However, it will be understood that embodiments of the present inventive concept are not limited to this configuration.

In some embodiments, a first device isolation layer may be formed instead of a dummy gate electrode in the first trench 141a.

Methods for manufacturing a semiconductor device according to some embodiments of the present inventive concept will be discussed with reference to FIGS. 53 to 58.

FIGS. 53 to 58 are cross-sections illustrating methods for manufacturing a semiconductor device according to some embodiments of the present inventive concept. The method for manufacturing a semiconductor device according to some embodiments is substantially the same as the method for manufacturing a semiconductor device discussed with reference to FIGS. 1 to 24 except that, in the former, processes are performed in two different regions. Therefore, like reference numerals are used to designate identical elements, and duplicated descriptions thereof will be omitted in the interest of brevity.

Figure 53:
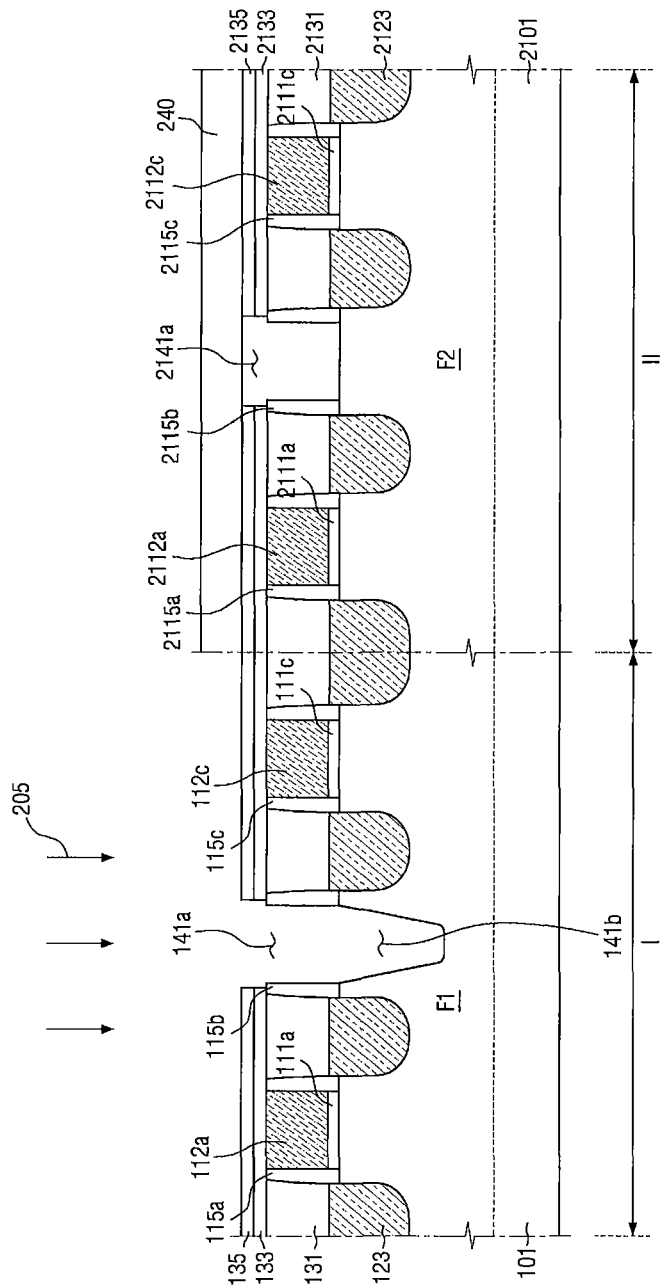
FIGS. 53 to 58 are cross-sections illustrating processing steps in the fabrication of semiconductor devices according to some embodiments of the present inventive concept.

Referring to FIG. 53, the substrate 101 may include a first area I and a second area II. Although the first area I and the second area II are depicted as being interconnected, it is merely an exemplary arrangement for description of the present inventive concept, and the present disclosure is not limited thereto. In other words, the first area I and the second area II may be spaced apart from each other.

The process of manufacturing a semiconductor device discussed with reference to FIGS. 1 to 15 may be performed in the first area I. The process discussed with reference to FIGS. 1 to 14 may be performed in the second area II without departing from the inventive concept.

A fourth source/drain region 2123, a second interlayer insulating layer 2131, fourth to sixth spacers 2115a, 2115b and 2115c, a second passivation layer 2133, a second insulating layer 2135, fourth and sixth sacrificial gate insulating layers 2111a and 2111c and fourth and sixth sacrificial gate electrodes 2112a and 2112c in the second area II may have substantially the same configuration as that of the first source/drain region 123, the first interlayer insulating layer 131, the first to third spacers 115a, 115b and 115c, the passivation layer 133, the first insulating layer 135, the first and third sacrificial gate insulating layers 111a and 111c and the first and third sacrificial gate electrodes 112a and 112c in the first area I, respectively. Therefore, duplicated descriptions will be omitted in the interest of brevity.

Referring again to FIG. 53, the second etching process 205 may be performed in the first area I so as to form the first recess 141b. A second mask pattern 240 may be disposed in the second area II. However, it will be understood that embodiments of the present inventive concept are not limited to this configuration. The second mask pattern 240 may be nitride, oxide or oxynitride. However, it will be understood that embodiments of the present inventive concept are not limited to this configuration. For example, the second mask pattern 240 may include a material which is not etched by the second etching process 205 without departing from the scope of the present inventive concept.

Figure 54:
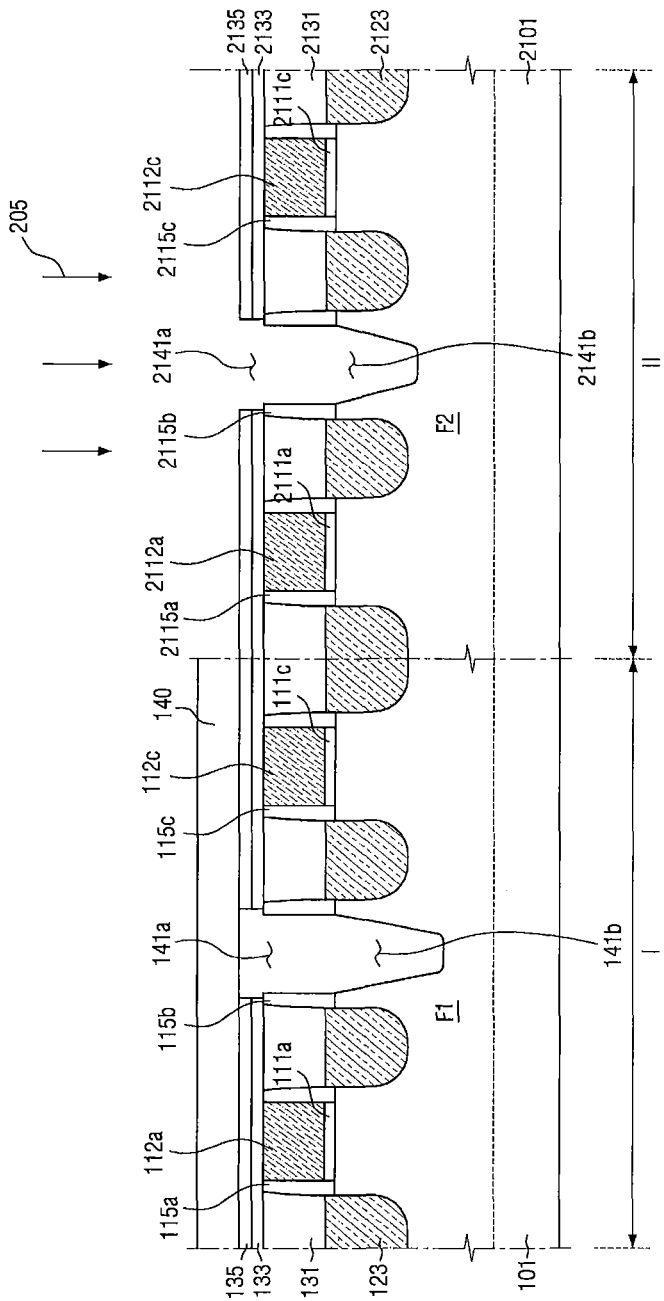

Referring to FIG. 54, the second etching process 205 may be performed in the second area II so as to form a second recess 2141b. The second recess 2141b may be formed beneath a second trench 2141a. The process corresponding to the process discussed with reference to FIGS. 17 to 24 may be performed after the formation of the first and second recesses 141b and 2141b so as to manufacture a semiconductor device.

Figure 55:
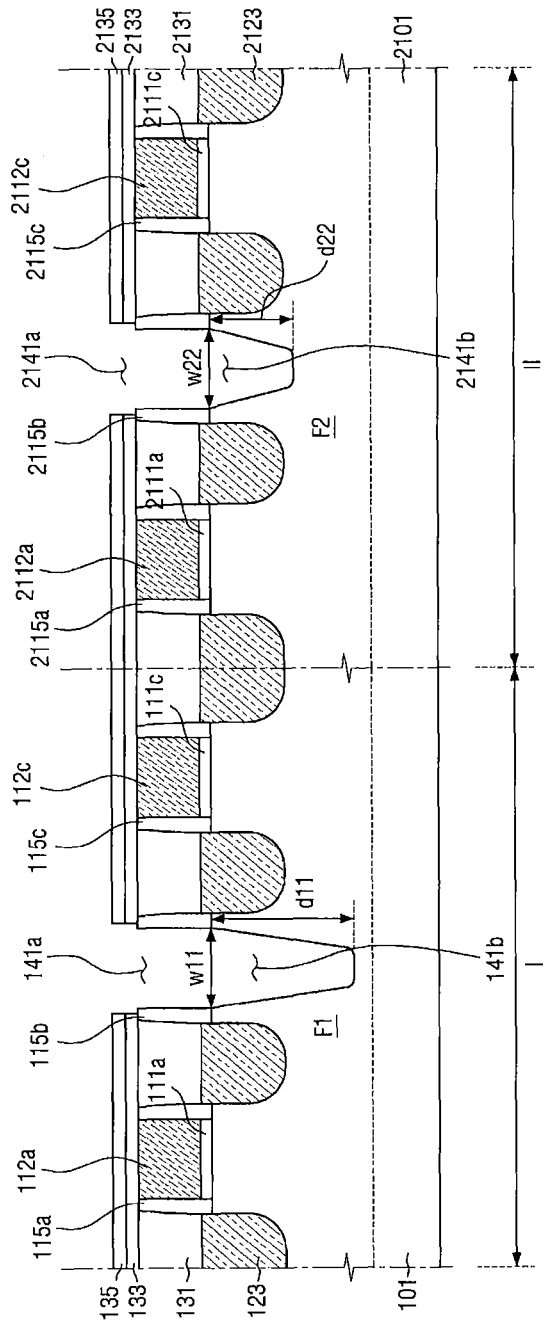

Referring to FIG. 55, recesses having different depths may be formed through the process steps discussed above with reference to FIGS. 53 and 54.

In other words, the first recess 141b may have a first recess width w11 and a first recess depth d11, and the second recess 2141b may have a second recess width w22 and a second recess depth d22. The first recess width w11 and the second recess width w22 may be the same. However, it will be understood that embodiments of the present inventive concept are not limited to this configuration. The first recess depth d11 may be deeper than the second recess depth d22. However, it will be understood that embodiments of the present inventive concept are not limited to this configuration.

In some embodiments, since a plurality of trenches and recesses may be performed through an etching processes including a plurality of steps, the trenches and recesses having different widths and depths may be formed on the fin. In other words, according to the present inventive concept, since the trenches and recesses may be formed through the etching process including at least three steps rather than a single-step etching process, the recesses formed through the etching process may have various widths and depths.

Figure 56:
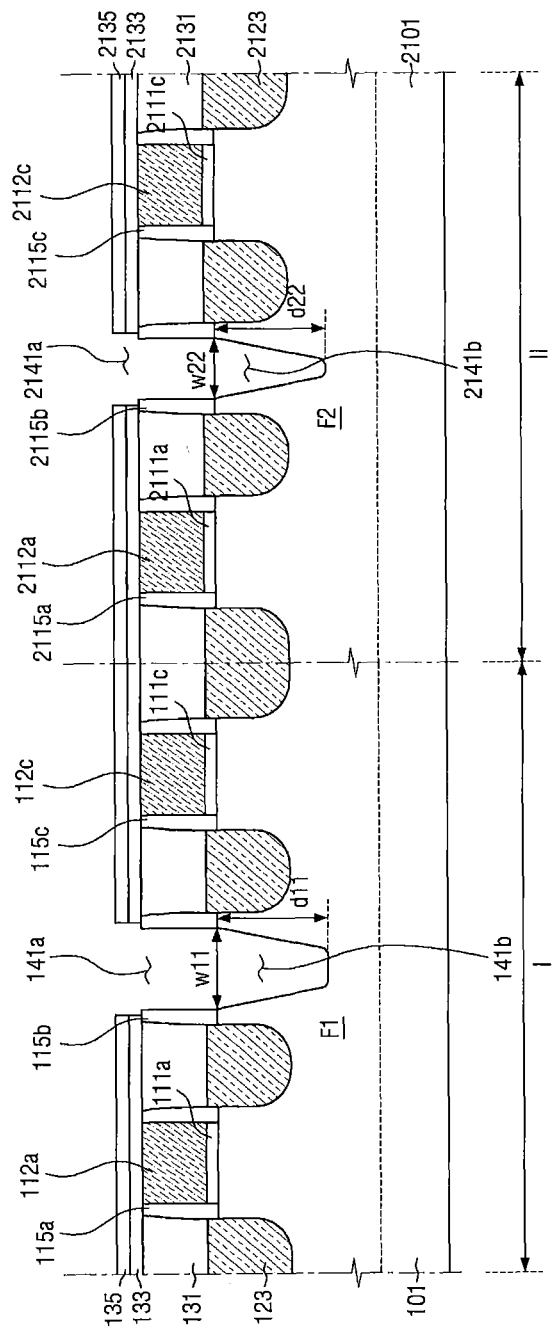
Figure 57:
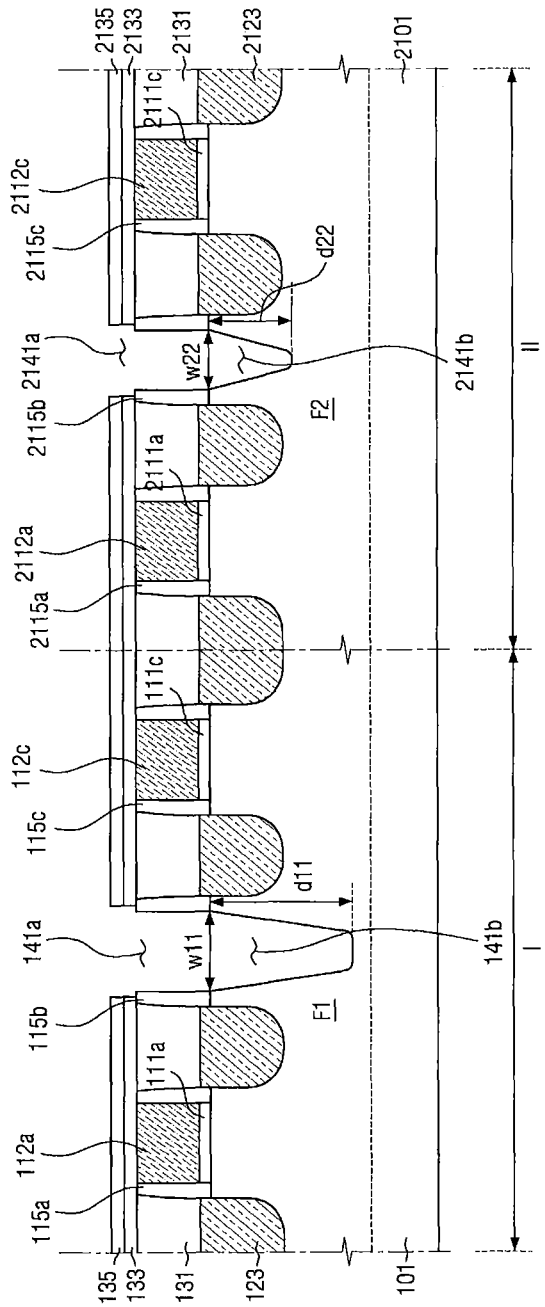
Figure 58:
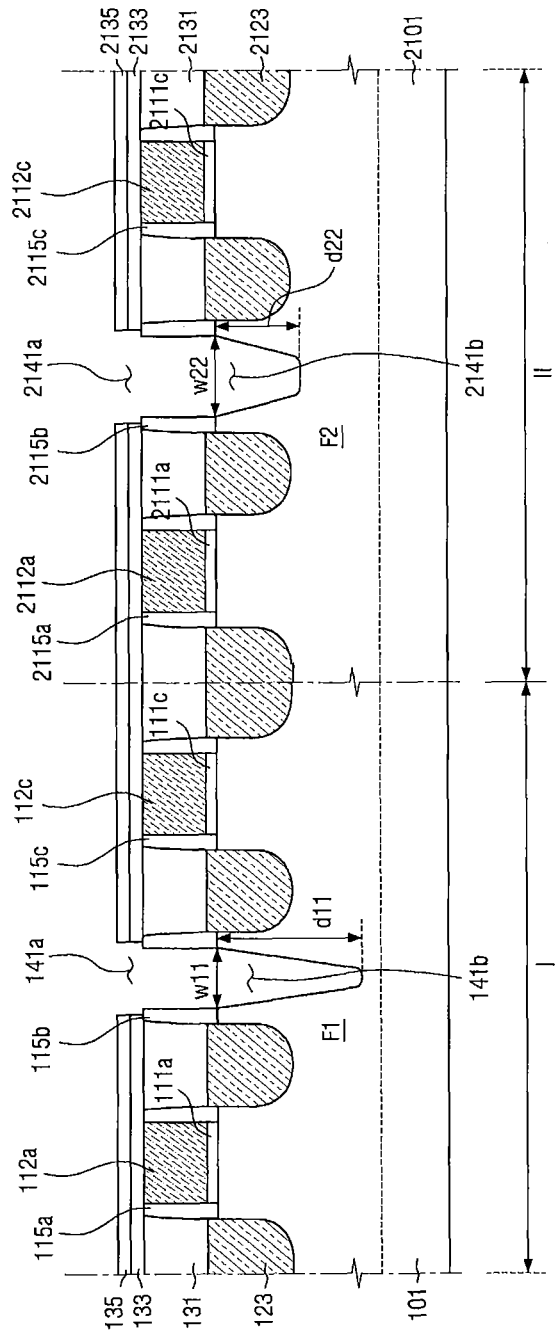

Referring to FIGS. 56 to 58, trenches and recesses having different widths and/or depths may be formed in different areas.

Referring to FIG. 56, the first recess depth d11 and the second recess depth d22 may be the same, but the first recess width w11 and the second recess width w22 may be different from each other. In other words, the second recess width w22 may be wider than the first recess width w11.

Referring to FIG. 57, the first recess depth d11 may be deeper than the second recess depth d22, and the first recess width w11 may be wider than the second recess width w22.

Referring to FIG. 58, the first recess depth d11 may be deeper than the second recess depth d22, and the first recess width w11 may be narrower than the second recess width w22.

In some embodiments, the first recess 141b may be filled with a first device isolation layer and the second recess 2141b may be filled with a second element isolation layer. The first device isolation layer and the second device isolation layer may be made of the same material or different materials. Meanwhile, the first area I may be an NMOS area or a PMOS area, and the second area II may be an NMOS area or a PMOS area. In particular, in FIGS. 55, 56 and 57, the first area I may be an NMOS area and the second area II may be a PMOS area, but the present disclosure is not limited thereto.

Methods for manufacturing a semiconductor device according to some embodiments of the present inventive concept will be discussed with reference to FIGS. 59 to 60.

Figure 59:
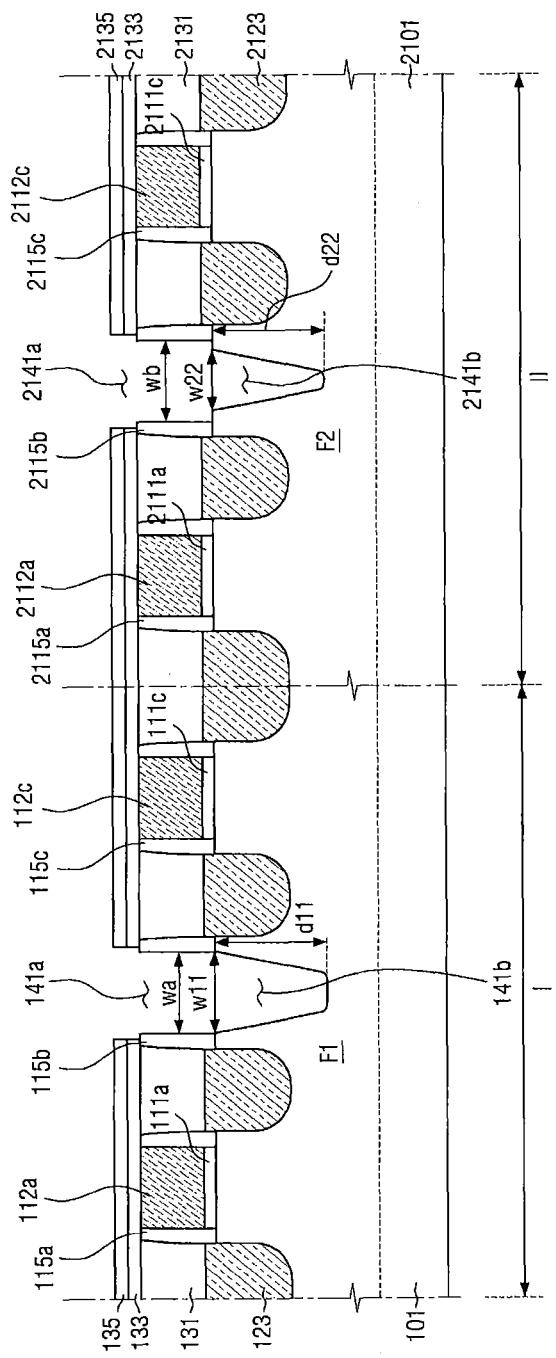
FIGS. 59 and 60 are cross-sections illustrating processing steps in the fabrication of semiconductor devices according to some embodiments of the present inventive concept.
Figure 60:
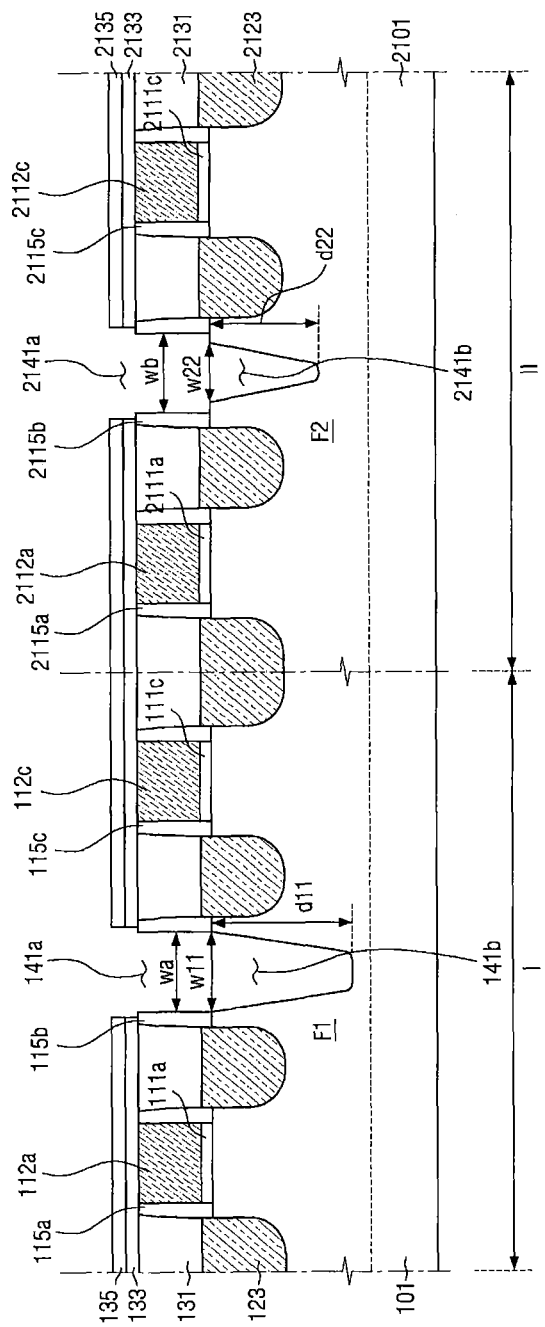

FIGS. 59 to 60 are cross-sections illustrating methods for manufacturing a semiconductor device according to some embodiments of the present inventive concept.

The method for manufacturing a semiconductor device according to some embodiments is substantially the same as the method for manufacturing a semiconductor device discussed with reference to FIGS. 53 to 58 except that, in the former, the second trench and the second recess formed in the second area II have widths different from each other. Therefore, like reference numerals are used to designate identical elements, and duplicated descriptions thereof will be omitted in the interest of brevity.

Referring to FIG. 59, the second recess width w22 of the second recess 2141b may be narrower than a width wb of the second trench 2141a in the second area II. In other words, the first recess 141b formed in the first area I may have the first recess width w11 same as a width wa of the first trench 141a in an upper region connected to the first trench 141a, but the second recess 2141b formed in the second area II may have the second recess width w22 narrower than the width wb of the second trench 2141a.

Meanwhile, the second recess width w22 may be narrower than the first recess width w11, but the present disclosure is not limited thereto.

Referring to FIG. 60, the first recess depth d11 may be deeper than the second recess depth d22 as compared with those shown in FIG. 59. However, it will be understood that embodiments of the present inventive concept are not limited to this configuration.

In some embodiments, since the second recess 2141b may be formed through a process separate from the etching process for forming the first trench 2141a, the second recess width w22 of the second recess 2141b may be narrower than the width wb of the second trench 2141a in the second area II as illustrated in FIGS. 59 and 60. Thus, recesses having various shapes may be formed.

While the present inventive concept has been particularly shown and discussed with reference to exemplary embodiments thereof, it will be understood by those of ordinary skill in the art that various changes in form and details may be made therein without departing from the spirit and scope of the present inventive concept as defined by the following claims. It is therefore desired that some embodiments be considered in all respects as illustrative and not restrictive, reference being made to the appended claims rather than the foregoing description to indicate the scope of the inventive concept.

What is claimed is:

1. A method for manufacturing a semiconductor device comprising:
   forming a first fin protruding on a substrate and extending in a first direction;
   forming first and second spaced apart sacrificial gate insulating layers on the first fin, the first and second sacrificial gate insulating layers intersecting the first fin;
   forming first and second sacrificial gate electrodes on the first and second sacrificial gate insulating layers, respectively;
   forming a first insulating layer on the first and second sacrificial gate electrodes;
   removing a portion of the first insulating layer to expose the second sacrificial gate electrode;
   removing the exposed second sacrificial gate electrode using a first etching process to expose the second sacrificial gate insulating layer;
   removing the exposed second sacrificial gate insulating layer using a second etching process, different from the first etching process, to provide a first trench exposing the first fin;
   forming a first recess in the exposed first fin using a third etching process, different from the first and second etching processes; and
   forming a first device isolation layer in the first recess.

2. The method of claim 1, wherein the second etching process is a wet etching process and the third etching process is a dry etching process.

3. The method of claim 1, wherein removing the second sacrificial gate electrode using a first etching process includes removing a portion of the second sacrificial gate electrode to provide a residual portion on the second sacrificial gate insulating layer.

4. The method of claim 3, further comprising performing a wet etching process for removing the residual portion prior to removing the exposed second sacrificial gate insulating layer using the second etching process.

5. The method of claim 3, wherein removing the exposed second sacrificial gate insulating layer using a second etching process includes removing the residual portion using the second etching process.

6. The method of claim 1, further comprising forming first and second spacers on both sidewalls of each of the first and second sacrificial gate electrodes prior to forming a first insulating layer, wherein the second spacer defines the first trench.

7. The method of claim 6, wherein removing the exposed second sacrificial gate insulating layer using a second etching process includes removing a portion of the second spacer through the second etching process such that a thickness of the second spacer is thinner than a thickness of the first spacer at the same height on the substrate.

8. The method of claim 7, wherein forming a first trench exposing the first fin includes forming a concave surface in an upper surface of the first fin.

9. The method of claim 6, further comprising:
   removing the first insulating layer to expose the first sacrificial gate electrode; and
   substituting the first sacrificial gate electrode and the first sacrificial gate insulating layer with a first gate structure.

10. The method of claim 9, further comprising forming a dummy gate structure on the first device isolation layer filling the first trench.

11. A method for manufacturing a semiconductor device comprising:
    forming first and second spaced apart fins protruding on first and second areas of a substrate, respectively, and extending in a first direction;
    forming first to third sacrificial gate insulating layers on the first fin, the first to third sacrificial gate insulating layers intersecting the first fin and being spaced apart from each other;
    forming fourth to sixth sacrificial gate insulating layers on the second fin, the fourth to sixth sacrificial gate insulating layers intersecting the second fin and being spaced apart from each other;
    forming first to third sacrificial gate electrodes respectively on the first to third sacrificial gate insulating layers;
    forming fourth to sixth sacrificial gate electrodes respectively on the fourth to sixth sacrificial gate insulating layers;
    forming a first insulating layer on the first to third sacrificial gate electrodes;
    forming a second insulating layer on the fourth to sixth sacrificial gate electrodes;
    removing a portion of the first insulating layer to expose the second sacrificial gate electrode;
    removing a portion of the second insulating layer to expose the fifth sacrificial gate electrode;
    removing the exposed second sacrificial gate electrode using a first etching process to expose the second sacrificial gate insulating layer;
    removing the exposed fifth sacrificial gate electrode using an etching process same as the first etching process to expose the fifth sacrificial gate insulating layer;
    removing the exposed second sacrificial gate insulating layer using a second etching process, different from the first etching process, so as to form a first trench exposing the first fin;
    removing the exposed fifth sacrificial gate insulating layer using an etching process same as the second etching process to provide a first trench which exposes the second fin;
    forming a first recess having a first recess depth and a first recess width in the exposed first fin using a third etching process, different from the first and second etching processes; and
    forming a second recess having a second recess depth and a second recess width in the exposed second fin using an etching process same as the third etching process,
    wherein the first recess depth is different from the second recess depth.

12. The method of claim 11, wherein the second etching process is a wet etching process and the third etching process is a dry etching process.

13. The method of claim 11:
    wherein the first recess width accords a contact line at which the first recess contacts the first trench;
    wherein the second recess width accords a contact line at which the second recess contacts the second trench; and
    wherein the first recess width and the second recess width being different from each other.

14. The method of claim 13:
    wherein the second recess width is narrower than the first recess width; and wherein the second recess width is narrower than the second trench width.

15. The method of claim 11, further comprising:
forming a first device isolation layer in the first recess; and
forming a second device isolation layer in the second recess.

16. A method for manufacturing a semiconductor device comprising:
forming a first, second and third fins protruding on a substrate and extending in a first direction;
forming a sacrificial gate insulating layer on the first second and third fins;
exposing the second sacrificial gate insulating layer using a first etching process;
removing a portion of the exposed sacrificial gate insulating layer to expose the first, second and third fins using a second etching process, different from the first etching process; and
etching the first, second and third fins and the remaining sacrificial gate insulating layer to define a trench therein using a third etching process, different from the first and second etching processes,
wherein the first, second and third fins at the bottom surface of the first recess have substantially no fence.

17. The method of claim 16, wherein the first, second and third fins at the bottom surface of the first recess have fences having a height difference of less than 10 nm.

18. The method of claim 16, wherein the second etching process is a wet etching process and the third etching process is a dry etching process.

19. The method of claim 16, wherein at least one of the first, second and third fins has a concave surface in an upper surface thereof.

20. The method of claim 16, further comprising forming a device isolation layer in the trench.

* * * * *